United States Patent
Miyashita et al.

(10) Patent No.: US 7,671,675 B2
(45) Date of Patent: Mar. 2, 2010

(54) OUTPUT LIMITING CIRCUIT, CLASS D POWER AMPLIFIER AND AUDIO EQUIPMENT

(75) Inventors: Takashige Miyashita, Kyoto (JP); Koji Takahata, Kyoto (JP); Yasunori Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 2 days.

(21) Appl. No.: 12/193,116

(22) Filed: Aug. 18, 2008

(65) Prior Publication Data
US 2009/0051427 A1   Feb. 26, 2009

(30) Foreign Application Priority Data

Aug. 20, 2007 (JP) ............................. 2007-213253
Nov. 26, 2007 (JP) ............................. 2007-303936
Jan. 11, 2008 (JP) ............................. 2008-003831

(51) Int. Cl.
*H03F 3/217* (2006.01)

(52) U.S. Cl. .................... 330/251; 330/278; 330/10
(58) Field of Classification Search ............ 330/251, 330/278, 10
See application file for complete search history.

(56) References Cited

U.S. PATENT DOCUMENTS

| | | | | | |
|---|---|---|---|---|---|
| 4,320,352 | A | * | 3/1982 | Rubin et al. | 330/277 |
| 4,437,146 | A | * | 3/1984 | Carpenter | 323/222 |
| 4,952,867 | A | * | 8/1990 | Anderson et al. | 323/273 |
| 4,995,084 | A | * | 2/1991 | Pritchard | 381/61 |
| 5,123,732 | A | * | 6/1992 | Gross et al. | 356/73.1 |
| 5,838,807 | A | * | 11/1998 | Andersson et al. | 381/321 |

FOREIGN PATENT DOCUMENTS

| | | |
|---|---|---|
| JP | 10-335961 | 12/1998 |
| JP | 11-239029 | 8/1999 |
| JP | 2000-151297 | 5/2000 |
| JP | 2000-152367 | 5/2000 |
| JP | 2003-258575 | 9/2003 |
| JP | 2006-005741 | 1/2006 |

* cited by examiner

*Primary Examiner*—Patricia Nguyen
(74) *Attorney, Agent, or Firm*—Fish & Richardson P.C.

(57) ABSTRACT

An output limiting circuit includes a reference current generating portion for converting a predetermined constant voltage into a reference current by using a first resistor, an upper side clip voltage generating portion for converting the reference current into an upper side clip voltage with respect to a bias voltage of the operational amplifier by using a second resistor, a lower side clip voltage generating portion for converting the reference current into a lower side clip voltage with respect to the bias voltage of the operational amplifier by using a third resistor, and a gain adjusting portion for adjusting a gain of the operational amplifier so that a voltage level of the output signal does not exceed an upper side limit level corresponding to the upper side clip voltage and that the voltage level of the output signal does not exceed a lower side limit level corresponding to the lower side clip voltage.

12 Claims, 78 Drawing Sheets

FIG.3

| NO. | SYMBOL | TERMINAL VOLTAGE | TERMINAL DEFINITION | INTERNAL EQUIVALENT CIRCUIT |
|---|---|---|---|---|
| 1<br>44 | IN1<br>IN2 | 3.5V | CH1 ANALOG SIGNAL INPUT TERMINAL<br>CH2 ANALOG SIGNAL INPUT TERMINAL<br><br>AUDIO INPUT VIA CAPACITOR | 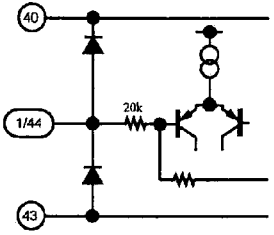 |
| 2 | PLMT1 | 3.5V | VOLTAGE/CURRENT CONVERSION TERMINAL FOR OUTPUT POWER LIMITING FUNCTION<br><br>USED WITH CONNECTED RESISTOR | 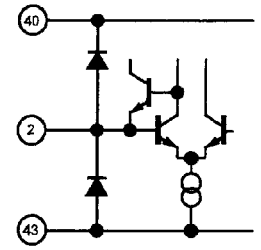 |
| 3 | PLMT2 | – | VOLTAGE/CURRENT CONVERSION TERMINAL FOR OUTPUT POWER LIMITING FUNCTION<br><br>USED WITH CONNECTED RESISTOR | 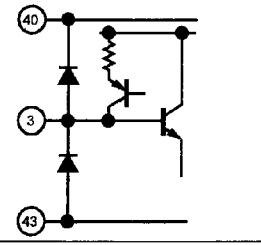 |
| 4 | PLMT3 | – | VOLTAGE/CURRENT CONVERSION TERMINAL FOR OUTPUT POWER LIMITING FUNCTION<br><br>USED WITH CONNECTED RESISTOR | 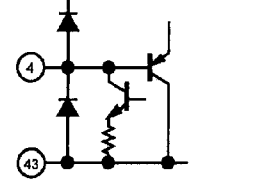 |
| 5 | PLMT4 | 3.5V | BIAS TERMINAL FOR OUTPUT POWER LIMITING FUNCTION<br><br>USED WITH CONNECTED RESISTOR AND CAPACITOR | 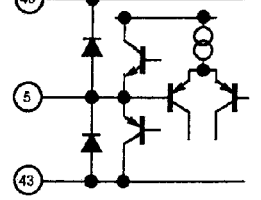 |

FIG.4

| NO. | SYMBOL | TERMINAL VOLTAGE | TERMINAL DEFINITION | INTERNAL EQUIVALENT CIRCUIT |
|---|---|---|---|---|
| 6 | BSP1P | – | CH1 POSITIVE SIDE BOOTSTRAP TERMINAL<br>USED WITH CONNECTED CAPACITOR | 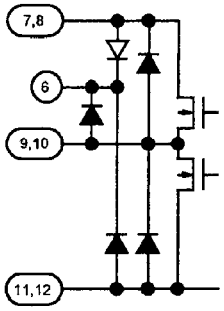 |
| 7, 8 | VCCP1P | Vcc | CH1 POSITIVE SIDE POWER SYSTEM POWER SUPPLY TERMINAL | |
| 9, 10 | OUT1P | Vcc~0V | CH1 POSITIVE SIDE PWM SIGNAL OUTPUT TERMINAL<br>USED WITH CONNECTED OUTPUT LPF | |
| 11, 12 | GNDP1 | 0V | CH1 POWER SYSTEM GND TERMINAL |  |
| 13, 14 | OUT1N | Vcc~0V | CH1 NEGATIVE SIDE PWM SIGNAL OUTPUT TERMINAL<br>USED WITH CONNECTED OUTPUT LPF | |
| 15, 16 | VCCP1N | Vcc | CH1 NEGATIVE SIDE POWER SYSTEM POWER SUPPLY TERMINAL | |
| 17 | BSP1N | – | CH1 NEGATIVE SIDE BOOTSTRAP TERMINAL<br>USED WITH CONNECTED CAPACITOR | |
| 18 | WARNING | H: 5V<br>L: 0V | WARNING OUTPUT TERMINAL<br>[SIGNAL LOGICAL LEVEL]<br>H: WARNING<br>L: NORMAL OPERATION<br>USED WITH CONNECTED RESISTOR | 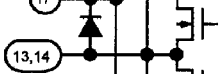 |
| 19 | ERROR | H: 5V<br>L: 0V | ERROR OUTPUT TERMINAL<br>[SIGNAL LOGICAL LEVEL]<br>H: ERROR<br>L: NORMAL OPERATION<br>USED WITH CONNECTED RESISTOR |  |
| 20 | MUTEX | – | AUDIO MUTE CONTROL TERMINAL<br>[SIGNAL LOGICAL LEVEL]<br>H: MUTE OFF<br>L: MUTE ON | 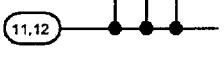 |

FIG.5

| NO. | SYMBOL | TERMINAL VOLTAGE | TERMINAL DEFINITION | INTERNAL EQUIVALENT CIRCUIT |
|---|---|---|---|---|
| 21, 22 | N.C. | - | NON-CONNECTION TERMINAL NOTHING IS CONNECTED INSIDE IC | |
| 23 | OSC | - | SAMPLING CLOCK SIGNAL INPUT AND OUTPUT TERMINAL<br><br>CONNECTED VIA CAPACITOR AMONG ICS | |
| 24 | MS | - | MASTER/SLAVE SWITCHING TERMINAL<br><br>FOR SWITCHING MASTER/SLAVE FUNCTION OF SAMPLING CLOCK SIGNAL<br>[SIGNAL LOGICAL LEVEL]<br>H: SLAVE OPERATION<br>L: MASTER OPERATION | |
| 25 | ROSC | 5.6V | INTERNAL PWM SAMPLING CLOCK FREQUENCY SETTING TERMINAL<br><br>USED IN OPEN STATE IN NORMAL OPERATION<br><br>USED WITH CONNECTED RESISTOR FOR ADJUSTING INTERNAL SAMPLING CLOCK FREQUENCY | |
| 26 | TM | 0~5V | AUDIO MUTE TIME CONSTANT SETTING TERMINAL<br><br>USED WITH CONNECTED CAPACITOR | |
| 27 | VHOLD | 0.68 × Vcc | DETECTION VOLTAGE SETTING TERMINAL FOR POWER SUPPLY INTERRUPTION DETECTION FUNCTION<br>USED WITH CONNECTED CAPACITOR<br>USED WITH CONNECTED RESISTOR FOR ADJUSTING DETECTION VOLTAGE | |

FIG.6

| NO. | SYMBOL | TERMINAL VOLTAGE | TERMINAL DEFINITION | INTERNAL EQUIVALENT CIRCUIT |
|---|---|---|---|---|
| 28 | BSP2N | – | CH2 NEGATIVE SIDE BOOTSTRAP TERMINAL<br><br>USED WITH CONNECTED CAPACITOR | 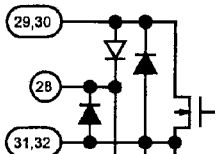 |
| 29, 30 | VCCP2N | Vcc | CH2 NEGATIVE SIDE POWER SYSTEM POWER SUPPLY TERMINAL | |
| 31, 32 | OUT2N | Vcc~0V | CH2 NEGATIVE SIDE PWM SIGNAL OUTPUT TERMINALS USED WITH CONNECTED OUTPUT LPF | |
| 33, 34 | GNDP2 | 0V | POWER SYSTEM GND TERMINAL | 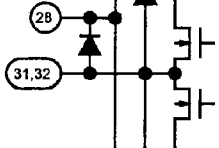 |
| 35, 36 | OUT2P | Vcc~0V | CH2 POSITIVE SIDE PWM SIGNAL OUTPUT TERMINAL USED WITH CONNECTED OUTPUT LPF | |
| 37, 38 | VCCP2P | Vcc | CH2 POSITIVE SIDE POWER SYSTEM POWER SUPPLY TERMINAL | |
| 39 | BSP2P | – | CH2 POSITIVE SIDE BOOTSTRAP TERMINAL<br><br>USED WITH CONNECTED CAPACITOR | |
| 40 | VCCA | Vcc | ANALOG SYSTEM POWER SUPPLY TERMINAL | |
| 41 | FILP | $\frac{Vcc+35}{12}$ | PWM SYSTEM BIAS TERMINAL<br><br>USED WITH CONNECTED CAPACITOR | 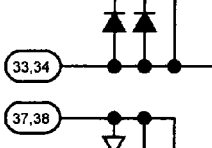 |
| 42 | FILA | 3.5V | ANALOG SIGNAL SYSTEM BIAS TERMINAL<br><br>USED WITH CONNECTED CAPACITOR | 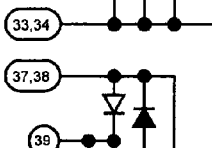 |
| 43 | GNDA | 0V | ANALOG SIGNAL SYSTEM GND TERMINAL | |

FIG.12

| LEAD PITCH e | LAND INTERVAL MIE | LAND LENGTH ≧ l2 | LAND WIDTH b2 | MIDDLE PAD LENGTH D3 | MIDDLE PAD WIDTH E3 | THERMAL VIA HOLE | |
|---|---|---|---|---|---|---|---|
| | | | | | | PITCH | DIAMETER |
| 0.80mm | 7.70mm | 1.20mm | 0.50mm | 18.50mm | 6.70mm | 1.20mm | φ0.30mm |

FIG.13

| ITEM | SYMBOL | TYPICAL VALUE | UNIT | CONDITION |
|---|---|---|---|---|
| ENTIRE | | | | |
| CIRCUIT CURRENT 1 (IN SAMPLING) | ICC1 | 25 | mA | NO SIGNAL |
| CIRCUIT CURRENT 2 (IN MUTE) | ICC2 | 10 | mA | MUTEX = "L" |
| CONTROLLER | | | | |
| "H" LEVEL INPUT VOLTAGE | VIH | 2.3~12 | V | MUTEX, MS |
| "L" LEVEL INPUT VOLTAGE | VIL | 0~0.8 | V | MUTEX, MS |
| AUDIO OUTPUT | | | | |
| VOLTAGE GAIN | GV | 28 | dB | PO = 1W |
| MAXIMUM OUTPUT POWER 1 | PO1 | 10 | W | THD+N = 10%, RL = 8Ω |
| MAXIMUM OUTPUT POWER 2 | PO2 | 17 | W | THD+N = 10%, RL = 4Ω |
| TOTAL HARMONIC DISTORTION RATIO | THD | 0.1 | % | PO = 1W, BW=20Hz~20kHz |
| CROSS TALK | CT | 85 | dB | PO = 1W, Rg = 0Ω, BW = IHF-A |
| OUTPUT NOISE VOLTAGE (IN SAMPLING) | VNO | 80 | μVrms | Rg = 0Ω, BW = IHF-A |
| REMAINING NOISE VOLTAGE (IN MUTE) | VNOM | 1 | μVrms | Rg = 0Ω, BW = IHF-A, MUTEX = "L" |
| INTERNAL SAMPLING CLOCK FREQUENCY | FOSC | 250 | kHz | MS = "L" (IN MASTER) |

FIG.20A fc=30[kHz]

| RL | L | C | Cg |
|---|---|---|---|
| 4Ω | 15μH | 1μF | 0.22μF |
| 6Ω | 22μH | 0.68μF | 0.15μF |
| 8Ω | 33μH | 0.47μF | 0.1μF |
| 16Ω | 68μH | 0.22μF | 0.047μF |

FIG.20B fc=40[kHz]

| RL | L | C | Cg |
|---|---|---|---|
| 4Ω | 10μH | 0.68μF | 0.15μF |
| 6Ω | 15μH | 0.47μF | 0.1μF |
| 8Ω | 22μH | 0.33μF | 0.068μF |
| 16Ω | 47μH | 0.15μF | 0.033μF |

FIG.28

| R25 | FREQUENCY |
|---|---|
| Open | ABOUT 250kHz |
| 150kΩ | ABOUT 303kHz |
| 100kΩ | ABOUT 330kHz |
| 68kΩ | ABOUT 367kHz |

FIG.32

| PROTECTION FUNCTION | PROTECTION CONDITION | PWM OUTPUT STATE | ERROR OUTPUT STATE | WARNING OUTPUT STATE |
|---|---|---|---|---|
| HIGH TEMPERATURE PROTECTION | PROTECTION START TEMPERATURE :175 °C (TYP.) OR HIGHER *1 | Hi-Z Low | L | H |
| | PROTECTION CANCEL TEMPERATURE :150 °C (TYP.) OR LOWER *1 | NORMAL OPERATION | L | L |
| OUTPUT SHORT-TO-POWER FAULT PROTECTION | PROTECTION CONDITION :LOW VOLTAGE OF PWM OUTPUT IS 0.11VCC V (TYP.) OR HIGHER | HI-Z LOW (LATCH *2) | H | L |
| OUTPUT GROUND FAULT PROTECTION | PROTECTION CONDITION :HIGH VOLTAGE OF PWM OUTPUT IS 0.89VCC V (TYP.) OR LOWER | HI-Z LOW (LATCH *2) | H | L |
| VOLTAGE DECREASE PROTECTION | PROTECTION START VOLTAGE :VCC = 7 V (TYP.) OR LOWER | Hi-Z Low | L | H |
| | PROTECTION CANCEL VOLTAGE :VCC = 8 V (TYP.) OR HIGHER | NORMAL OPERATION | L | L |
| POWER SUPPLY INTERRUPTION DETECTION | DETECTION VOLTAGE :DIFFERENCE BETWEEN VCC AND 27-PIN VOLTAGE IS 2 V (TYP.) OR LOWER | Hi-Z Low | L | L |
| | CANCEL VOLTAGE :DIFFERENCE BETWEEN VCC AND 27-PIN VOLTAGE IS 2 V (TYP.) OR LOWER | NORMAL OPERATION | L | L |
| SPEAKER DC VOLTAGE APPLICATION PROTECTION | PROTECTION CONDITION :PWM OUTPUT IS FIXED TO 100% DUTY RATIO DURING APPROXIMATELY 25 MSEC OR LONGER | HI-Z LOW (LATCH *2) | H | L |

FIG.34

| VCCA POWER SOURCE VOLTAGE | VHOLD TERMINAL VOLTAGE | POWER SUPPLY INTERRUPTION DETECTION VOLTAGE (VHOLD VOLTAGE+2 VOLTS) |
|---|---|---|
| 10V | 6.8V | <8.8V |
| 11V | 7.5V | <9.5V |
| 12V | 8.2V | <10.2V |
| 13V | 8.9V | <10.9V |
| 14V | 9.6V | <11.6V |
| 15V | 10.3V | <12.3V |
| 16V | 10.9V | <12.9V |
| 16.5V | 11.3V | <13.3V |

FIG.35

| WARNING | PIN 18 | REMARK |
|---|---|---|
| YES | "H" (=5V) | WHEN POWER SUPPLY VOLTAGE BECOMES 6 VOLTS OR LOWER, H LEVEL VOLTAGE DECREASES IN PROPORTION TO VCC VOLTAGE IF POWER SUPPLY VOLTAGE IS 4 VOLTS OR LOWER, WARNING FLAG CANNOT BE OUTPUT NORMALLY |
| NO | "L" | – |

FIG.36

| ERROR | PIN 19 | REMARK |
|---|---|---|
| YES | "H" (=5V) | WHEN POWER SUPPLY VOLTAGE BECOMES 6 VOLTS OR LOWER, H LEVEL VOLTAGE DECREASES IN PROPORTION TO VCC VOLTAGE<br>IF POWER SUPPLY VOLTAGE IS 4 VOLTS OR LOWER, ERROR FLAG CANNOT BE OUTPUT NORMALLY |
| NO | "L" | — |

FIG.39

| R3/R2 | OUTPUT POWER LIMITATION VALUE Po |
|---|---|
| 0.161 | 2W (RL=8Ω) |
| 0.255 | 5W (RL=8Ω) |
| 0.360 | 10W (RL=8Ω) |
| 0.327 | 15W (RL=4Ω) |
| 1 | NO LIMITATION OF OUTPUT POWER |

OUTPUT LIMITING CIRCUIT, CLASS D POWER AMPLIFIER AND AUDIO EQUIPMENT

CROSS-REFERENCE TO RELATED APPLICATIONS

This application is based on Japanese Patent Applications No. 2007-213253 filed on Aug. 20, 2007, No. 2007-303936 filed on Nov. 26, 2007 and No. 2008-003831 filed on Jan. 11, 2008.

BACKGROUND OF THE INVENTION

1. Field of the Invention

The present invention relates to a power amplifying circuit (e.g., a class D power amplifier).

2. Description of Related Art (First Related Art)

A short circuit in the output of a push-pull circuit or the like including two transistors connected in series is usually detected by using a sensing resistor. For instance, JP-A-11-239029 (hereinafter referred to as Patent Document 1) discloses and proposes a technique as shown in FIG. 1 of the document, in which a sensing resistor connected to a source of an N-channel field effect transistor is used for sensing current flowing in a complementary circuit, and a switch circuit is driven to cut off a power supply if the sensed current is not smaller than a predetermined threshold value.

However, the above-mentioned conventional short circuit detection circuit needs an expensive sensing resistor, so it causes a cost increase. In addition, since current flows in the sensing resistor of the above-mentioned conventional short circuit detection circuit, undesired power loss is caused.

(Second Related Art)

Conventionally, a class D power amplifier to which an analog signal (e.g., analog audio signal) is input has a limiter circuit for limiting its output power.

Conventional techniques of the above-mentioned limiter circuit are disclosed in JP-A-2006-5741 and JP-A-10-335961 (hereinafter referred to as Patent Documents 2 and 3, respectively).

The Patent Document 2 discloses and proposes a limiter circuit for clipping an input signal applied to an input terminal at a constant voltage by a control signal that is applied externally. The limiter circuit includes a control element connected between a power supply terminal and the input terminal and a control circuit that turns off the control element normally and turns on the control element when the input signal exceeds the constant voltage.

In addition, the Patent Document 3 discloses and proposes a bass amplifying system for driving a sub woofer, which includes a preamplifier for amplifying an input signal, a waveform shaping circuit for shaping a waveform of an output signal of the preamplifier, a power amplifier for amplifying an output of the waveform shaping circuit, and a power supply voltage supplying circuit for supplying the preamplifier with a power supply voltage of an absolute value smaller than a power supply voltage that is supplied to the power amplifier.

According to the above-mentioned conventional techniques, an increase in distortion caused by output saturation or damage to a speaker can surely be prevented even if an excessive input signal is applied.

However, the clipped waveform in the conventional technique described in the Patent Document 2 is not a soft-clipped waveform, so the output signal contains a lot of harmonic components as a result. Therefore, the speaker may produce an unusual grating sound.

In addition, since a limit level of the output power in the conventional technique described in the Patent Document 2 responds to variable control of a control voltage relatively too sensitively, it is not always easy to set a desired output power accurately.

In addition, since upper and lower limit levels are set by using a control signal in the conventional technique described in the Patent Document 2, it is necessary to adjust circuit constants in order to realize a symmetrical clipping with respect to a bias voltage of an operational amplifier.

On the other hand, the conventional technique described in the Patent Document 3, which realizes the soft clip by controlling the power supply voltage of the preamplifier, is different from the present invention concerning the essential structure.

(Third Related Art)

Conventionally, various techniques are proposed for preventing damage to a speaker or burning thereof by detecting a DC output and protecting the same in a power amplifying circuit for amplifying an audio signal. Some examples thereof are disclosed in JP-A-2003-258575, JP-A-2000-152367 and JP-A-2000-151297 (hereinafter referred to as Patent Documents 4, 5 and 6, respectively), as well as in "YAMAHA Digital Amplifier IC", [online], Apr. 10, 2007, YAMAHA CORPORATION, [Searched on Nov. 1, 2007], the Internet <URL: http://www.yamaha.co.jp/news/2007/07041001.html> (hereinafter referred to as Non-patent Document 1).

The Patent Document 4 proposes a BTL amplifying system that detects and decides whether or not an offset is generated so as to prevent a load such as a speaker from damage. However, there is a problem that the BTL amplifying system proposed in the Patent Document 4 cannot be applied to a class D amplifier since it detects and protects the DC output by detecting and deciding whether or not an offset is generated.

The Patent Document 5 proposes a BTL power amplifier that detects a clip of an output voltage waveform so as to protect a speaker. However, there is a problem that the BTL power amplifier proposed in the Patent Document 5 cannot be applied to a class D amplifier since it detects and protects the DC output by detecting a clip of an output voltage waveform.

The Patent Document 6 proposes a fault detection circuit that detects an output current difference between output transistors of two BTL amplifying circuits for driving different speakers respectively so as to protect the speakers. However, there is a problem that the fault detection circuit proposed in the Patent Document 6 needs two BTL amplifying circuits for driving individual speakers, so it is difficult to protect the speaker by a single BTL amplifying circuit driving one speaker.

The Non-patent Document 1 discloses a block diagram as shown in FIG. 78, and a class D amplifier having a DC output detecting function is disclosed. However, a concrete circuit structure for detecting a DC output is not disclosed or suggested at all, so it is not clear how the DC output detecting function is realized with which circuit structure.

Furthermore, although a DC output of a class D amplifier is usually generated by a ground fault or a short-to-power fault of the input terminal or the like of the class D amplifier in a BTL output type, it may be generated also by an abnormal state that occurred in the driver. Therefore, it is desirable that a DC output generated by an abnormal state that occurred in the driver can be detected. In addition, it is also desirable that detection time for the DC output detecting function can be changed in accordance with the performance of the speaker that is connected. However, the conventional techniques described above cannot satisfy these requirements.

SUMMARY OF THE INVENTION

An output limiting circuit according to an embodiment of the present invention, for limiting amplitude of output of an operational amplifier for generating an output signal by amplifying an input signal, includes a reference current generating portion for converting a predetermined constant voltage into reference current by using a first resistor, an upper side clip voltage generating portion for converting the reference current into an upper side clip voltage with respect to a bias voltage of the operational amplifier by using a second resistor, a lower side clip voltage generating portion for converting the reference current into a lower side clip voltage with respect to the bias voltage of the operational amplifier by using a third resistor, and a gain adjusting portion for adjusting a gain of the operational amplifier so that a voltage level of the output signal does not exceed an upper side limit level corresponding to the upper side clip voltage and that the voltage level of the output signal does not exceed a lower side limit level corresponding to the lower side clip voltage.

Note that other features, elements, steps, advantages and characteristics will be more apparent from the following detailed description of preferred embodiments and the attached drawings.

BRIEF DESCRIPTION OF THE DRAWINGS

FIG. 3 is a correspondence table (I) showing pin numbers of external terminals, symbols (terminal names), terminal voltages, terminal definitions and internal equivalent circuits.

FIG. 4 is a correspondence table (II) showing pin numbers of external terminals, symbols (terminal names), terminal voltages, terminal definitions and internal equivalent circuits.

FIG. 5 is a correspondence table (III) showing pin numbers of external terminals, symbols (terminal names), terminal voltages, terminal definitions and internal equivalent circuits.

FIG. 6 is a correspondence table (IV) showing pin numbers of external terminals, symbols (terminal names), terminal voltages, terminal definitions and internal equivalent circuits.

FIG. 12 is a table showing an example of design values of the footprint.

FIG. 13 is a table showing electric characteristics of the semiconductor device 10.

FIG. 20 shows tables of LC filter constants for a typical load impedance.

FIG. 28 is a table showing a relationship between a resistance value of the resistor R25 and a sampling clock frequency fs.

FIG. 32 is an operating state list table of a protection function.

FIG. 34 is a list table showing a relationship among a VCCA power supply voltage, a VHOLD terminal voltage and a power supply interruption detection voltage.

FIG. 35 is a table showing states of a warning output terminal.

FIG. 36 is a table showing states of an error output terminal.

FIG. 39 is a table showing an example of set output power limitation values.

DETAILED DESCRIPTION OF THE PREFERRED EMBODIMENTS

First Embodiment

Figure 1:
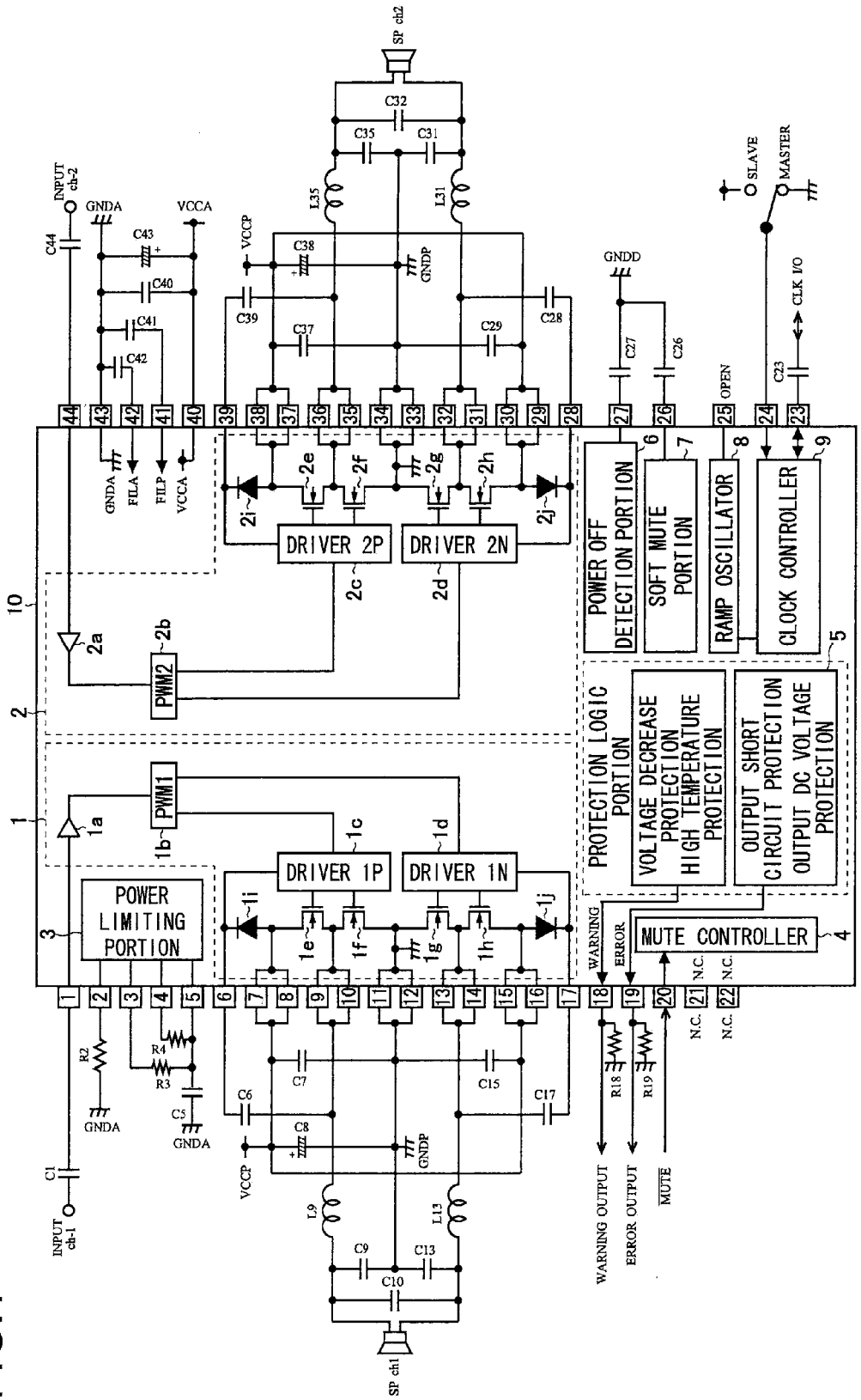
FIG. 1 is a block diagram showing an embodiment of a semiconductor device according to the present invention.

FIG. 1 is a block diagram showing an embodiment of a semiconductor device according to the present invention.

First, the general outlines of a semiconductor device 10 of this embodiment will be described.

The semiconductor device 10 shown in FIG. 1 is a stereo class D power amplifier IC of 17 watts+17 watts output that is developed for an application such as a thin television set that is space saving and generates little heat. As a process technique for the IC, a bipolar, CMOS and DMOS (BCD) process technique is adopted so that an internal loss due to on resistances and wiring resistances of the output power stage are eliminated as much as possible for realizing a high efficiency of 90% (under the condition of an output of 10 watts+10 watts with a load of 8 ohms). Furthermore, a power package of a small underside heatsink type is adopted for realizing low power consumption and low heat generation, so that an external heat sink is not needed under the condition of total output power of 34 watts or lower. The semiconductor device 10 can support both the needs of very small and thin dimensions of an audio system, and powerful and high quality sound reproduction.

Next, merits of the semiconductor device 10 will be described.

A first merit is that high efficiency 90% (at the output of 10 watts+10 watts with a load of 8 ohms) and low heat generation are realized. A second merit is that the device can output 17 watts+17 watts power (at 12 volts with a load of 4 ohms) without an external heat sink. A third merit is that the device can drive a rated load of minimum 4 ohms. A fourth merit is pop noise that is generated when the power is turned on or off or the power is interrupted can be reduced. A fifth merit is that high quality of audio mute is realized by a soft switching technique. A sixth merit is that the device has an output power limitation function for limiting an excessive output power supplied to a speaker. A seventh merit is that the device includes a high temperature protection circuit, a short-to-power fault and ground fault protection circuit, a voltage decrease protection circuit and a speaker DC voltage application protection circuit for a high reliability design. An eighth merit is that the device has a master/slave function for synchronizing a plurality of semiconductor devices 10 that are used simultaneously, so that generation of beat noise can be prevented. A ninth merit is that the device has an adjustment function (250 kHz to 400 kHz) of a sampling clock frequency for internal pulse width modulation (PWM), so that unwanted emission control for an AM radio can be realized easily. A tenth merit is that a monaural amplifier with high output power of 34 watts can be configured by connecting stereo outputs in parallel. An eleventh first merit is that the power package of the small underside heatsink type is adopted.

The semiconductor device 10 of this embodiment having the merits described above includes a first class D power amplifier portion 1, a second class D power amplifier portion 2, a power limiting portion 3, a mute controller 4, a protection logic portion 5, a power off detection portion 6, a soft mute portion 7, a ramp oscillator 8 and a clock controller 9, which are integrated as shown in FIG. 1.

The first class D power amplifier portion 1 includes an input amplifying circuit 1a, a PWM modulating circuit 1b, a normal phase driver circuit 1c, an opposite phase driver circuit 1d, a normal phase push-pull output circuit (N-channel MOS field effect transistors 1e and 1f), an opposite phase push-pull output circuit (N-channel MOS field effect transistors 1g and 1h), a normal phase bootstrap diode 1i and an opposite phase bootstrap diode 1j, which constitute the class D power amplifier in a BTL configuration together with an external LC filter circuit.

The second class D power amplifier portion 2 includes an input amplifying circuit 2a, a PWM modulating circuit 2b, a normal phase driver circuit 2c, an opposite phase driver circuit 2d, a normal phase push-pull output circuit (N-channel MOS field effect transistor 2e, 2f), an opposite phase push-pull output circuit (N-channel MOS field effect transistor 2g, 2h), a normal phase bootstrap diode 2i and an opposite phase bootstrap diode 2j, which constitute the class D power amplifier in a BTL configuration together with an external LC filter circuit.

In this way, a voltage level of an input audio signal can be amplified in a balanced manner by using the class D power amplifiers 1 and 2 in the BTL configuration as a driving unit of the speaker, so that power supply efficiency of audio equipment can be improved.

Note that the PWM modulating circuits 1b and 2b constituting the class D power amplifiers 1 and 2 are units for converting the analog signals supplied via the input amplifying circuits 1a and 2a into two-phase (normal phase and opposite phase) digital signals and include an integrator, a comparator and a dead time generator. Structures thereof are realized by applying well-known techniques, so detailed description thereof will be omitted here.

In addition, although the structure adopting the PWM modulating circuits 1b and 2b is exemplified for the description below of the semiconductor device 10 according to this embodiment, the structure of the present invention is not limited to this structure. It is possible to adopt other type of A/D converting circuit such as a pulse density modulation (PDM) circuit using a $\Delta\Sigma$ modulator.

The power limiting portion 3 is a unit for limiting an output power in accordance with a capacity of the speaker connected to the semiconductor device 10. Note that the output power limitation function using the power limiting portion 3 will be described later in detail.

The mute controller 4 is a unit for accepting a mute control signal from the outside of the device (e.g., a microcomputer) so as to perform mute control of speaker output.

The protection logic portion 5 is a unit for stopping the speaker output and issuing a warning signal or an error signal externally when various protection functions provided to the semiconductor device 10 (a voltage decrease protection function, a high temperature protection function, an output short circuit protection function and an output DC voltage protection function) have worked. Note that the warning signal is issued when a protection function that has relatively low risk and permits automatic reset when the abnormal state is canceled without waiting an external instruction (the voltage decrease protection function or the high temperature protection function in the illustrated example) has worked. In contrast, the error signal is issued when a protection function that has relatively high risk and does not permit the automatic reset even if the abnormal state is canceled unless an external instruction is issued (the output short circuit protection function or the output DC voltage protection function in the illustrated example) has worked.

The power off detection portion 6 is a unit for detecting a power supply interruption so as to stop the speaker output. Note that the power supply interruption detection function using the power off detection portion 6 will be described later in detail.

The soft mute portion 7 is a unit for setting a time constant (soft mute switching time) of the audio mute. Note that the function of the soft mute portion 7 will be described later in detail.

The ramp oscillator 8 is a unit for generating a ramp wave signal (or a triangular wave signal) for determining a frequency of a PWM signal.

The clock controller 9 is a unit for performing combination control of clock signals used for a plurality of semiconductor devices 10. Note that the function of the clock controller 9 will be described later in detail.

In addition, the semiconductor device 10 of this embodiment has 44 external terminals (pin 1 to pin 44) for external electric connection.

Figure 2:
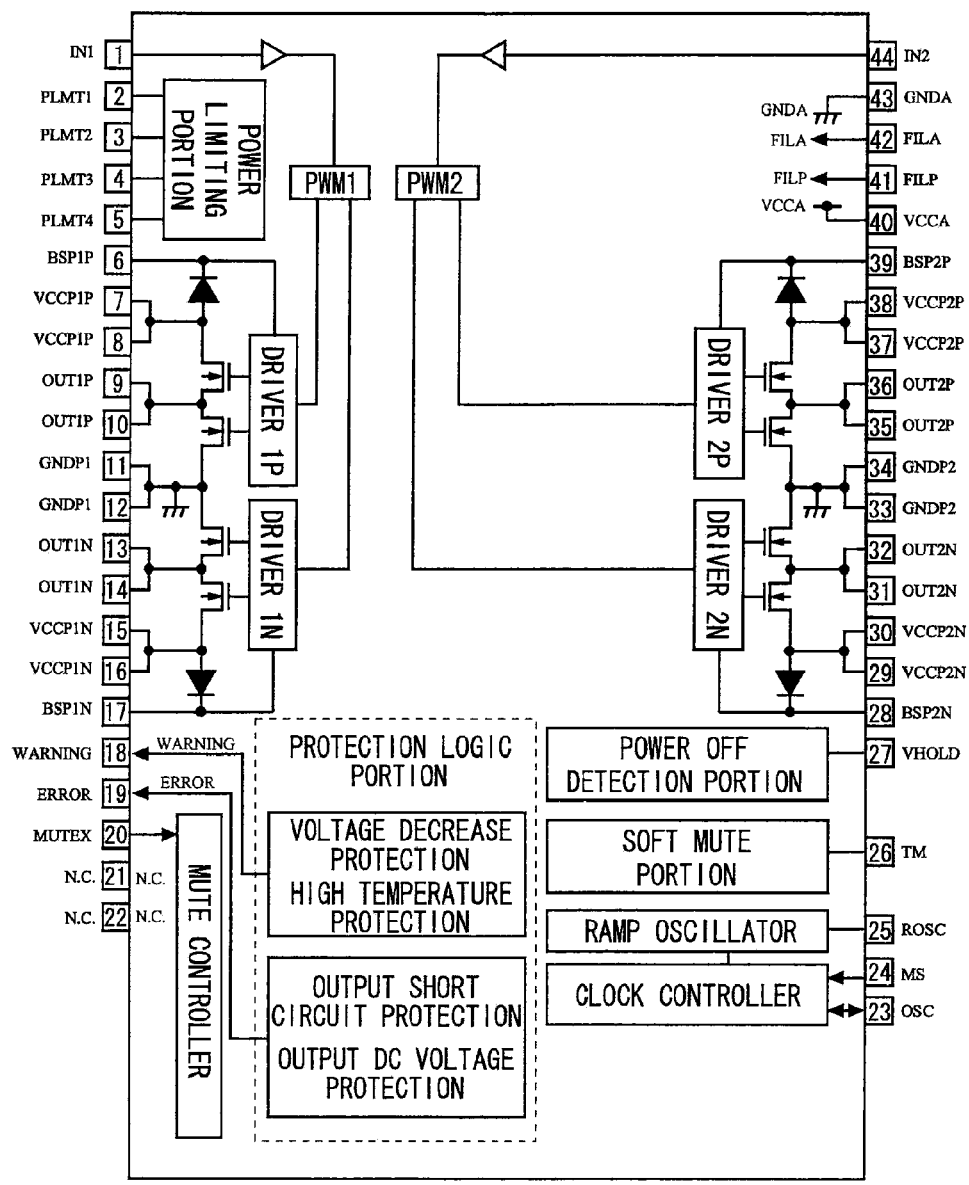
FIG. 2 is a terminal layout diagram of a semiconductor device 10.

FIG. 2 is a terminal layout diagram of the semiconductor device 10. In addition, FIGS. 3 to 6 are correspondence tables showing pin numbers of external terminals, symbols (terminal names), terminal voltages (typical values), terminal definitions and internal equivalent circuits.

An IN1 terminal (pin 1) and an IN2 terminal (pin 44) are analog signal input terminals of a first and a second channels, respectively. Note that the IN1 terminal and the IN2 terminal are respectively supplied with audio signals of the first and the second channels via external capacitors (see C1 and C44 shown in FIG. 1).

A PLMT1 terminal (pin 2), a PLMT2 terminal (pin 3), a PLMT3 terminal (pin 4) and a PLMT4 terminal (pin 5) are external terminals that are used for realizing the output power limitation function of the power limiting portion 3. Note that the PLMT1 terminal is a voltage/current conversion terminal to which an external resistor (see R2 in FIG. 1) is connected. The PLMT2 terminal and the PLMT3 terminal are current/voltage conversion terminal to which external resistors (see R3 and R4 in FIG. 1) are connected, respectively. The PLMT4 terminal is a bias terminal to which external resistors and a capacitor (see R3, R4 and C5 in FIG. 1) are connected.

A BSP1P terminal (pin 6) is a positive side bootstrap terminal of the first channel, to which an external capacitor (see C6 in FIG. 1) is connected.

VCCP1P terminals (pins 7 and 8) are positive side power system power supply terminals of the first channel. Note that as for the VCCP1P terminals the pin 7 and the pin 8 are used as one VCCP1P terminal for reducing the resistance value and improving the current capacity.

OUT1P terminals (pins 9 and 10) are positive side PWM signal output terminals of the first channel, to which an external output of a low pass filter (LPF) is connected (see L9, C9 and C10 in FIG. 1). Note that as for the OUT1P terminals the pin 9 and the pin 10 are used as one OUT1P terminal for reducing the resistance value and improving the current capacity.

GNDP1 terminals (pins 11 and 12) are ground terminals for the power system of the first channel. Note that as for the GNDP1 terminals the pin 11 and the pin 12 are used as one GNDP1 terminal for reducing the resistance value and improving the current capacity. In addition, a potential of the GNDP1 terminal should be designed to be the lowest voltage in the system even if the semiconductor device 10 is in any operating state.

OUT1N terminals (pins 13 and 14) are negative PWM signal output terminals of the first channel, to which an external output of the LPF is connected (see L13, C13 and C10 in FIG. 1). Note that as for the OUT1N terminals the pin 13 and the pin 14 are used as one OUT1N terminal for reducing the resistance value and improving the current capacity.

VCCP1N terminals (pins 15 and 16) are negative side power system power supply terminal of the first channel. Note that as for the VCCP1N terminals the pin 15 and the pin 16 are used as one VCCP1N terminal for reducing the resistance value and improving the current capacity.

A BSP1N terminal (pin 17) is a negative side bootstrap terminal of the first channel, to which an external capacitor is connected (see C17 in FIG. 1).

A WARNING terminal (pin 18) is a warning output terminal (a terminal for notifying operational warning), to which an external resistor (see R18 in FIG. 1) is connected. Note that a signal logical level of the WARNING terminal is high for the warning output and is low in the normal operation.

An ERROR terminal (pin 19) is an error output terminal (a terminal for notifying an operating error), to which an external resistor (see R19 in FIG. 1) is connected. Note that a signal logical level of the ERROR terminal is high for the error output and is low in the normal operation.

A MUTEX terminal (pin 20) is an audio mute control terminal. Note that a signal logical level thereof is high for mute off and is high for mute on.

N.C. terminals (pins 21 and 22) are non-connection terminals to which nothing is connected inside the semiconductor device 10, which should be in an open state or connected to the GND.

An OSC terminal (pin 23) is an input and output terminal for a sampling clock signal. If a plurality of semiconductor devices 10 are used, the OSC terminals of the semiconductor devices 10 are connected to each other via a capacitor (see C23 in FIG. 1).

A MS terminal (pin 24) is a master/slave switching terminal. If a plurality of semiconductor devices 10 are used, this terminal is used for switching between a source of the sampling clock signal (master) and a supply destination (slave). Note that a signal logical level of the MS terminal is high for the slave operation and is low for the master operation.

A ROSC terminal (pin 25) is an internal PWM sampling clock frequency setting terminal, which is in an open state in the normal operation (see FIG. 1). In contrast, an external resistor is connected to the terminal in order to adjust the internal PWM sampling clock frequency.

A TM terminal (pin 26) is a time constant setting terminal for the audio mute, to which an external capacitor is connected (see C26 in FIG. 1).

A VHOLD terminal (pin 27) is a detection voltage setting terminal for the power supply interruption detection function, to which only an external capacitor (see C27 in FIG. 1) is connected in the normal operation. In contrast, a resistor is connected in parallel with the capacitor in order to adjust the detection voltage.

A BSP2N terminal (pin 28) is a negative side bootstrap terminal of the second channel, to which an external capacitor is connected (see C28 in FIG. 1).

VCCP2N terminals (pins 29 and 30) are negative side power system power supply terminal of the second channel. Note that as for the VCCP2N terminals, the pin 29 and the pin 30 are used as one VCCP2N terminal for reducing the resistance value and improving the current capacity.

OUT2N terminals (pins 31 and 32) are negative PWM signal output terminals of the second channel, to which an external output of the LPF is connected (see L31, C31 and C32 in FIG. 1). Note that as for the OUT2N terminals, the pin 31 and the pin 32 are used as one OUT2N terminal for reducing the resistance value and improving the current capacity.

GNDP2 terminals (pins 33 and 34) are ground terminals for the power system of the second channel. Note that as for the GNDP2 terminal the pin 33 and the pin 34 are used as one GNDP2 terminal for reducing the resistance value and improving the current capacity. In addition, a potential of the GNDP2 terminal should be designed to be the lowest voltage in the system even if the semiconductor device 10 is in any operating state.

OUT2P terminals (pins 35 and 36) are positive side PWM signal output terminals of the second channel, to which an external output of the LPF is connected (see L35, C35 and C32 in FIG. 1). Note that as for the OUT2P terminals the pin 35 and the pin 36 are used as one OUT2P terminal for reducing the resistance value and improving the current capacity.

VCCP2P terminals (pins 37 and 38) are positive side power system power supply terminals of the second channel. Note that as for the VCCP2P terminals the pin 37 and the pin 38 are used as one VCCP2P terminal for reducing the resistance value and improving the current capacity.

A BSP2P terminal (pin 39) is a positive side bootstrap terminal of the second channel, to which an external capacitor (see C39 in FIG. 1) is connected.

A VCCA terminal (pin 40) is a power supply terminal for an analog signal system.

A FILP terminal (pin 41) is a bias terminal for the PWM signal system, to which an external capacitor (see C41 in FIG. 1) is connected.

A FILA terminal (pin 42) is a bias terminal for the analog signal system, to which an external capacitor (see C42 in FIG. 1) is connected.

A GNDA terminal (pin 43) is a ground terminal for the analog signal system. Note that a potential of the GNDA terminal should be designed to be the lowest voltage in the system even if the semiconductor device 10 is in any operating state.

Next, an application circuit that uses the semiconductor device 10 will be described in detail with reference to some examples.

Figure 7:
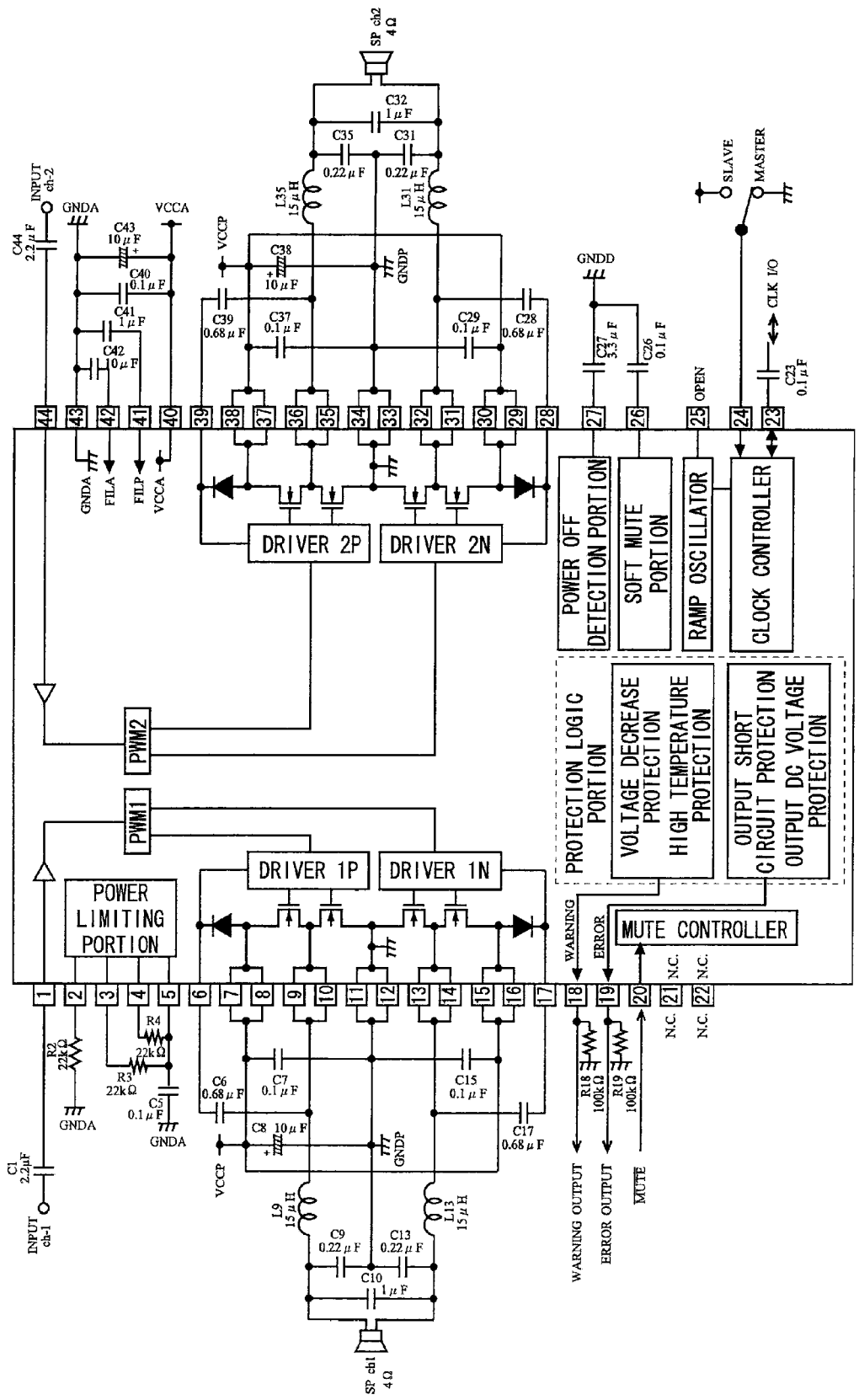
FIG. 7 is an application circuit diagram for stereo operation of speakers with a load resistance of 4 ohms.

FIG. 7 is an application circuit diagram for stereo operation of speakers with a load resistance of 4 ohms. Furthermore, it is supposed that the power supply voltage of 10 to 16.5 volts is supplied to the circuit shown in FIG. 7.

Figure 8:
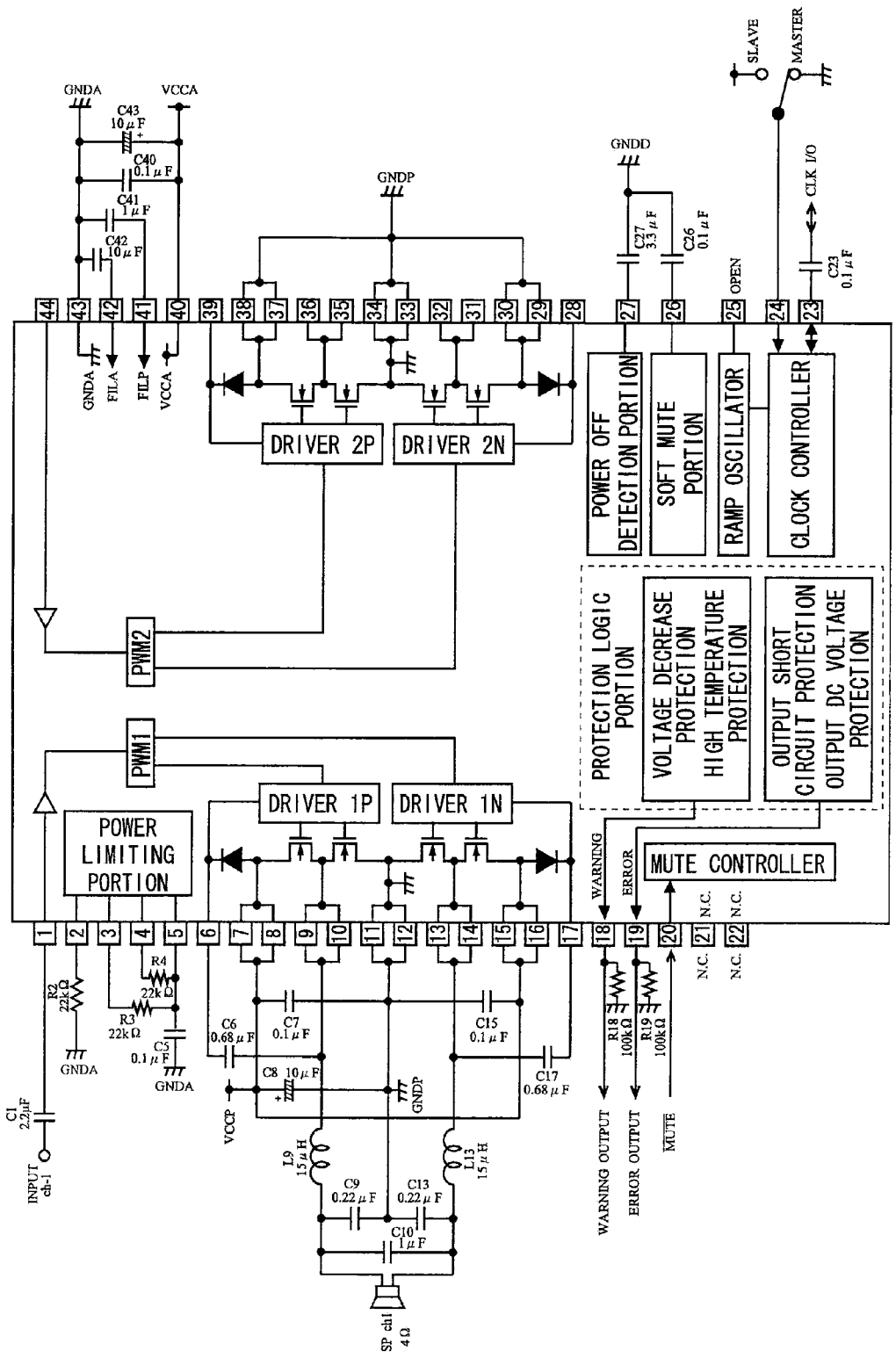
FIG. 8 is an application circuit diagram for monaural operation of a speaker with a load resistance of 4 ohms.

FIG. 8 is an application circuit diagram for monaural operation of a speaker with a load resistance of 4 ohms. Furthermore, it is supposed that the power supply voltage of 10 to 16.5 volts is supplied to the circuit shown in FIG. 8. As shown in FIG. 8, some external components can be eliminated in the monaural operation compared with the stereo operation (compare pins 28 to 39 and 44 between FIGS. 7 and 8).

Figure 9:
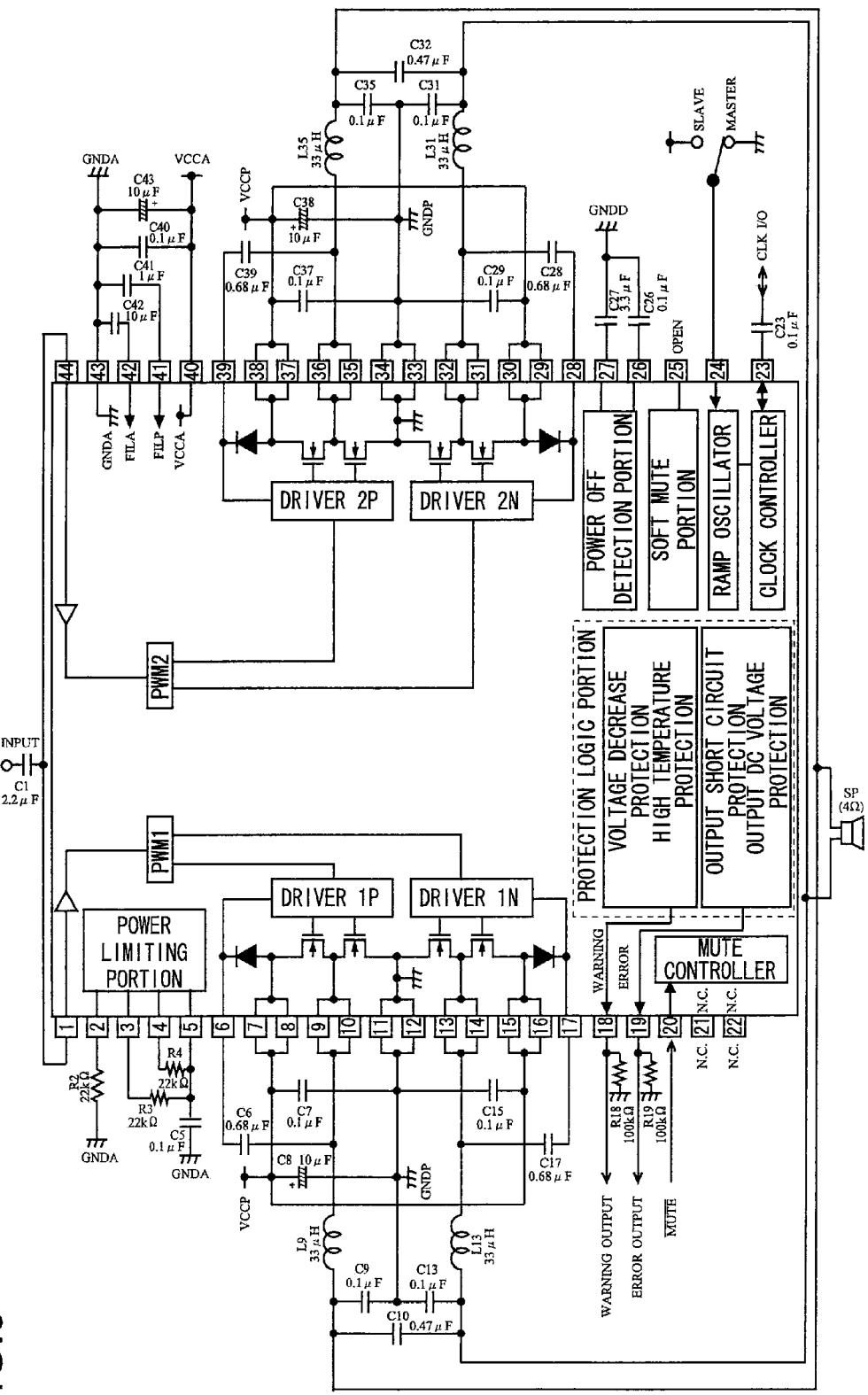
FIG. 9 is an application circuit diagram for monaural operation of the speaker with a load resistance of 4 ohms by parallel drive.

FIG. 9 is an application circuit diagram for monaural operation of the speaker with a load resistance of 4 ohms by parallel drive. Furthermore, it is supposed that the power supply voltage of 10 to 16.5 volts is supplied to the circuit shown in FIG. 9. As shown in FIG. 9, the semiconductor device 10 can be operated as a high output monaural amplifier by using the outputs of the first and the second channels in parallel. In case of this operation, the input terminals of the first and the second channels are supplied with the same signal, and the outputs after the output LC filters are connected to each other so that the speaker is connected between the positive terminals and the negative terminals. In the circuit shown in FIG. 9, the output power is 20 watts (with total harmonic distortion (THD) of 10%) and the efficiency is 92% when the power supply voltage is 12 volts and the load resistance is 4 ohms. In addition, the output power can be increased up to 34 watts (with the THD of 10%) when the power supply voltage is 12 volts and the load resistance is 2 ohms.

As to a power supply line of the semiconductor device 10 having the structure described above, counter electromotive forces of output coils (see L9, L13, L31 and L35 shown in FIG. 1) cause back-flows of regenerated currents. Therefore, it is desirable to take countermeasures such as an insertion of capacitors between the power supply line and the GND (see C7, C8, C15, C29, C37, C38, C40 and C43 in FIG. 1) as paths of the regenerated currents. If electrolytic capacitors are used in this case, it is desirable to select their capacitance values supposing that the capacitance value may decrease under low temperature and confirming that characteristics thereof have no problem under such circumstances. If the connected power supply does not have sufficient current absorbing capacity, the regenerated current may raise the voltage of the power supply line so as to exceed absolute maximum ratings of the semiconductor device 10 and other peripheral circuits. Therefore, it is desirable to take physical measures of security such as an insertion of a voltage clamping diode between the power supply line and the GND.

Next, a package of the semiconductor device 10 will be described in detail with reference to FIGS. 10 to 12.

Figure 10:
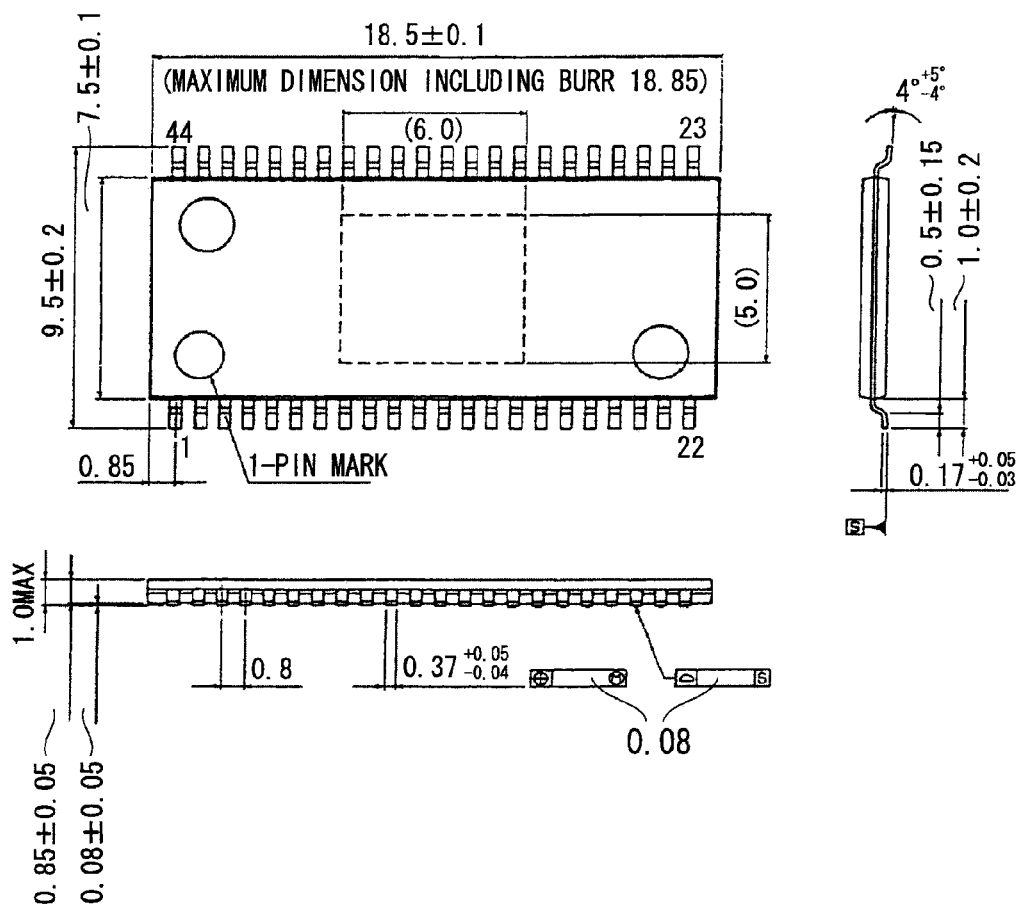
FIG. 10 is a dimension diagram of the semiconductor device 10.

FIG. 10 is a dimension diagram of the semiconductor device 10. Note that the unit of dimensions in FIG. 10 is millimeter. In addition, FIG. 11 is a diagram showing a reference example of a footprint of the semiconductor device 10, and FIG. 12 is a table showing an example of design values of the footprint.

Figure 11:
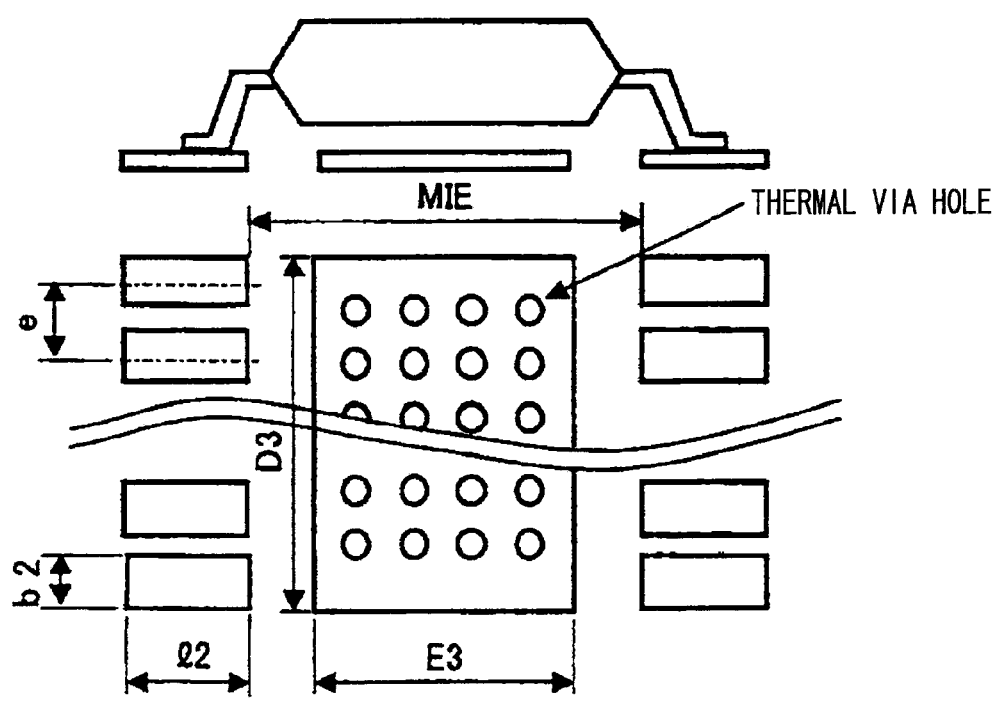
FIG. 11 is a diagram showing a reference example of a footprint of the semiconductor device 10.

As shown in FIGS. 10 to 12, the semiconductor device 10 uses a small underside heatsink type power package, so a frame is exposed on the underside of the package. Therefore, if this part is adapted to dissipate heat, its heat dissipation efficiency can be enhanced without using an external heat sink. For this reason, it is desirable to secure a wide heat dissipation pattern as much as possible not only on the topside but also on the underside of a printed circuit board on which the semiconductor device 10 is mounted. Note that the footprint is not limited to the design values exemplified in the table shown in FIG. 12 but can be adjusted in accordance with the situation.

Next, electric characteristics of the semiconductor device 10 having the structure described above is shown in FIG. 13.

FIG. 13 is a table showing electric characteristics of the semiconductor device 10. Note that the electric characteristics shown in FIG. 13 are values under the condition of Ta=25 degrees Celsius, Vcc=12 volts, fIN=1 kHz, Rg=0 ohm, RL=8 ohms, MUTEX="H" level and MS="L" level unless otherwise specified. In addition, typical values of maximum output power 1, maximum output power 2 and THD indicate average performances of the semiconductor device 10, which depends largely on a layout of the printed circuit board, circuit components and the power supply portion.

Next, methods for selecting and controlling external components will be described in detail.

First, the power supply terminals (pins 7, 8, 15, 16, 29, 30, 37, 38 and 40) will be described with reference to FIG. 14.

Figure 14:
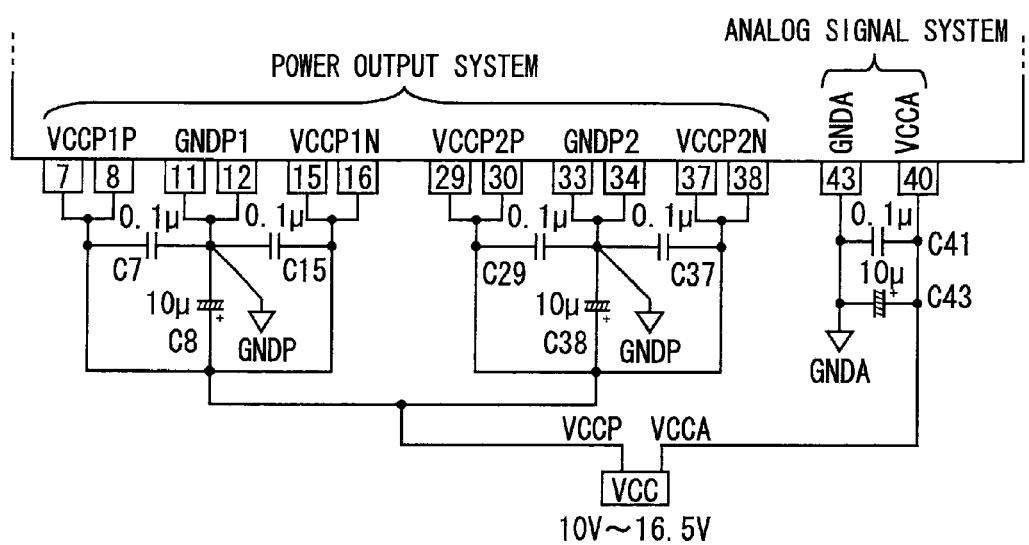
FIG. 14 is a power supply system diagram of the semiconductor device 10.

FIG. 14 is a power supply system diagram of the semiconductor device 10.

As shown in FIG. 14, the semiconductor device 10 has five power supply terminals. Four of them are the power supply terminals (VCCP1P, VCCP1N, VCCP2P and VCCP2N) for the output power system, and the other one is the power supply terminal (VCCA) for the analog signal system.

It is desirable that decoupling capacitors (C7, C8, C15, C29, C37, C38, C41 and C43) should be connected to the power supply terminals, respectively. In particular, as to the power supply terminal for output power, it is desirable to dispose a capacitor having good high frequency characteristics at the vicinity of the IC terminal. In addition, it is desirable that all the power supply terminals have the same voltage and have the same on and off timings.

Next, a method of power down will be described in detail.

Figure 15:
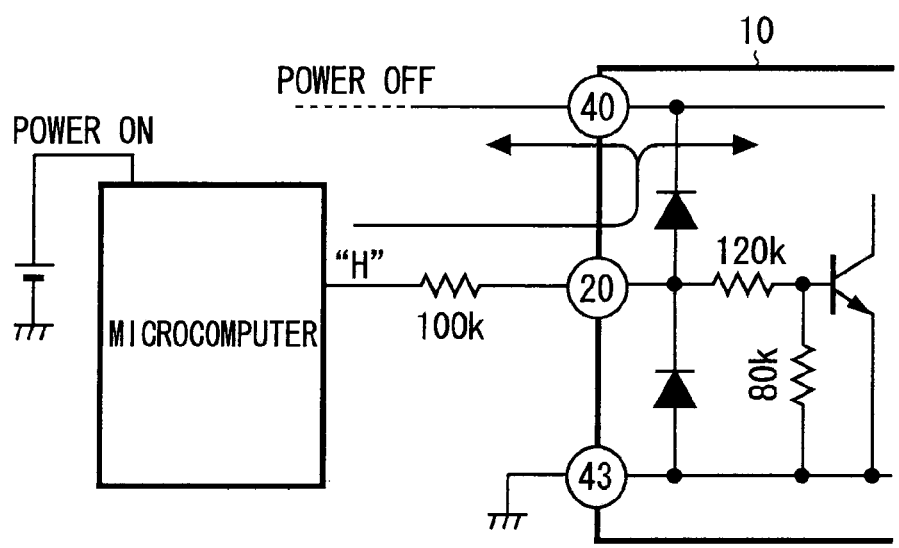
FIG. 15 is a diagram for explaining a method for limiting current of a control terminal.

In order to power down the semiconductor device 10, the power supply voltage that is applied to the semiconductor device 10 is made 0 volt. In this case, it is desirable that the MUTEX terminal (pin 20) of the semiconductor device 10 should be a low level (L). If the MUTEX terminal is in a high level (H) state, current may flow back from the microcomputer to the MUTEX terminal. If such the situation is supposed, it is desirable to insert a current limiting resistor between the microcomputer and the MUTEX terminal as shown in FIG. 15. However, it should be noted that if the current limiting resistor of 100 kilohms is connected, a control voltage of the MUTEX terminal has a high level input voltage of 3.5 volts to Vcc and a low level input voltage of the GND level to 1.2 volts.

Next, the audio mute (pins 20 and 26) will be described in detail.

The semiconductor device 10 can perform the audio mute by making the MUTEX terminal (pin 20) be a low level. Note that each of normal sampling operations of the PWM signal output terminal (pins 9, 10, 13, 14, 31, 32, 35 and 36) is stopped, and each output is fixed to the low level during the audio mute operation. In addition, a current consumption of the semiconductor device can be reduced during the audio mute operation (25 milliamperes typically in mute off to 10 milliamperes typically in mute on).

In addition, the semiconductor device 10 can perform soft mute control by using the soft mute portion 7 so that pop noise due to the audio mute control can be reduced.

Figure 16:
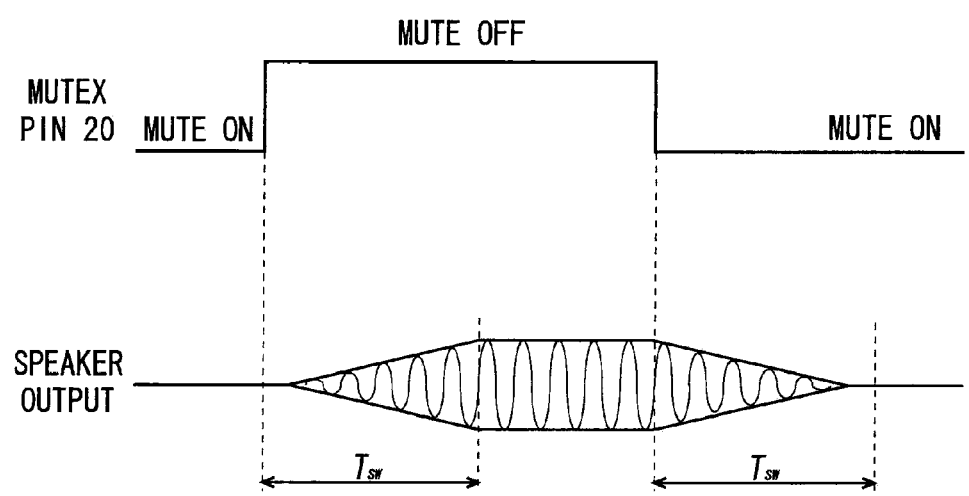
FIG. 16 is a timing chart showing an example of audio mute control.

FIG. 16 is a timing chart showing an example of the audio mute control (soft mute control).

Figure 17:
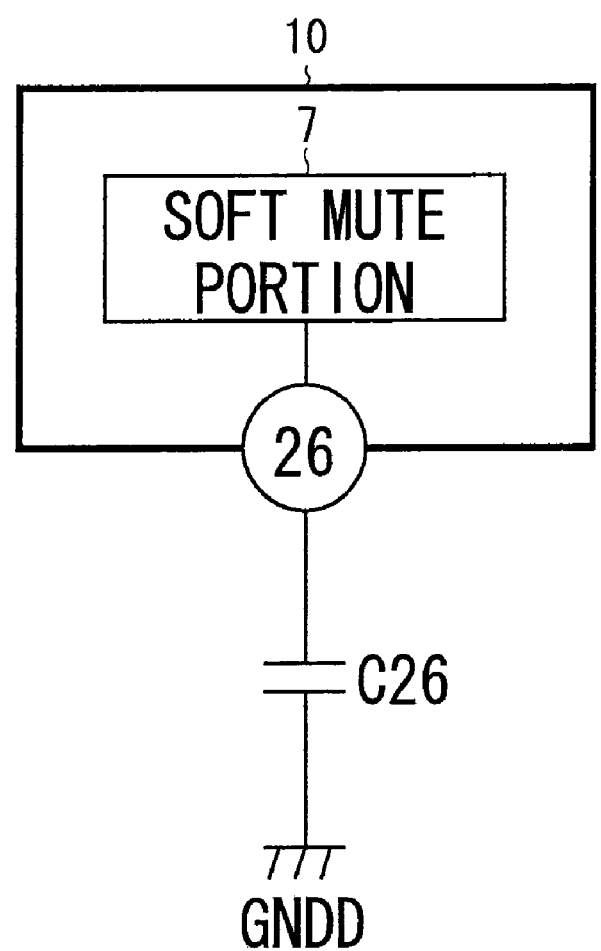
FIG. 17 is a block diagram showing an external capacitor C26 for making a time constant circuit of a soft mute portion 7.

Furthermore, the soft mute portion 7 includes a time constant circuit for setting soft mute switching time Tsw, and the soft mute switching time Tsw can be set in accordance with a capacitance value of a capacitor C26 (see FIG. 17) that is connected to the TM terminal (pin 26). This soft mute switching time Tsw can be obtained from the equation (1) below.

$$Tsw = 385000 \times C26 [sec] \quad (1)$$

The reference sign C26 in the above equation (1) is a parameter indicating the capacitance value of the capacitor C26 that is connected to the TM terminal, and its recommended value is 0.1 microfarads. If the capacitance value of the capacitor C26 is decreased, the soft mute switching time Tsw becomes short while the pop noise due to the audio mute control is generated easily. In contrast, if the capacitance value of the capacitor C26 is increased, the soft mute switching time Tsw becomes long while the pop noise due to the audio mute control can be reduced substantially. In addition, the semiconductor device 10 performs the soft mute operation even when the power supply interruption is detected. In this case, the soft mute switching time Tsw becomes approximately 1/10 of the normal soft mute switching time Tsw described above.

Furthermore, when the power supply is turned on, it is desirable to make the MUTEX terminal (pin 20) be in the low level state. In addition, also when the power supply is turned off, it is desirable to make the MUTEX terminal be in the low level before turning it off similarly. Such the sequence enables to reduce the pop noise when the power supply is turned on or off.

Next, the audio input circuit (pins 1 and 44) will be described with reference to FIG. 18.

Figure 18:
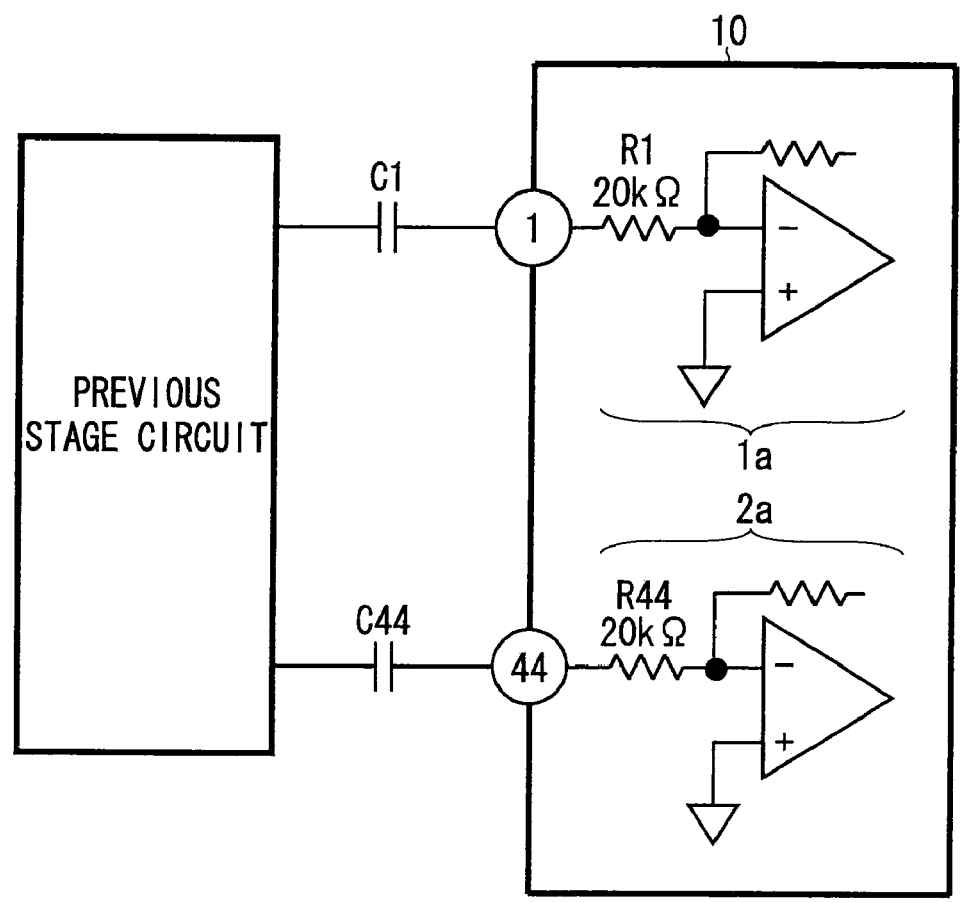
FIG. 18 is a circuit diagram showing an audio input circuit.

FIG. 18 is a circuit diagram showing the audio input circuit (its front end portion in particular).

As shown in FIG. 18, the audio signal is supplied to the IN1 terminal and the IN2 terminal, and coupling capacitors C1 and C44 are connected between the IN1 terminal (or the IN2 terminal) and its previous circuit. Therefore, these capacitors C1 and C44 and input impedances R1 and R44 of the semiconductor device 10 form a primary high-pass filter. Note that low-frequency cutoff frequencies fc1 and fc2 of the audio input terminals are determined in accordance with capacitance values of the capacitors C1 and C44 and a resistance value of the input impedances R1 and R44 (i.e., 20 kilohms typically) by using the equation (2) below.

$$fc1 = \frac{1}{2\pi \cdot R1 \cdot C1}[\text{Hz}], \; fc2 = \frac{1}{2\pi \cdot R44 \cdot C44}[\text{Hz}] \quad (2)$$

Here, reference signs C1 and C44 in the above equation (2) are parameters indicating capacitance values of the capacitors C1 and C44. The reference signs R1 and R44 are parameters indicating resistance values of the input impedances R1 and R44 of the semiconductor device 10.

However, if the capacitance values of the capacitors C1 and C44 are set to too large values, a period of time until the input terminal voltage becomes stable after the power supply is activated becomes long. If the MUTEX terminal (pin 20) is made the high level (mute off) before the input terminal voltage becomes stable, the pop noise is generated easily. Therefore, it is desirable that the capacitance value of the capacitors C1 and C44 should be set to optimal values noting the above-mentioned fact.

Next, the output LC filter circuit (pins 9, 10, 13, 14, 31, 32, 35 and 36) will be described in detail with reference to FIG. 19.

Figure 19:
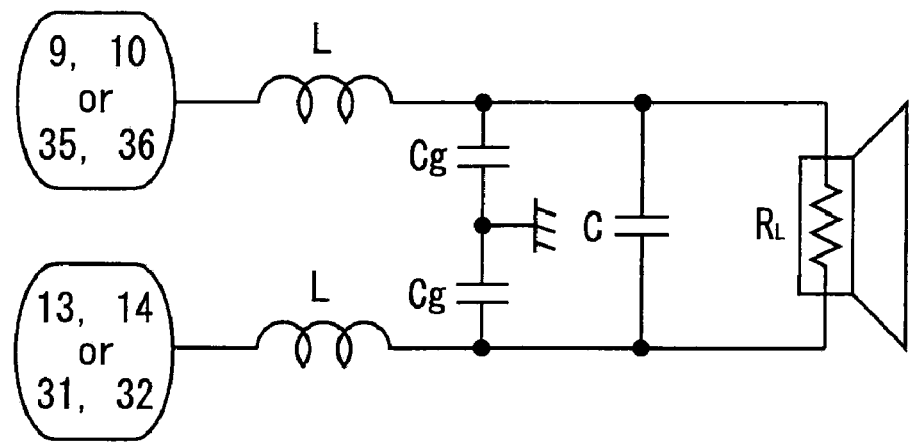
FIG. 19 is a circuit diagram showing an output LC filter circuit.

FIG. 19 is a circuit diagram showing the output LC filter circuit.

The output LC filter circuit eliminates high frequency components beyond the audio frequency range to be supplied to the load (speaker). Since a sampling clock frequency in the range within 250 kHz to 400 kHz is used for an output PWM signal of the semiconductor device 10, it is necessary to eliminate this signal sufficiently.

A coil L and a capacitor C constitute a differential filter having a damping characteristic of −12 dB/oct. Most of switching current flows in the capacitor C and very little current flows in the speaker (load resistance RL). Therefore, this filter reduces unwanted emission. In addition, the coil L and a capacitor Cg constitute a filter for a common mode signal and further reduce the unwanted emission.

Filter constants depend on the load impedance RL. When Q=0.707 holds, L, C and Cg are calculated by the equation (3) below.

$$L = \frac{R_L \sqrt{2}}{4\pi \cdot fc}[\text{Hz}],$$
$$C = \frac{1}{2\pi \cdot fc \cdot R_L \sqrt{2}}[F],$$
$$Cg = 0.2 \times C[F] \quad (3)$$

Reference sign RL in the above equation (3) is a parameter indicating the load impedance (ohms), and reference sign fc is a parameter indicating a LPF cut off frequency (Hz).

FIG. 20 shows tables of output LC filter constants for a typical load impedance. Note that table (a) in FIG. 20 shows filter constants in the case where the cut off frequency fc is set to 30 kHz while table (b) shows filter constants in the case where the cut off frequency fc is set to 40 kHz.

It is desirable that a coil used for the output LC filter circuit should be selected to be one having a small DC resistance component and a sufficient margin of a permissible current value. If the DC resistance component of the coil is large, a power loss is generated. In addition, it is desirable to select a closed magnetic circuit type normally for preventing unwanted emission.

In addition, it is desirable to select the capacitor used for the output LC filter circuit to be one having a small equivalent series resistance (ESR) and impedance characteristic that is not deteriorated in the high frequency range (over 100 kHz). In addition, since high frequency current flows in largely, it is desirable to select one having a sufficient margin of withstand voltage.

Next, a bootstrap circuit (pins 6, 17, 28 and 39) will be described in detail.

Capacitors for bootstrap (see C6, C17, C28 and C39 in FIG. 1) are respectively connected between the pin 10 and the pins 6 and 9, between the pin 14 and the pins 17 and 13, the pin 32 and the pins 28 and 31, and between the pin 36 and the pins 39 and 35. It is desirable that the capacitors to be connected have large capacitance value sufficient for preventing ripples of a bootstrap voltage from being generated when low frequency sound is reproduced, and a recommended value is 0.68 microfarads or larger.

Next, an output protection management (pins 9, 10, 13, 14, 31, 32, 35 and 36) will be described in detail.

When the load makes a short circuit, or when a short-to-power fault or a ground fault of the output occurs, or when a PWM sampling is activated, abnormal current may be generated in the output. In this case, an overshoot or an undershoot of the PWM output becomes very large. If this voltage exceeds the withstand voltage of the semiconductor device 10, the semiconductor device 10 may be broken down. For this reason, it is important to design the printed circuit board so that the voltages applied to the individual terminals cannot exceeds the absolute maximum rating in any cases. As a guideline of the maximum overshoot, it is desirable to design the PWM output terminals (pins 9, 10, 13, 14, 31, 32, 35 and 36) to be 20 volts or lower and the bootstrap terminals (pins 6, 17, 28 and 39) to be 40 volts or lower.

Figure 21:
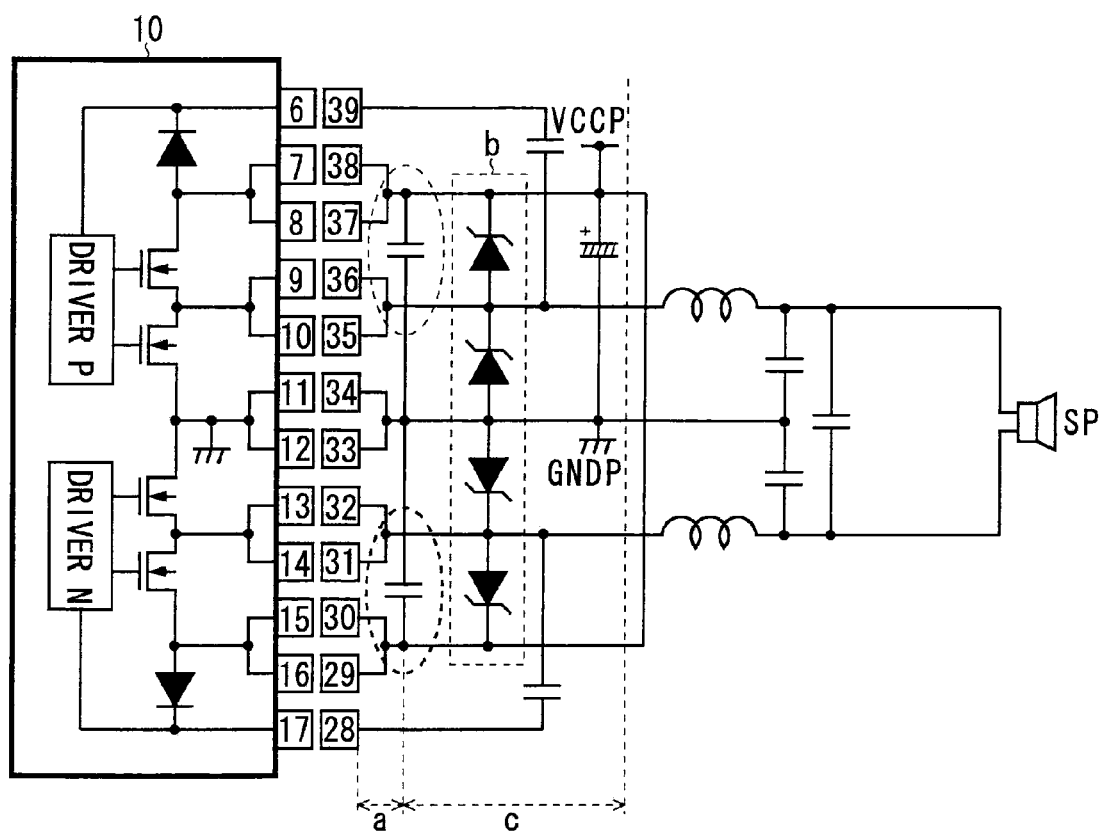
FIG. 21 is a circuit diagram showing an example of an output protection management.

FIG. 21 is a circuit diagram showing an example of the output protection management.

When the decoupling capacitor for high frequency is connected, it is desirable to dispose it at the vicinity of the terminal within a distance of a few millimeters between them as shown by the reference sign a. In addition, if a Schottky diode is used, it is desirable to dispose it at the vicinity of the terminal between the PWM output terminal and the power supply line or the GND as shown by the reference sign b. In addition, components to be disposed in the section shown by the reference sign c should be disposed as close as possible to the semiconductor device 10.

Next, a maximum output power will be described in detail with reference to FIG. 22.

Figure 22:
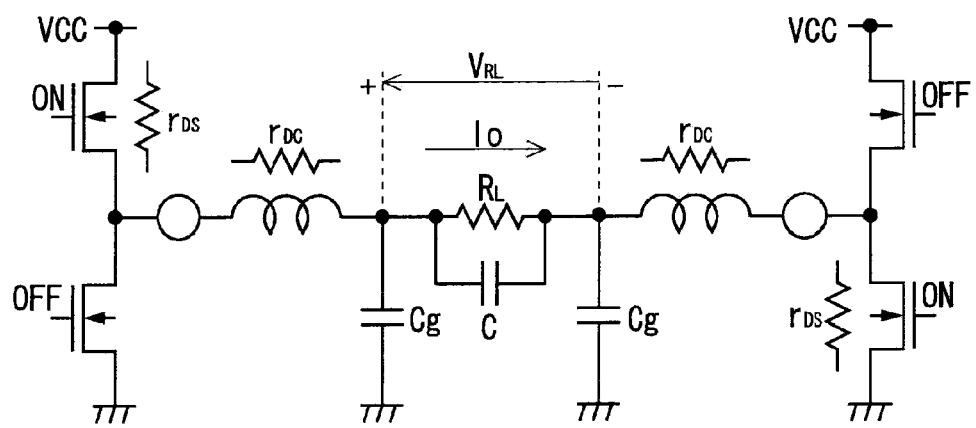
FIG. 22 is a circuit diagram showing output portions connected in a BTL configuration.

FIG. 22 is a circuit diagram showing an output portion connected by the bridge-tied load (BTL) form.

As for the BTL connection, an approximate value of the maximum output power Po (1%) that can be output without a clip in the output waveform (THD+N≦1%) can be derived from the equation (4) below.

$$Po(1\%) = \frac{\left(\frac{\frac{R_L}{2(r_{DS}+r_{DC})+R_L} \cdot Vcc}{\sqrt{2}}\right)^2}{R_L} [W] \quad (4)$$

Reference signs RL, Vcc, rDS and rDC in the above equation (4) are parameters indicating the load impedance (ohms), the power supply voltage (volts), the on resistance of the output MOS transistor (ohms) and the DC resistance component of the output LPF coil (ohms), respectively.

In addition, the maximum current Io(max) in this case can be derived from the equation (5) below.

$$Io(\max) = \frac{Vcc}{2(r_{DS}+r_{DC})+R_L} [A] \quad (5)$$

If the output waveform is further driven until it is clipped, a larger output power can be obtained than the case without distortion. The clipped state is quantified usually by THD+N=10%, and the maximum output power Po (10%) in this case can be derived from the equation (6) below.

$$Po(10\%) = Po(1\%) \times 1.25 [W] \quad (6)$$

Note that an actual maximum output power should be determined by taking a maximum permissible loss Pd and a junction temperature Tj of the semiconductor device 10 into account.

Figure 23:
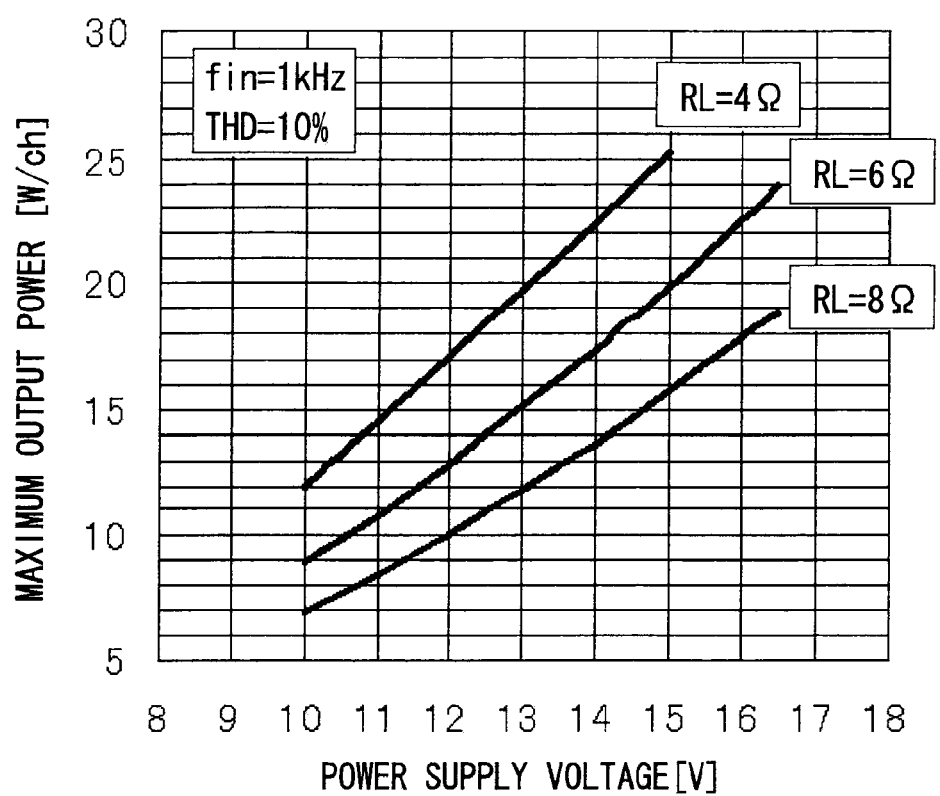
FIG. 23 is a diagram showing a relationship between a maximum output power and a power supply voltage.

FIG. 23 is a diagram showing a relationship between the maximum output power and the power supply voltage. In addition, FIG. 24 is a diagram showing a relationship between the continuous maximum output power and the power supply voltage when the maximum permissible loss Pd and the junction temperature Tj are taken into account.

Figure 24:
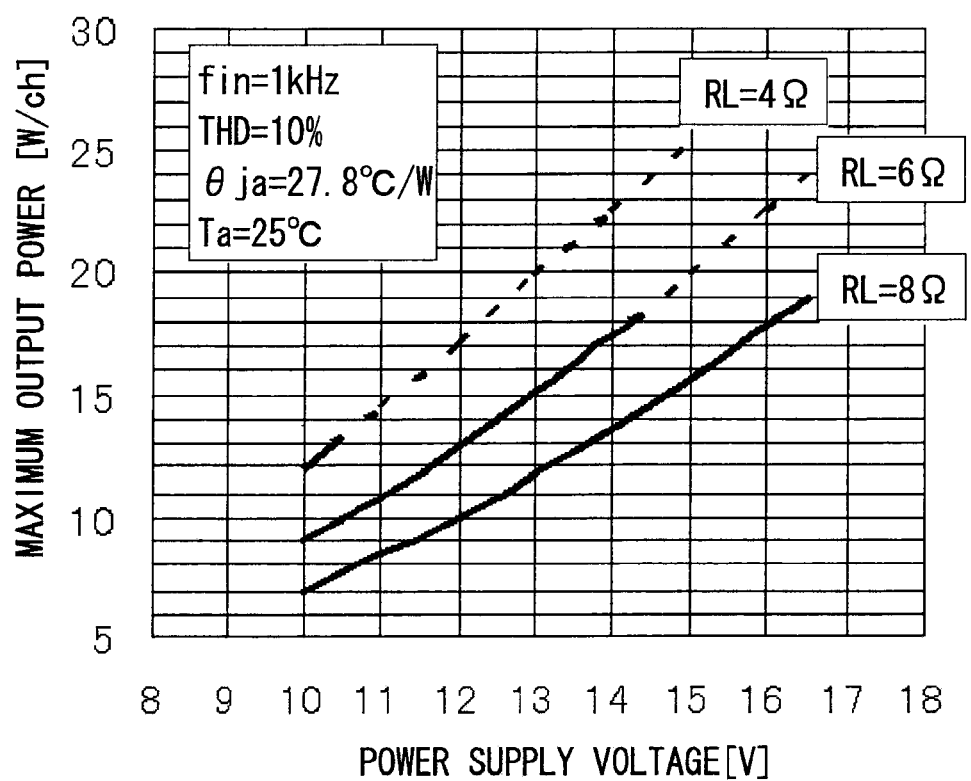
FIG. 24 is a diagram showing a relationship between a continuous maximum output power and the power supply voltage in consideration of a maximum permissible loss Pd and a junction temperature Tj.

FIG. 24 shows the continuous maximum output power when a printed circuit board (a double layer printed circuit board with underside copper foil of 70 millimeters×70 millimeters) having a package thermal resistance θja of 27.8 degrees Celsius per watt is used and the ambient temperature Ta is 25 degrees Celsius. The range indicated by a dot line in FIG. 24 has no margin with respect to the maximum permissible loss Pd and the junction temperature Tj, so it cannot be used for output in actual use.

Figure 25:
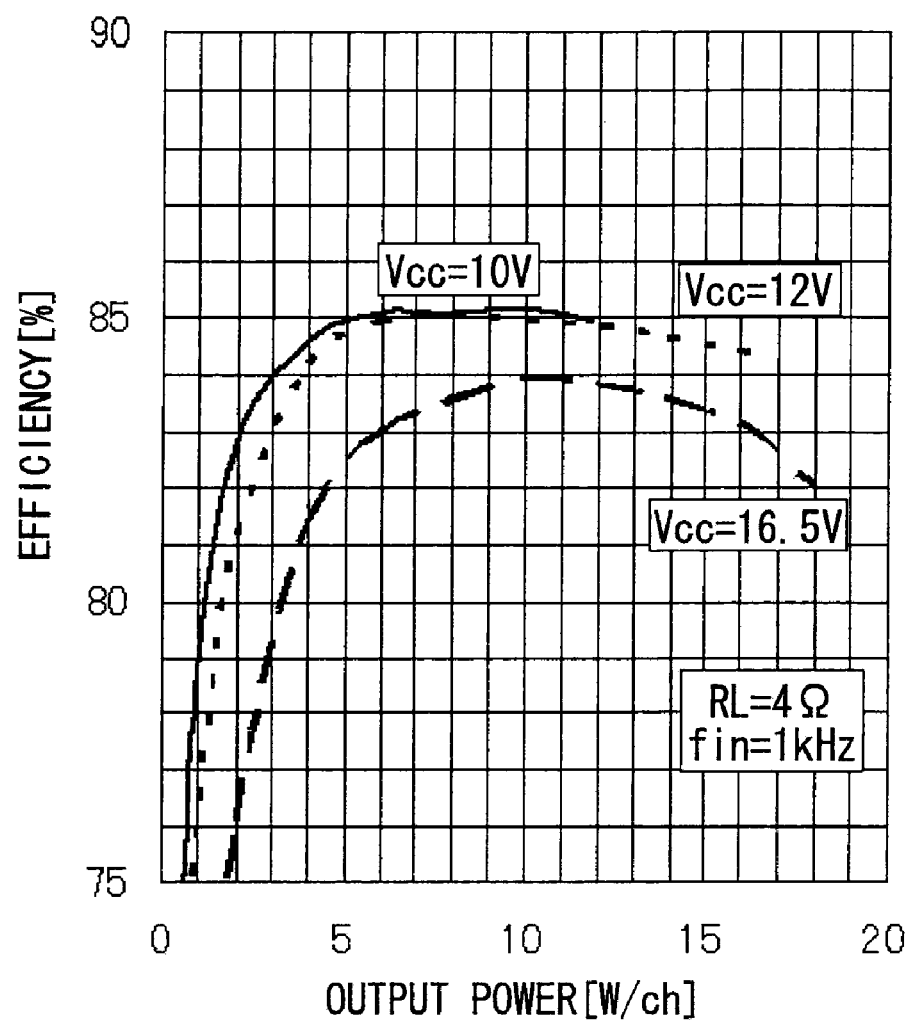
FIG. 25 is a diagram showing efficiency and output power characteristics with a load of 4 ohms.
Figure 26:
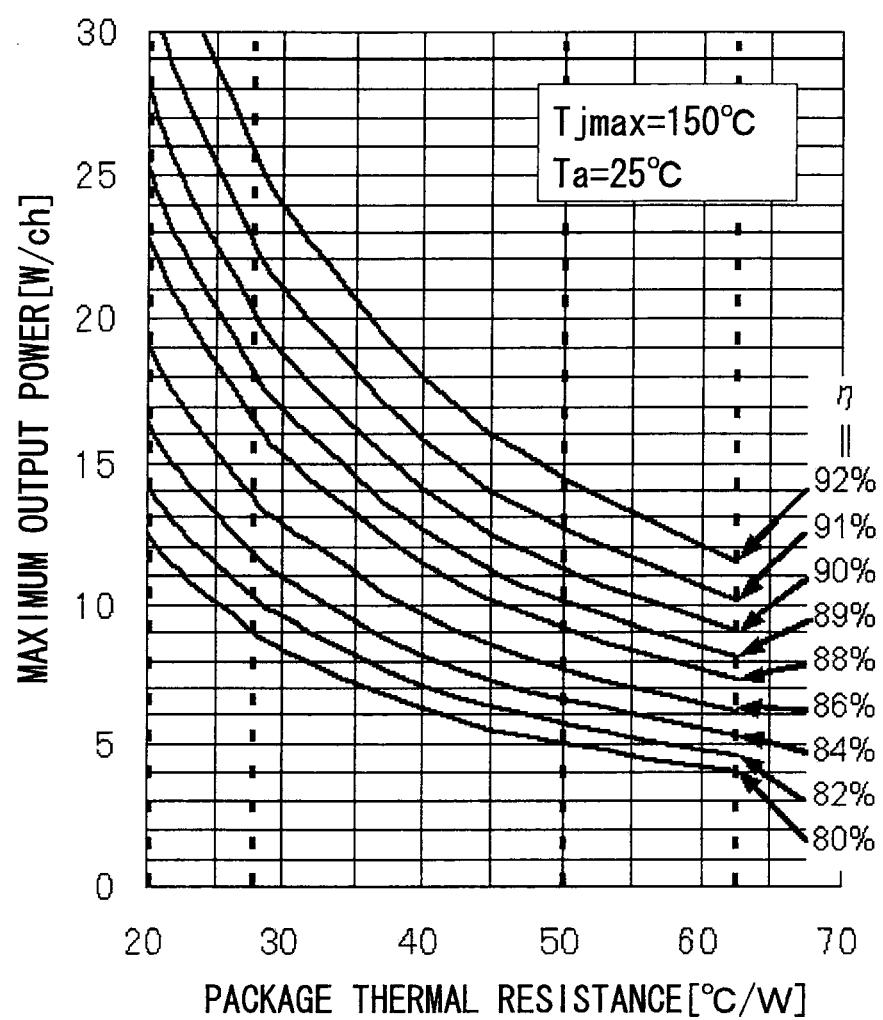
FIG. 26 is a diagram showing a relationship between the maximum output power and a package thermal resistance at an ambient temperature of 25 degrees Celsius.

The continuous maximum output power will be considered with reference to FIG. 25 and FIG. 26 about the case where the load resistance RL is 4 ohms, for instance.

FIG. 25 is a diagram showing efficiency and output power characteristics with a load of 4 ohms. In addition, FIG. 26 is a diagram showing a relationship between the maximum output power and the package thermal resistance at the ambient temperature of 25 degrees Celsius.

When the load resistance RL is 4 ohms, it is understood that the output power with the power supply voltage Vcc of 10 volts is 12 watts based on FIG. 23. In addition, it is understood based on FIG. 25 that the efficiency η is 85% when the power supply voltage Vcc is 10 volts and the output power is 12 watts. In addition, it is understood based on FIG. 26 that the maximum output power is 12.9 watts when the ambient temperature Ta is 25 degrees Celsius, the package thermal resistance θja is 27.8 degrees Celsius per watt, and the efficiency η is 85%. Therefore, if the power supply voltage Vcc is 10 volts, continuous output can be performed at an output power of 12 watts.

Next, setting of the internal PWM sampling clock frequency (pin 25) will be described in detail.

Figure 27:
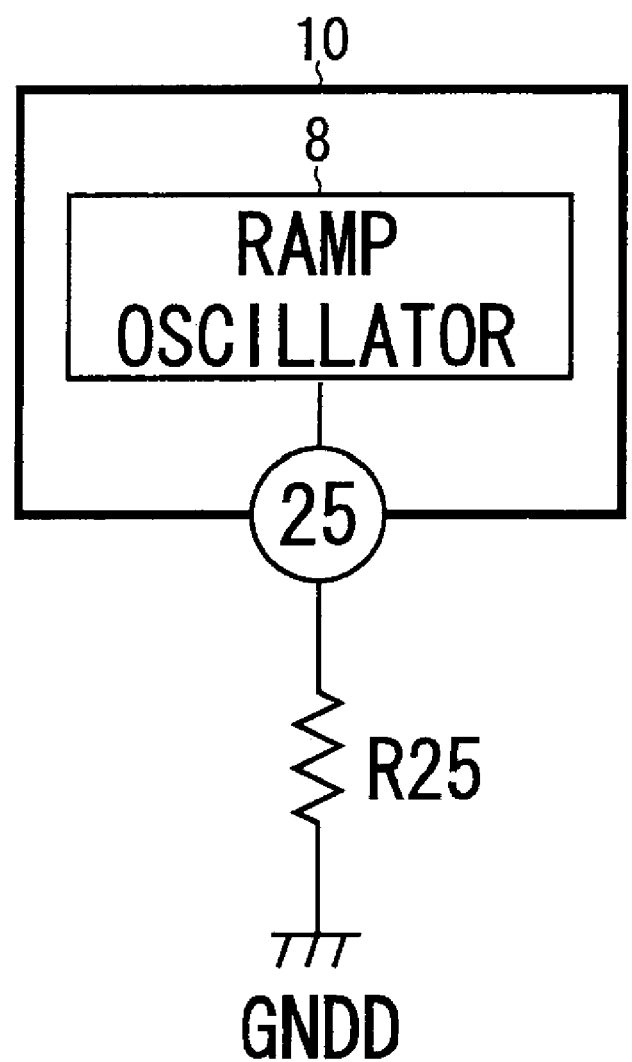
FIG. 27 is a block diagram showing an external resistor R25 for variable control of an oscillation frequency of a ramp oscillator 8.

The ROSC terminal (pin 25) can be usually in the open state. In addition, a frequency of the internal PWM sampling clock generated in the ramp oscillator 8 can be adjusted by connecting a resistor R25 to the ROSC terminal as shown in FIG. 27. A variable range of the frequency is 250 kHz to 400 kHz.

For instance, if harmonics of the PWM signal interfere with AM (medium frequency) radio, the interference can be avoided by connecting an appropriate resistor R25 to the ROSC terminal so that the sampling clock frequency is changed. However, if the ROSC terminal is used for any countermeasure, it is desirable to determine a resistance value of the resistor R25 by sufficiently considering that the sampling clock frequency will be changed in accordance with a manufacturing variation of the semiconductor device 10 and variations of the ambient temperature and the power supply voltage.

Note that the sampling clock frequency fs can be calculated by using the equation (7) below, and a result of the calculation can be summarized so as to obtain the frequency table shown in FIG. 28.

$$fs \cong \frac{8.0 \times 10^9}{(R25 // 32K)} [Hz] \quad (7)$$

Next, the master/slave function (pins 23 and 24) will be described in detail with reference to FIG. 29.

Figure 29:
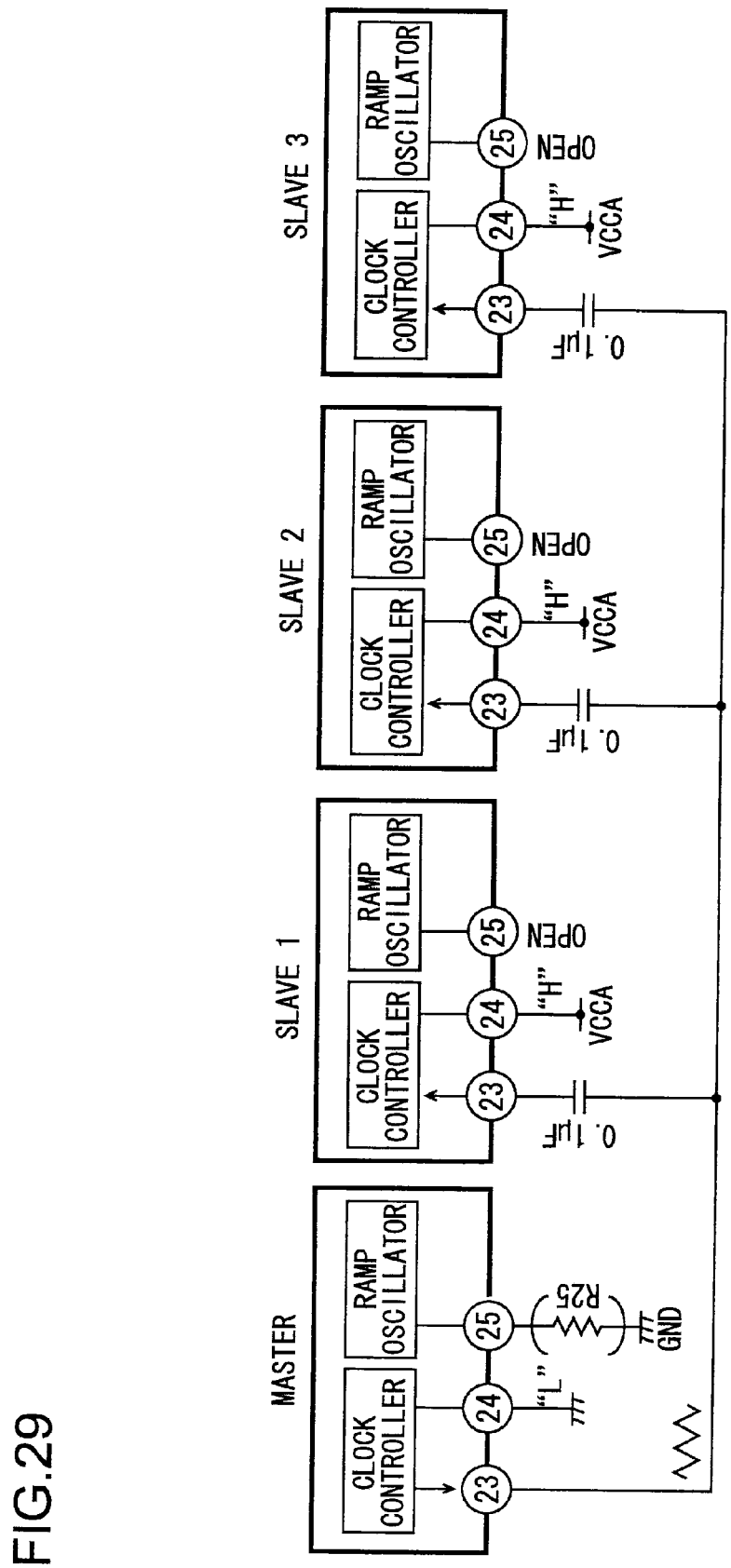
FIG. 29 is a block diagram for explaining a master/slave connection method.

FIG. 29 is a block diagram for explaining the master/slave connection method.

When a plurality of semiconductor devices 10 are used at the same time like a six channel amplifier, if the internal PWM sampling clock frequencies of the individual ICs are different from each other, they may interfere with each other resulting in generation of beat noise. In order to resolve this problem, the master/slave function of the semiconductor device 10 should be used.

Using the master/slave function, it is possible to make one of the ICs work as a master and the other IC work as a slave as shown in FIG. 29. Switching between the master and the slave can be selected by the voltage applied to the MS terminal (pin 24). The IC in which the terminal voltage of the MS terminal is the low level works as the master, while the IC in which the terminal voltage of the MS terminal is the high level works as the slave.

The IC that works as the master outputs the triangular wave signal from the OSC terminal (pin 23). Note that the frequency of the triangular wave signal is determined by the external resistor connected to the ROSC terminal (pin 25). The ICs are connected via the capacitor to each other.

One master IC can drive three slave ICs at most. A buffer amplifier is required to be inserted in order to connect more slave ICs.

The master/slave function described above is designed on the assumption that a plurality of semiconductor devices 10 are used on the same printed circuit board or in the same cabinet. If the signal is sent to another cabinet via a cable or the like, its waveform may be distorted resulting in deterioration of audio performance, so this is the important point to note. In addition, it is desirable to turn on and off the power supply terminals of all the master and the slave ICs at the same time.

Next, the bias terminal for the PWM signal system (pin 41) will be described.

Figure 30:
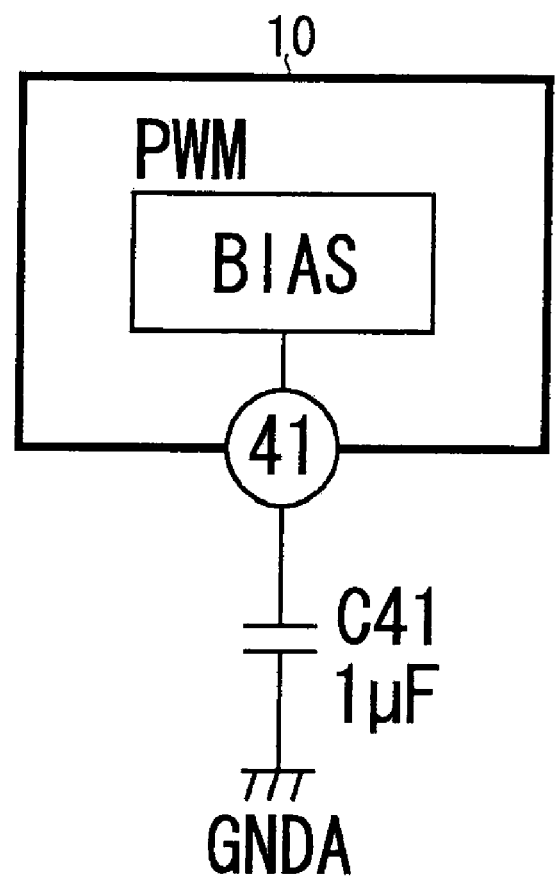
FIG. 30 is a block diagram showing a bias circuit filter for a PWM system.
Figure 31:
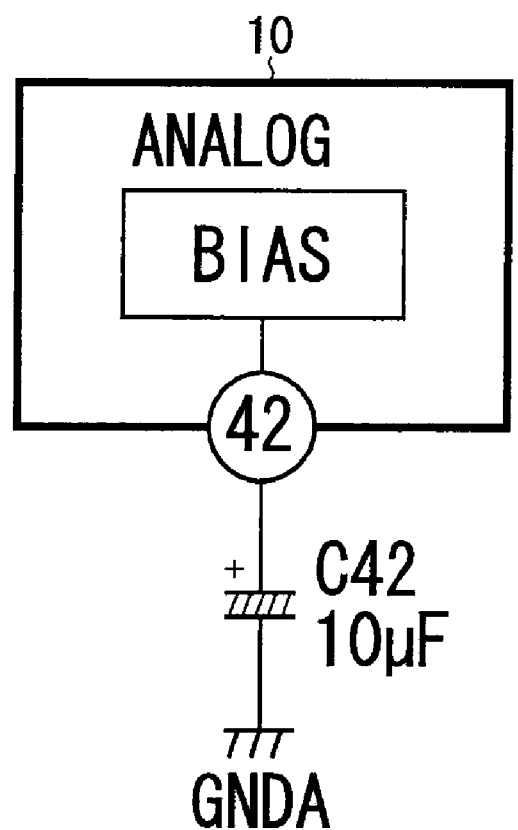
FIG. 31 is a block diagram showing a bias circuit filter for an analog signal system.

The FILP terminal (pin 41) is a filter terminal of a bias circuit for supplying a bias voltage to a PWM block (see 1b and 2b in FIG. 1) inside the semiconductor device 10 as shown in FIG. 30 and is connected to the ground terminal via the capacitor C41 of 1 microfarad.

Next, the bias terminal for the analog signal system (pin 42) will be described.

The FILA terminal (pin 42) is a filter terminal of a bias circuit for supplying a bias voltage to an analog block (see 1a, 2a and the like in FIG. 1) inside the semiconductor device 10 as shown in FIG. 30, and it is connected to the ground terminal via the capacitor C42 of 10 microfarads.

Next, the protection function of the semiconductor device 10 will be described in detail.

The semiconductor device 10 has various protection functions including the high temperature protection function, the output short-to-power fault and ground fault protection function, the voltage decrease protection function, the speaker DC voltage application protection function and the power supply interruption detection function. FIG. 32 shows an operating state list table of the protection functions.

As to the high temperature protection function, a protection start temperature and a protection cancel temperature (*1 in the table) are both a junction temperature of the semiconductor device 10 to be monitored. In addition, as to the output short-to-power fault protection function, the output ground fault protection function, and the speaker DC voltage application protection function, when the PWM output state becomes in a latched state (*2 in the table), it is not reset automatically even if the abnormal state is canceled. As a method of the reset, the power supply should be turned off and then turned on again. Otherwise, the MUTEX terminal (pin 20) should be made the low level and then made the high level again.

Next, the power supply interruption detection function (pin 27) will be described in detail.

Figure 33:
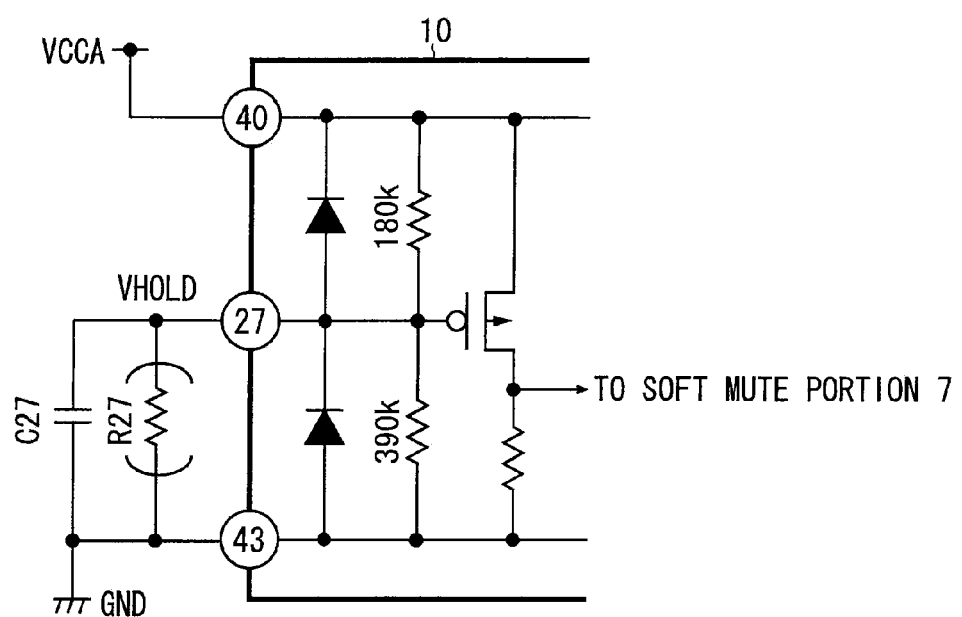
FIG. 33 is a circuit diagram showing a structural example of a power cut-off detection circuit.

FIG. 33 is a circuit diagram showing a structural example of the power cut-off detection circuit.

When a power cord of the television set or the like is unplugged from the AC outlet while it is working, the power cut-off detection circuit is used for detecting the interruption of the power supply, so that the speaker output can be soft-muted automatically. Thus, the pop noise can be reduced substantially.

Note that the soft mute switching time Tsw when the power supply is cut off is approximately one tenth of the soft mute switching time Tsw by the MUTEX terminal (pin 20) set by using the TM terminal (pin 26).

The power cut-off detection circuit shown in FIG. 33 is activated when the voltage applied to the VCCA terminal (pin 40) drops by the power supply interruption and a difference between the voltage and a voltage applied to the VHOLD terminal (pin 27) becomes approximately 2 volts or lower. Note that the voltage applied to the VHOLD terminal is usually determined by a ratio between resisters inside the semiconductor device 10 (180 kilohms and 390 kilohms). Furthermore, it is possible to adjust the voltage applied to the VHOLD terminal by adding an external resistor R27 to the semiconductor device 10. In addition, the external capacitor C27 connected to the semiconductor device 10 has a role of holding the detection voltage level during the power supply interruption.

FIG. 34 is a list table showing a relationship among the VCCA power supply voltage, the VHOLD terminal voltage and the power supply interruption detection voltage (in the case where the resistor R27 is not used).

If the power supply interruption detection voltage is set to a value of 7 volts or lower, the voltage decrease protection function works before the power supply interruption detection function works. As a result, the protection against the power supply interruption does not work resulting in generation of the pop noise. Therefore, it is desirable to set an optimal value of the power supply interruption detection voltage for each set model considering that the time for turning off the power supply depends on each set model.

Next, the warning output terminal (pin 18) will be described in detail with reference to FIG. 35.

FIG. 35 is a table showing states of the warning output terminal.

The warning output terminal (pin 18) is a terminal for notifying by a warning flag that the high temperature protection function or the voltage decrease protection function works. During the protection operation, the warning output terminal outputs the high level signal. When the protection operation is canceled and the normal operation restarts, the low level signal is output.

The high level voltage of the warning output terminal is usually set to 5 volts, but if the power supply voltage Vcc becomes 6 volts or lower, the high level voltage of the warning output terminal decreases in proportion to the power supply voltage Vcc. It should be noted that the warning flag cannot be output normally if the power supply voltage Vcc is 4 volts or lower.

Next, the error output terminal (pin 19) will be described in detail with reference to FIG. 36.

FIG. 36 is a table showing states of the error output terminal.

The error output terminal (pin 19) is a terminal for notifying by an error flag that the output short-to-power fault and ground fault protection function or the speaker DC voltage application protection function works. During the protection operation, the error output terminal outputs the high level signal. When the protection operation is canceled and the normal operation restarts, the low level signal is output.

The high level voltage of the error output terminal is usually set to 5 volts, but if the power supply voltage Vcc becomes 6 volts or lower, the high level voltage of the high level voltage of the error output terminal decreases in proportion to the power supply voltage Vcc. It should be noted that the error flag cannot be output normally if the power supply voltage Vcc is 4 volts or lower.

Next, output power limitation function (pins 2, 3, 4 and 5) will be described in detail.

The semiconductor device 10 has the output power limitation function using the power limiting portion 3 for preventing the damage to a speaker due to excessive output power.

Figure 37:
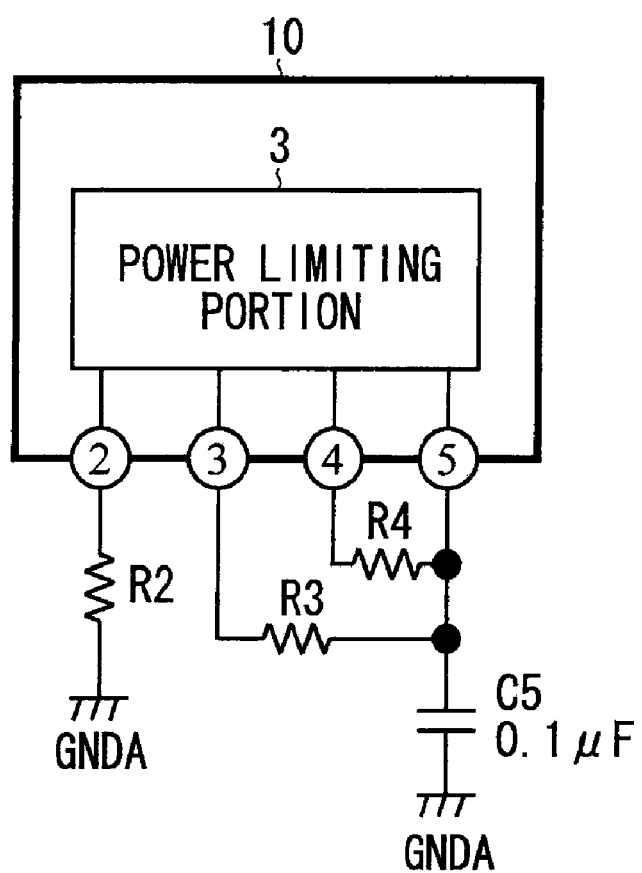
FIG. 37 is a block diagram showing external components for setting output power limitation.

FIG. 37 is a block diagram showing external components for setting the output power limitation.

The limitation value of the output power can be set arbitrarily by adjusting resistance values of the external resistors R2, R3 and R4 shown in FIG. 37.

Figure 38:
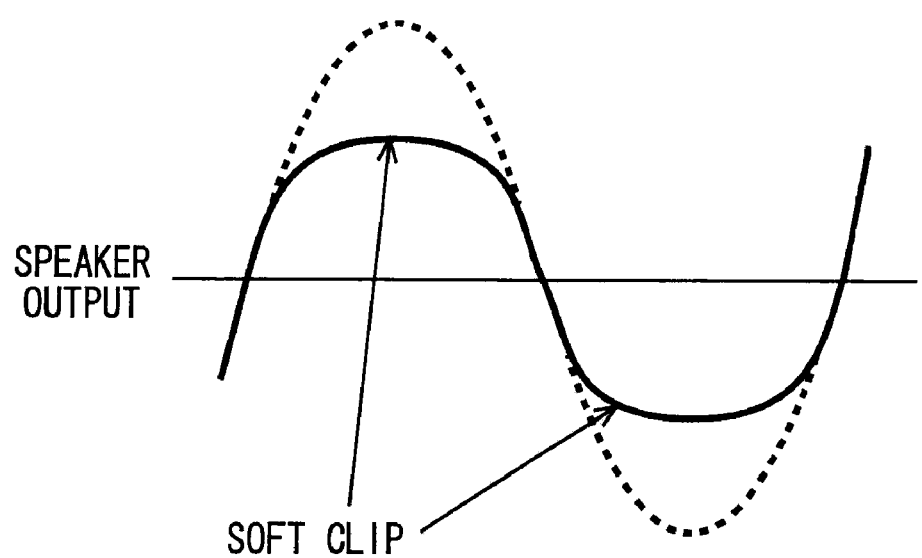
FIG. 38 is a diagram showing a speaker output waveform when an output power limitation function is used.

FIG. 38 is a diagram showing a speaker output waveform when the output power limitation function is used.

As shown in FIG. 38, the speaker output waveform is soft-clipped by the output power limitation function described above, so an abnormal audible sound can be reduced substantially when the output power is limited.

Functions of the resistors R2, R3 and R4 will be described in more detail. The resistor R2 performs a voltage/current conversion so that a reference current of the power limiting portion 3 is determined. In addition, the resistors R3 and R4 perform current/voltage conversion so that upper and lower amplitude limitation values of the output waveform are determined. Therefore, it is desirable to use resistors R2, R3 and R4 of high precision (±1% or less is recommended). The terminal of pin 5 is a filter terminal of a bias circuit supplying a bias voltage to the power limiting portion 3 and is connected to the ground via the capacitor C5 of 0.1 microfarads.

Supposing that the output power limitation value is Po watts at THD+n=10% and the load impedance of the speaker is RL ohms, the resistance ratio R3/R2 can be calculated by the equation (8) below (here, R3=R4).

$$\frac{R3}{R2} \cong \frac{(0.4 + R_L)\sqrt{1.8 \cdot R_L \cdot Po}}{35 \cdot R_L} \quad (8)$$

Note that it is desirable to set a resistance value of the resistor R2 to 20 kilohms or larger. In addition, if the output power limitation function is not used, resistance values of the resistors R2, R3 and R4 should be the same.

FIG. 39 is a table showing an example of set output power limitation values.

Next, the power on/off sequence will be described in detail.

First, the case where the power on/off sequence is controlled by a microcomputer will be described with reference to FIG. 40.

Figure 40:
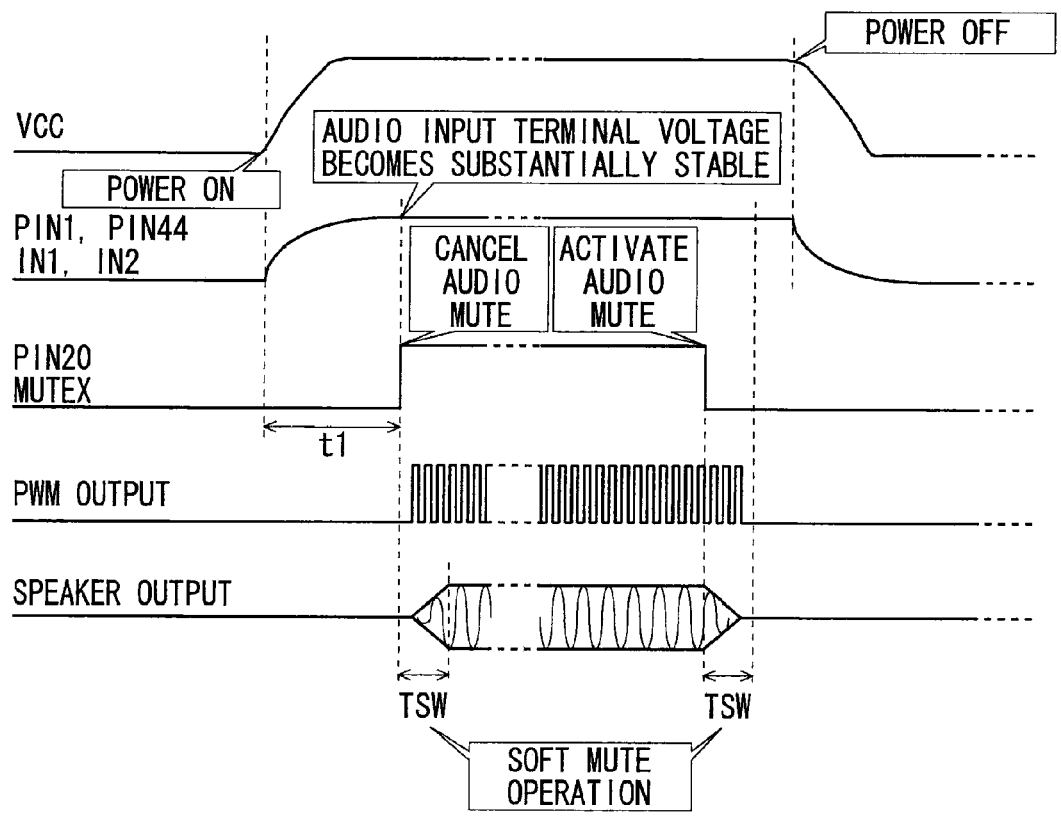
FIG. 40 is a timing chart for explaining a power on/off sequence when a microcomputer is used.

FIG. 40 is a timing chart for explaining the power on/off sequence when the microcomputer is used. The waveforms shown in FIG. 40 from the upper side indicate the power supply voltage Vcc, the terminal voltages of the IN1 terminal (pin 1) and the IN2 terminal (pin 44), the terminal voltage of the MUTEX terminal (pin 20), the PMW output and the speaker output, respectively.

When the semiconductor device 10 is activated, if the audio mute is canceled before the terminal voltages of the IN1 terminal and the IN2 terminal are canceled, pop noise will be generated. Therefore, it is desirable to control the terminal voltage of the MUTEX terminal after time t1 for the terminal voltages of the IN1 terminal and the IN2 terminal to be stable when the semiconductor device 10 is activated.

The time t1 depends on a capacitance value of the capacitor C42 connected to the FILA terminal (pin 42) and the capacitance values of the coupling capacitors C1 and C44 connected between the IN1 terminal and the previous circuit, and between the IN2 terminal and the previous circuit, respectively. The audio mute is canceled gradually and the sound is output gradually taking the soft mute switching time Tsw.

On the other hand, as to the power down of the semiconductor device 10, if the power supply voltage Vcc is turned off before the soft mute switching time Tsw passes, the pop noise may be generated. Therefore, it is desirable to turn off the power supply voltage Vcc for power down after controlling the terminal voltage of the MUTEX terminal so that the audio mute is turned on and after the soft mute switching time Tsw or longer time passes.

Next, the case where the microcomputer is not used will be described with reference to FIGS. 41 and 42.

Figure 41:
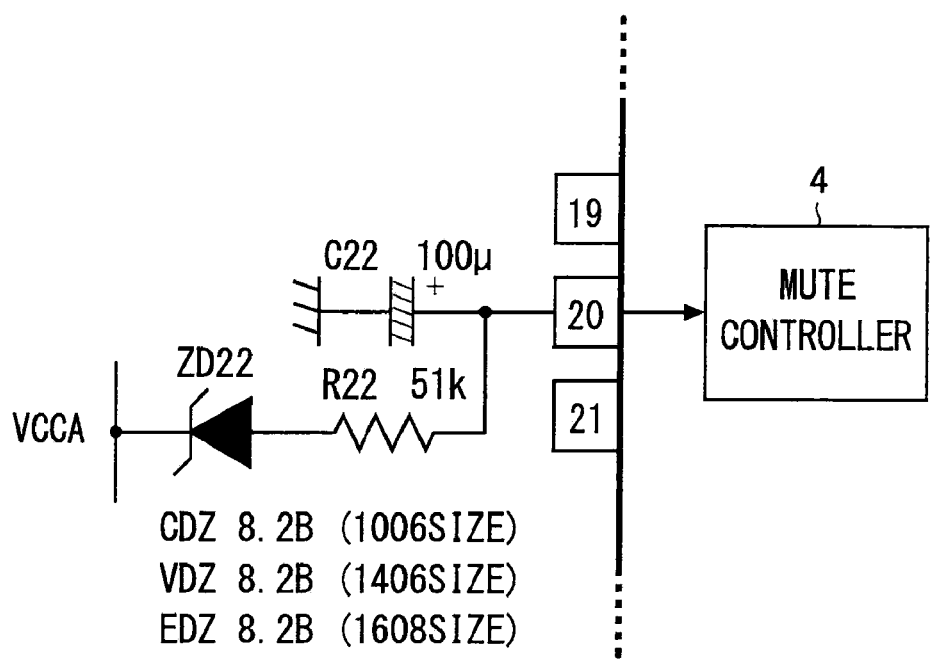
FIG. 41 is a circuit diagram showing a structural example of a mute control circuit.
Figure 42:
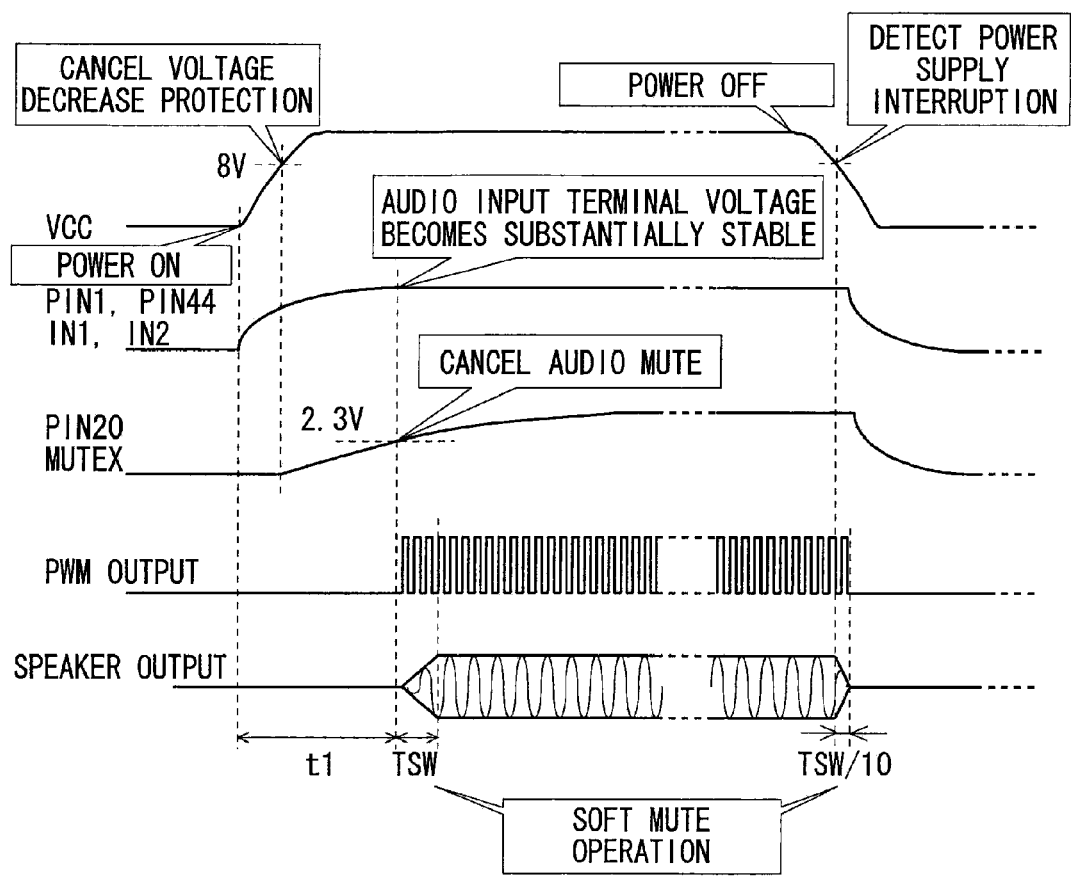
FIG. 42 is a timing chart for explaining a power on/off sequence when a microcomputer is not used.

FIG. 41 is a circuit diagram showing a structural example of the mute control circuit. In addition, FIG. 42 is a timing chart for explaining the power on/off sequence when the microcomputer is not used. The waveforms shown in FIG. 41 from the upper side indicate the power supply voltage Vcc, the terminal voltages of the IN1 terminal (pin 1) and the IN2 terminal (pin 44), the terminal voltage of the MUTEX terminal (pin 20) and the speaker output, respectively.

As described above, it is necessary to cancel the audio mute after the terminal voltages of the IN1 terminal and the IN2 terminal become sufficiently stable in order to prevent pop noise when the power supply is turned on. Therefore, a capacitance value of the capacitor C22 (recommended value is 100 microfarads) and a resistance value of the resistor R22 (a recommended value is 51 kilohms) constituting the mute control circuit should be set so that a terminal voltage of the MUTEX terminal reaches a predetermined high level (2.3 volts or higher) taking a predetermined time t1. After the MUTEX terminal reaches the high level, the audio mute is canceled gradually and the sound is output gradually taking the soft mute switching time Tsw.

On the other hand, as to the power down of the semiconductor device 10, generation of pop noise is suppressed by cooperation action of the power supply interruption detection function and the soft mute function. However, it should be noted that the pop noise will be generated if the power supply is turned on again after the power down of the semiconductor device 10 and before the MUTEX terminal is discharged to the low level. Note that the cooperation action of the power supply interruption detection function and the soft mute function will be described later in detail.

Next, an example of a pattern layout of the printed circuit board is shown in FIGS. 43 to 47.

Figure 43:
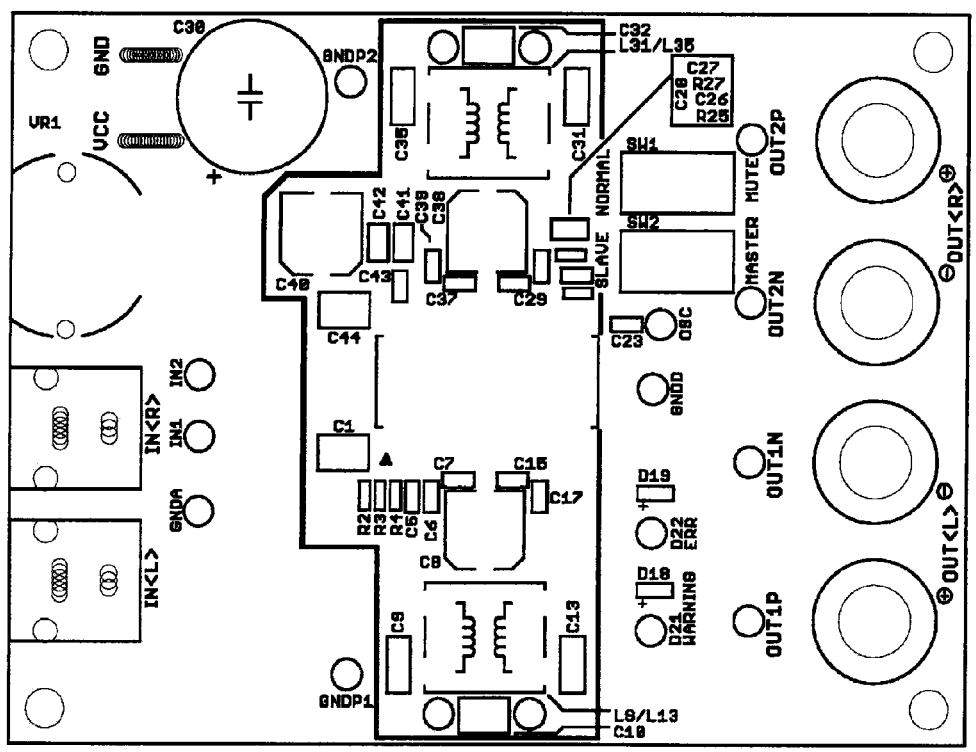
FIG. 43 is a top view showing a silk screen pattern layout example on Layer 1.
Figure 44:
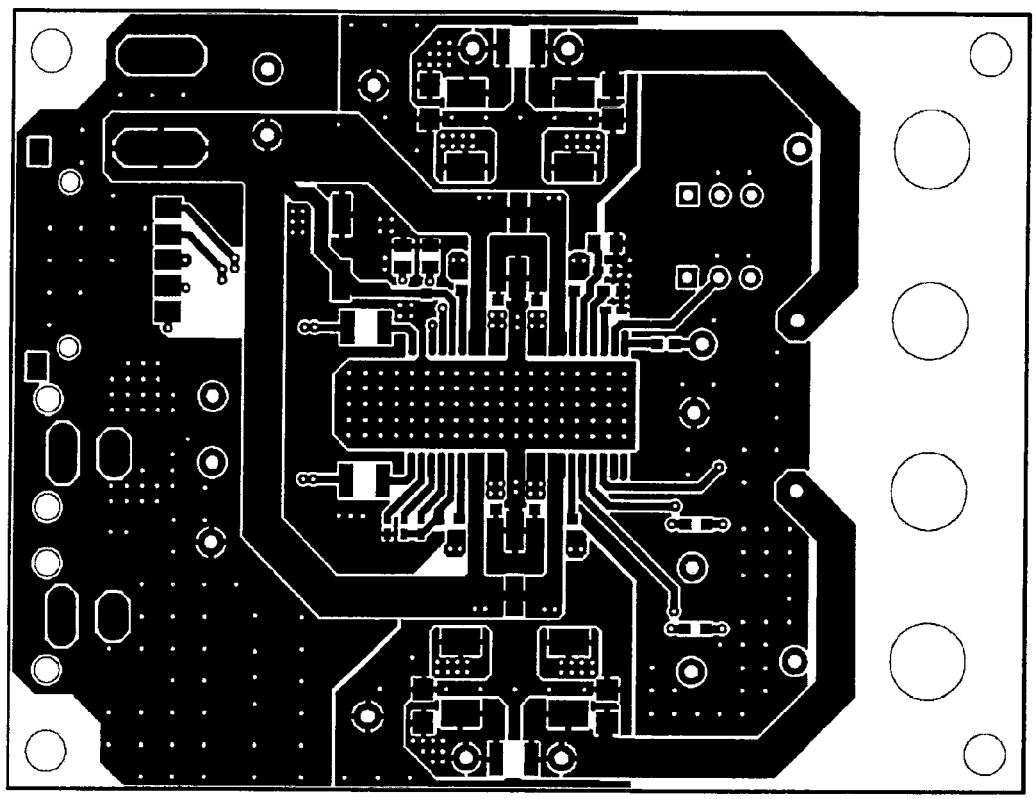
FIG. 44 is a top view showing a wiring pattern layout example on the Layer 1.
Figure 45:
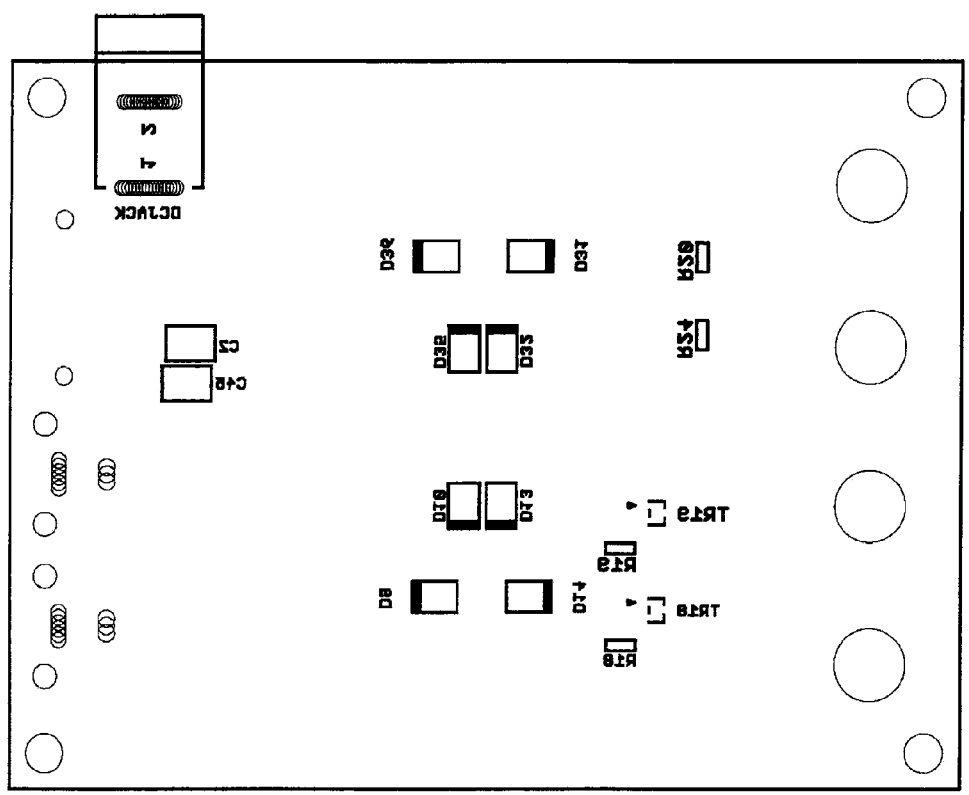
FIG. 45 is a top view showing a silk screen pattern layout example on Layer 2.
Figure 46:
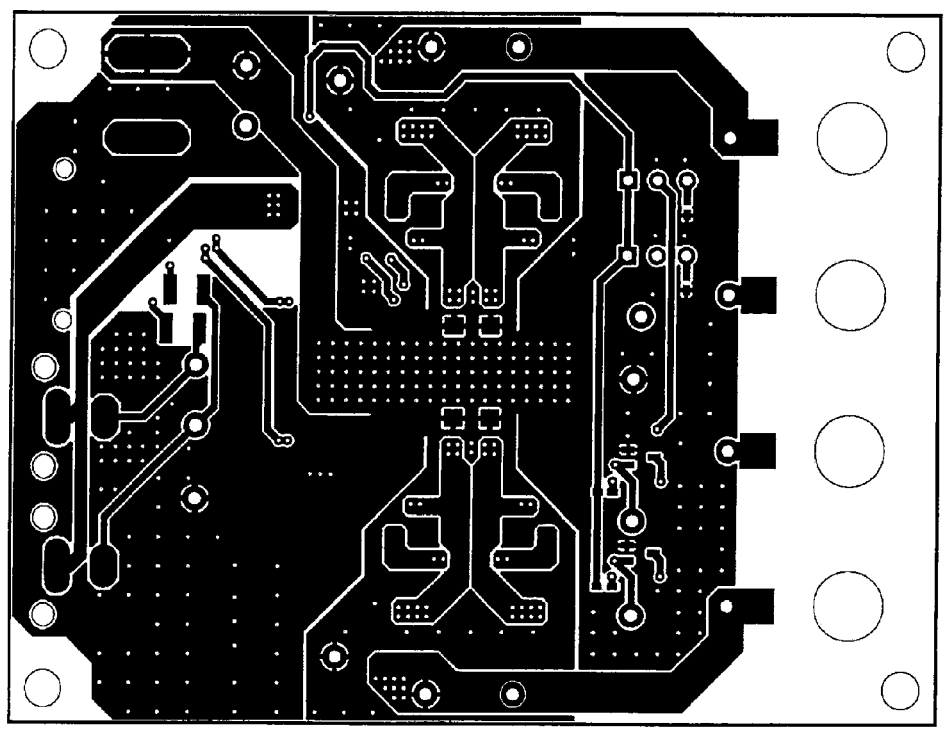
FIG. 46 is a top view showing a wiring pattern layout example on the Layer 2.

FIG. 43 is a top view showing an example of a silk screen pattern layout of Layer 1. FIG. 44 is a top view showing an example of a wiring pattern layout of the Layer 1. FIG. 45 is a top view showing an example of a silk screen pattern layout of Layer 2. FIG. 46 is a top view showing an example of a wiring pattern layout of the Layer 2.

Figure 47:
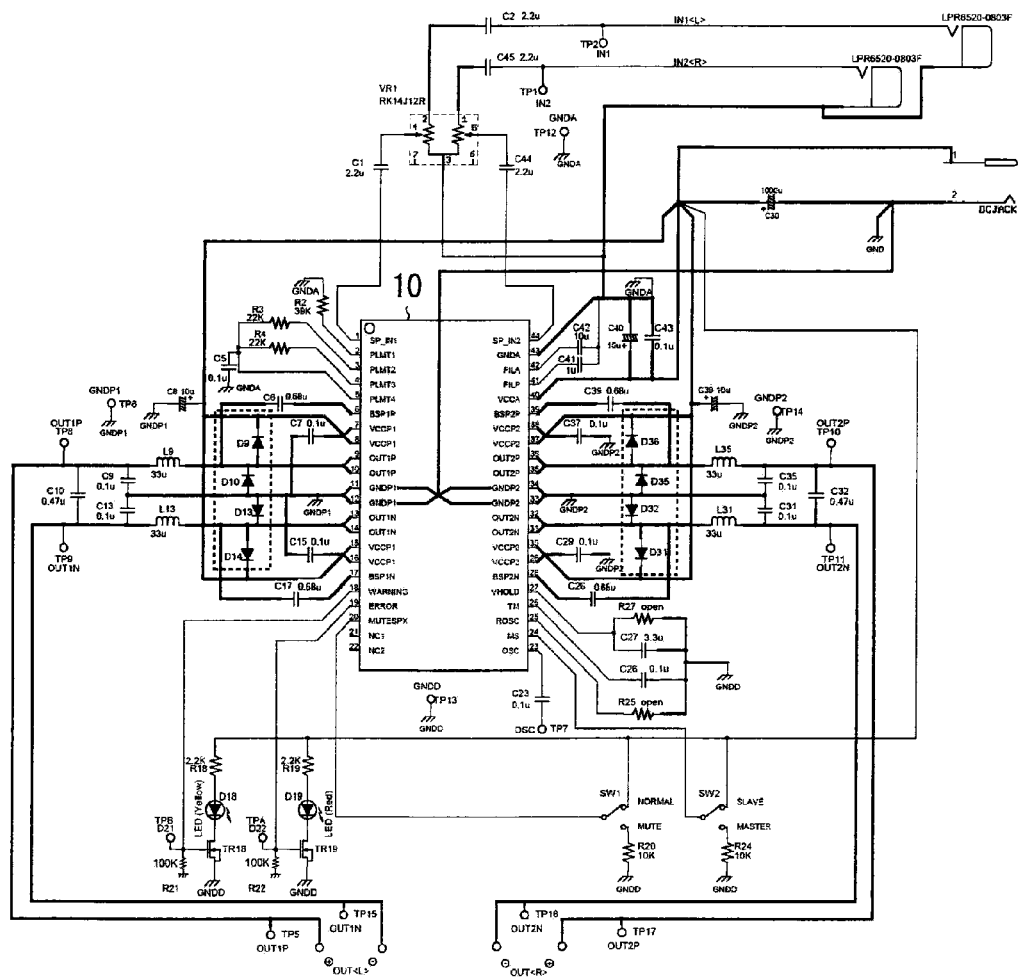
FIG. 47 is a diagram of a demonstration board circuit.

FIG. 47 is a diagram of a demonstration board circuit showing a circuit example in which external elements similar to FIG. 1 are connected to the semiconductor device 10 basically. Furthermore, as to portions unique to FIG. 47, reference signs OUT<L> and OUT<R> in FIG. 47 are pin jacks to which speakers of individual channels are connected. Furthermore, in the illustrated example, the WARNING terminal (pin 18) and the ERROR terminal (pin 19) are used for controlling turning on and off of a yellow color LED and a red color LED, respectively. Furthermore, in the illustrated example, a variable resistor for an input volume is inserted in the previous stage of each of the IN1 terminal and the IN2 terminal (pins 1 and 44).

Next, precautions for the pattern layout will be described in detail.

Figure 48:
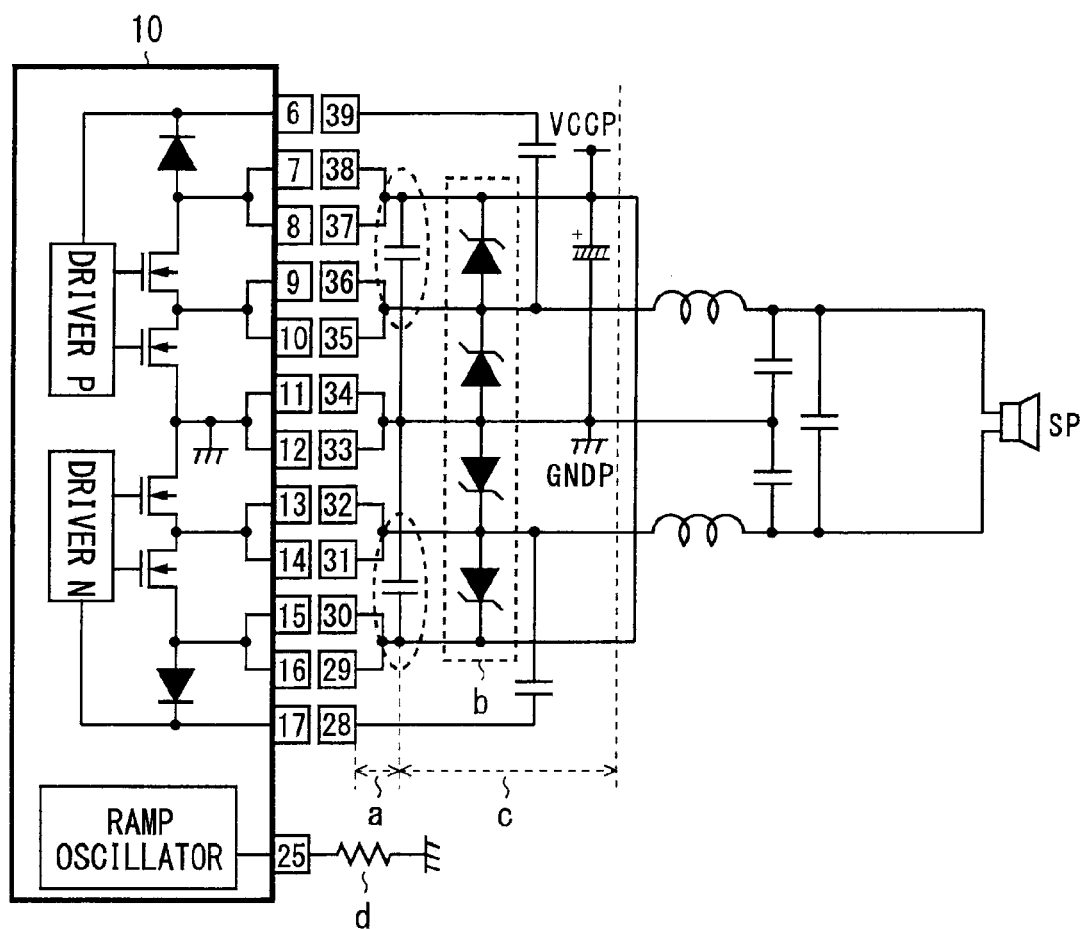
FIG. 48 is a diagram for explaining a component layout with the highest priority.

FIG. 48 is a diagram for explaining a component layout with the highest priority.

As shown by reference sign a, it is desirable that a high frequency decoupling capacitor should be disposed at the vicinity of the terminal within a distance of few millimeters if it is connected. In addition, as shown by reference sign b, it is desirable that a Schottky diode should be disposed at the vicinity of the terminal between the PWM output terminal and the power supply or the GND if it is used. In addition, it is desirable that components to be disposed in the section indicated by reference sign c should be disposed at the vicinity of the semiconductor device 10 as close as possible. In addition, the resistor indicated by reference sign d is vulnerable to influence of noise if its wiring is long, so it is desirable that the resistor should be disposed at the vicinity of the terminal within a distance of few millimeters. As to priorities of the reference sign a to d, the reference sign a has the highest priority while the reference sign d has the lowest priority.

Figure 49:
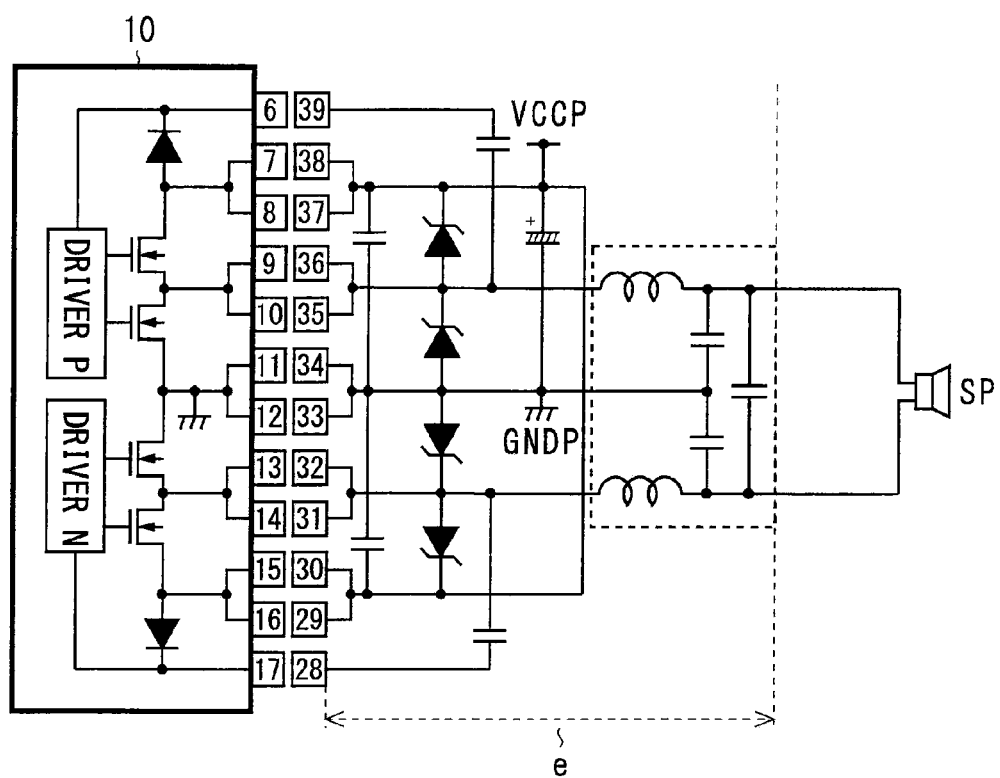
FIG. 49 is a diagram for explaining a component layout with the second priority.

FIG. 49 is a diagram for explaining a component layout with the second priority.

As shown in FIG. 49 by reference sign e, it is desirable to make a distance between wirings of the semiconductor device 10 and the LC filter as short as possible so that unwanted emission can be reduced.

In addition, as to a component layout with the third priority, the decoupling capacitor of the analog power supply terminal (pin 40) should be disposed at the vicinity of the terminal of the semiconductor device 10, and the decoupling capacitors of the bias terminals (pins 41 and 42) should be disposed at the vicinity of the terminal of the semiconductor device 10.

Next, GND wirings will be described in detail with reference to FIG. 50.

Figure 50:
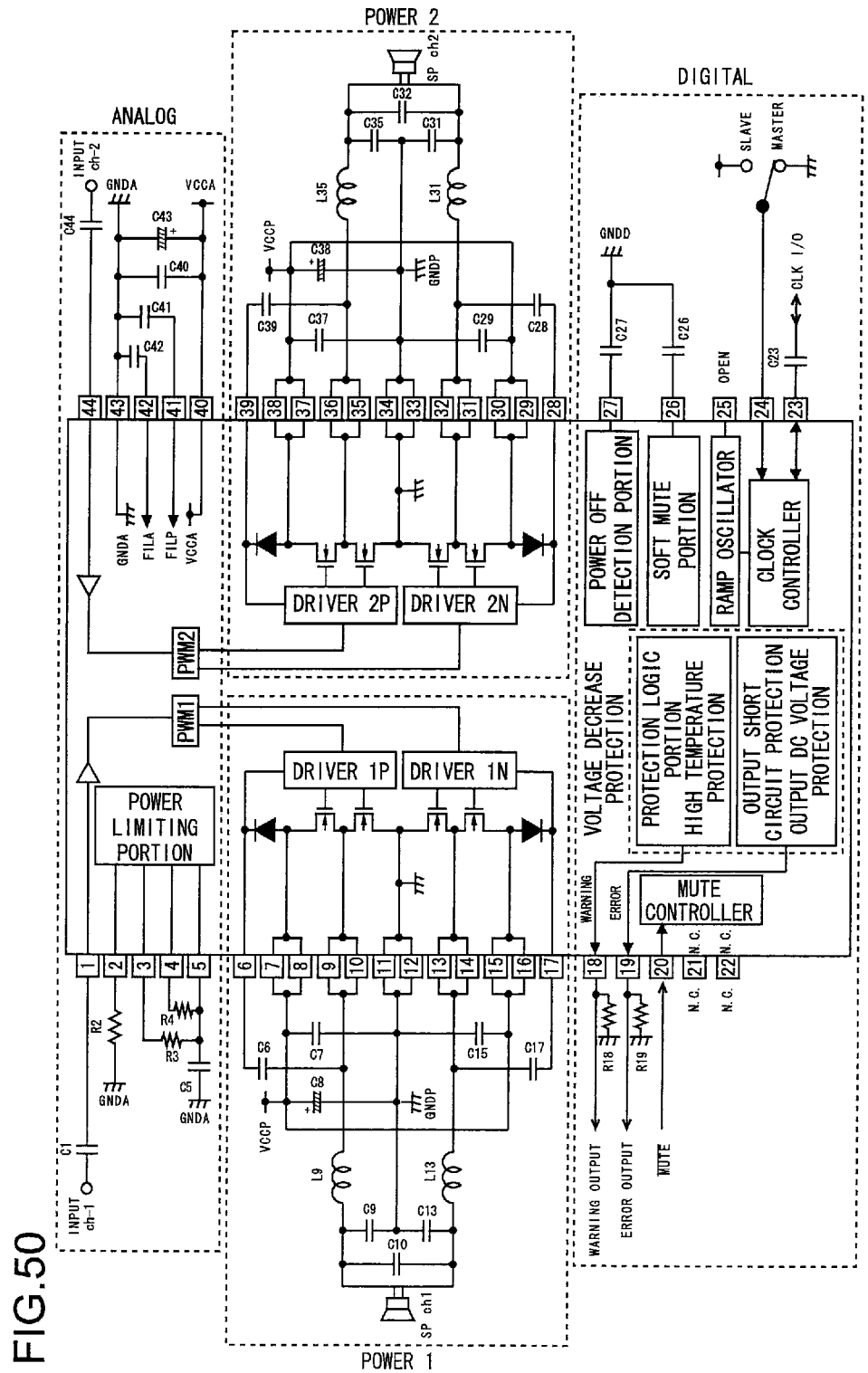
FIG. 50 is a block diagram showing classification of GND wirings.

FIG. 50 is a block diagram showing classification of the GND wirings.

As shown in FIG. 50, it is desirable to classify the GND wirings into a power signal system (Power 1 and Power 2), and an analog signal system (Analog), and a digital signal system (Digital).

In addition, as shown in FIG. 47 with above description, it is desirable that the heat dissipation area provided to the underside of the semiconductor device 10 should be connected to the ground at one point, and that the GND wirings of the power signal system, the analog signal system and the digital signal system should be connected to each other. In this case, it is desirable to arrange the layout of the GND wiring as wide as possible.

In addition, if it is possible to arrange the GND wiring on each side of the printed circuit board, it is desirable to arrange the GND wiring on each side of the printed circuit board and to connect the both sides of the printed circuit board with many via contacts so as to reduce impedance of the GND wiring. It should be noted that the impedance will be increased if the via contacts is not in sufficient quantity.

In addition, it is desirable to arrange a wide area of the GND pattern as the heat dissipation area in vacant spaces on the printed circuit board so that the heat dissipation capacity can be enhanced.

Note that it is desirable to use the GND pattern of the analog signal system as the GND pattern of the audio input terminal.

Next, the power supply wirings will be described in detail with reference to FIG. 51.

Figure 51:
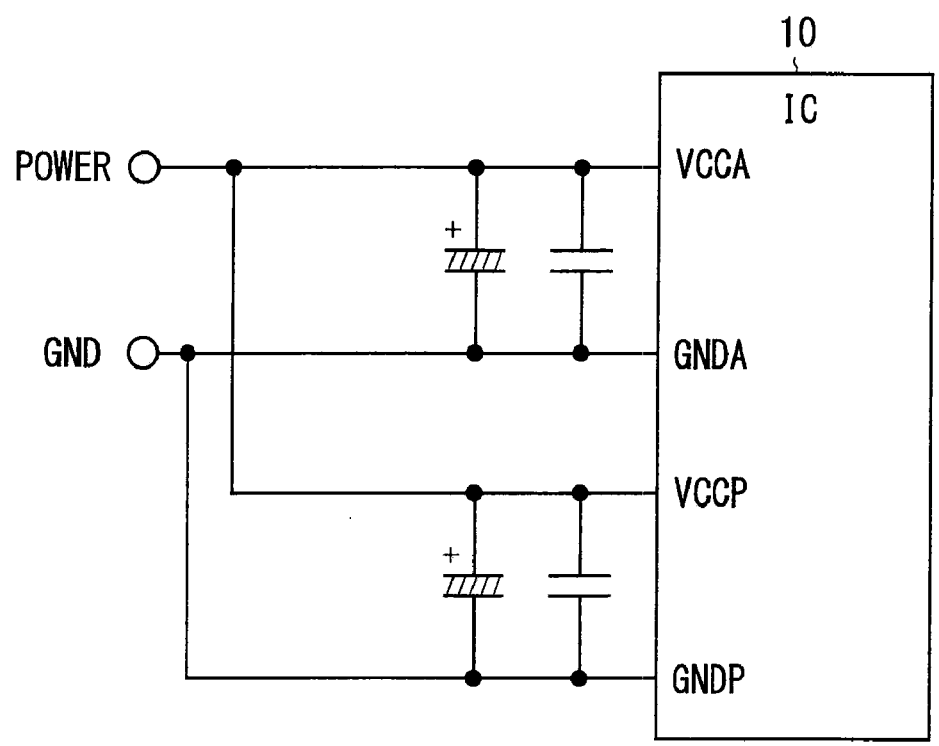
FIG. 51 is a circuit diagram showing an example of power supply wirings.

FIG. 51 is a circuit diagram showing an example of the power supply wirings.

It is desirable to classify the power supply wiring into the power signal system and the analog signal system as shown in FIG. 50 or 51.

Note that it is desirable to arrange the power supply wiring of the power signal system to be as thick as possible since a lot of current flows in it. In addition, if via contacts are used for multilayer interconnection, it is desirable to arrange many via contacts so as to reduce wiring impedance.

In addition, it is desirable to dispose the decoupling capacitor between the Vcc terminal and the GND terminal of the semiconductor device 10 as shown in FIG. 51.

Next, output wirings will be described in detail.

It is desirable to arrange the output wirings so that the layouts of the first and the second channels are symmetric as much as possible. In addition, it is desirable to dispose the output LC filter as close as possible to the output terminal of the semiconductor device 10 so that unwanted emission can be reduced. In addition, it is desirable that the capacitor Cg (see FIG. 19) should be connected to the power system GND of each channel.

In addition, it is desirable that the output wiring should be as thick as possible since a lot of current flows in it. In addition, if via contacts are used for multilayer interconnection, it is desirable to arrange many via contacts so as to reduce wiring impedance.

Next, typical characteristic data in the stereo operation (RL=8 ohms) are shown in FIGS. 52 to 65. Note that the semiconductor device 10 realizes the characteristics described below by optimizing slew rate and current capacity of the drivers $1c$, $1d$, $2c$ and $2d$.

Figure 52:
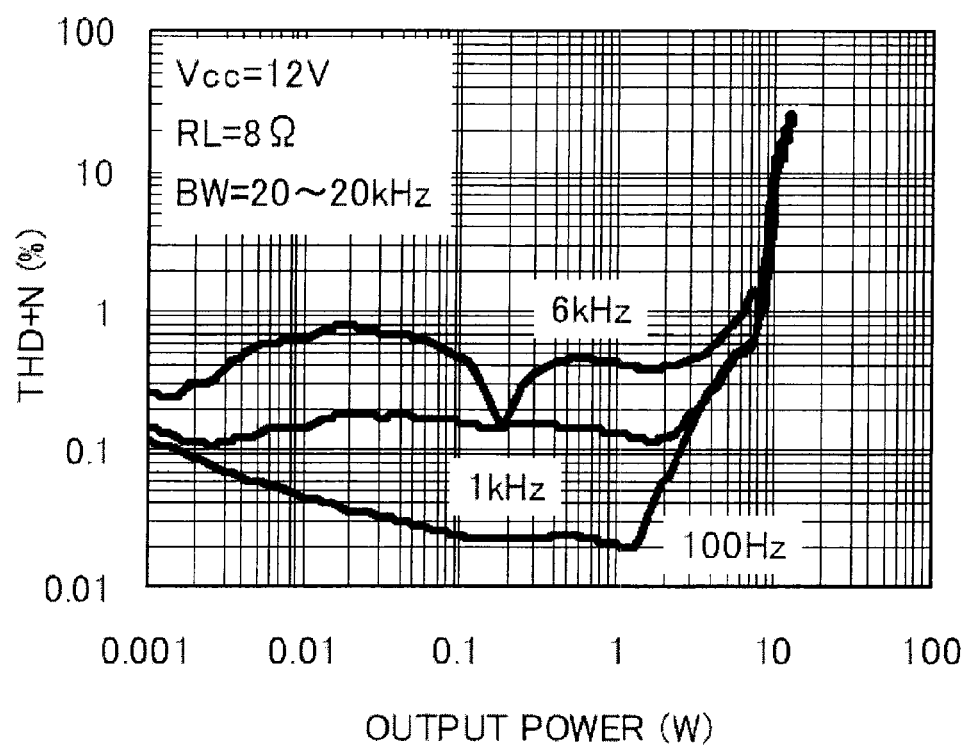
FIG. 52 is a correlation diagram showing a relationship between THD+N and an output power.

FIG. 52 is a correlation diagram showing a relationship between THD+N and the output power, in which the horizontal axis indicates the output power (watts) and the vertical axis indicates THD+N (%). Note that FIG. 52 shows the case where Vcc=12 volts, RL=8 ohms and BW=20 Hz to 20 kHz, and that 100 Hz, 1 kHz and 6 kHz are exemplified as the frequency.

Figure 53:
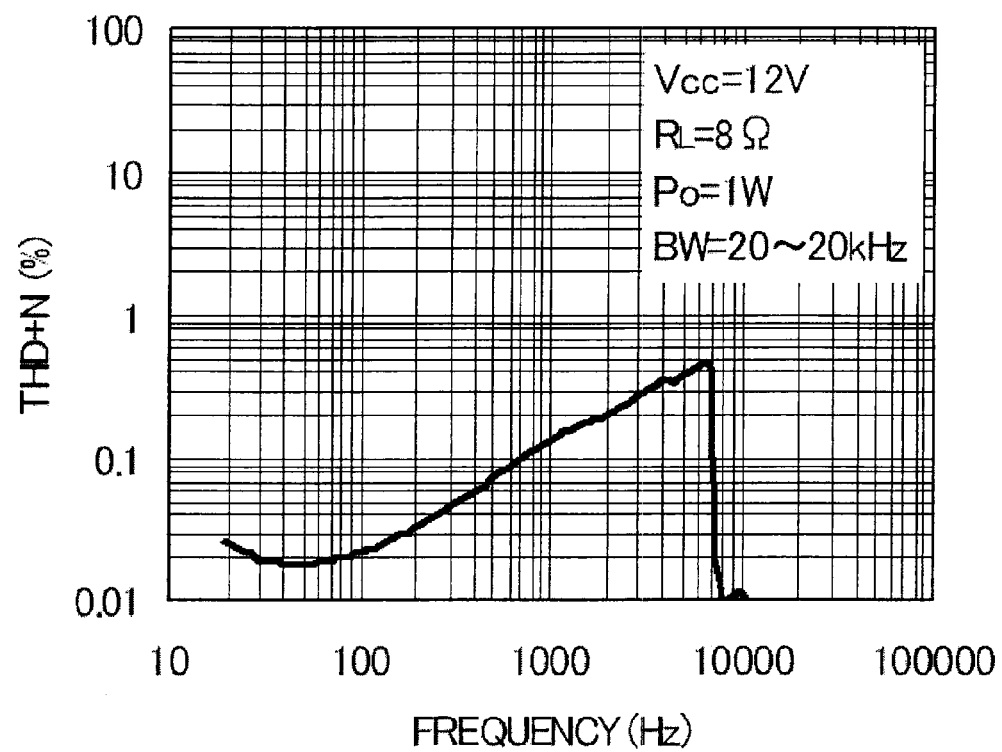
FIG. 53 is a correlation diagram showing a relationship between THD+N and a frequency.

FIG. 53 is a correlation diagram showing a relationship between THD+N and the frequency, in which the horizontal axis indicates frequency (Hz) and the vertical axis indicates THD+N (%). Note that FIG. 53 shows the case where Vcc=12 volts, RL=8 ohms, Po=1 watts and BW=20 Hz to 20 kHz.

Figure 54:
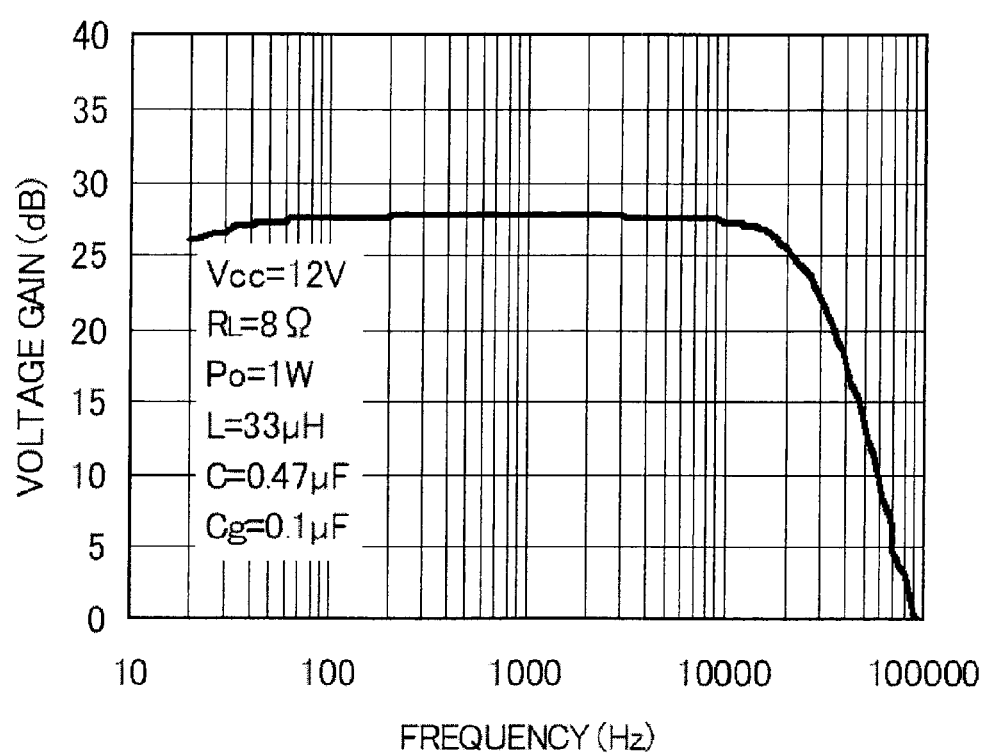
FIG. 54 is a correlation diagram showing a relationship between a voltage gain and a frequency.

FIG. 54 is a correlation diagram showing a relationship between a voltage gain and a frequency, in which the horizontal axis indicates frequency (Hz) and the vertical axis indicates the voltage gain (dB). Note that FIG. 54 shows the case where Vcc=12 volts, RL=8 ohms, Po=1 watts, L=33 microhenries, C=0.47 microfarads, and Cg=0.1 microfarads.

Figure 55:
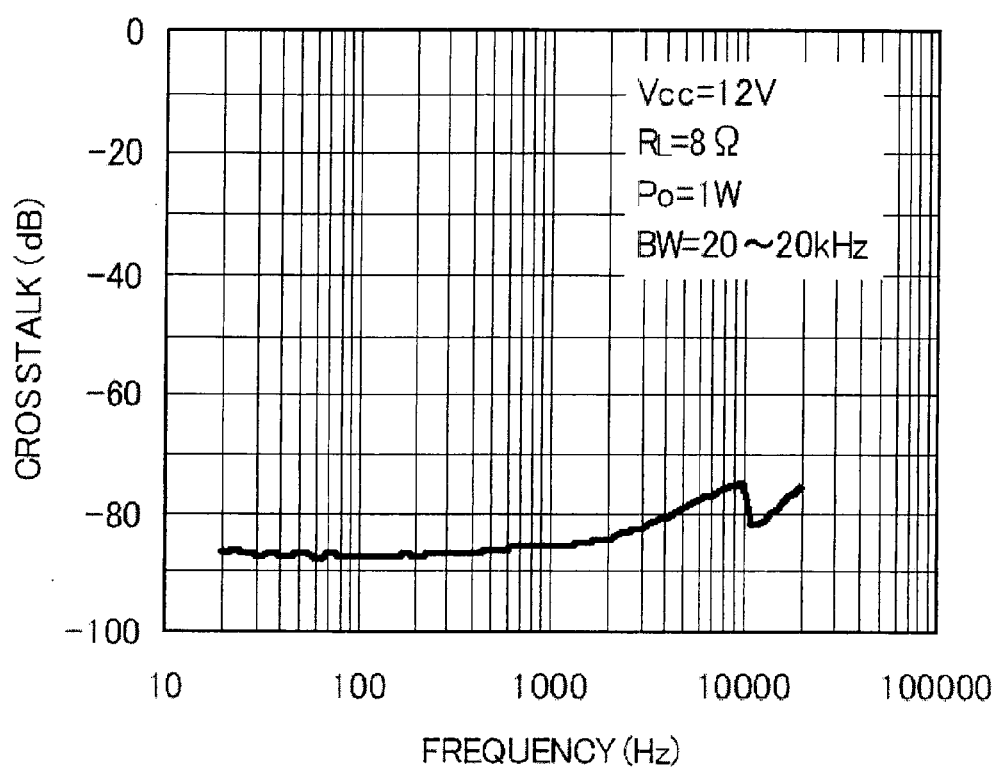
FIG. 55 is a correlation diagram showing a relationship between a cross talk and a frequency.

FIG. 55 is a correlation diagram showing a relationship between a cross talk and a frequency, in which the horizontal axis indicates the frequency (Hz) and the vertical axis indicates the cross talk (dB). Note that FIG. 55 shows the case where Vcc=12 volts, RL=8 ohms, Po=1 watts and BW=20 Hz to 20 kHz.

Figure 56:
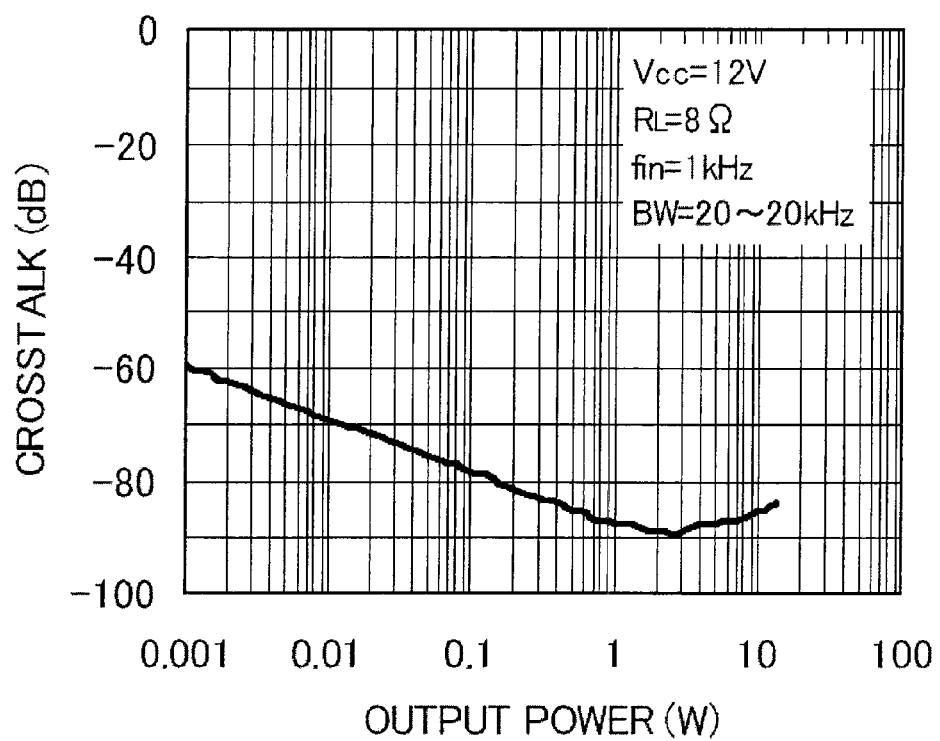
FIG. 56 is a correlation diagram showing a relationship between the cross talk and the output power.

FIG. 56 is a correlation diagram showing a relationship between the cross talk and the output power, in which the horizontal axis indicates the output power (watts) and the vertical axis indicates the cross talk (dB). Note that FIG. 56 shows the case where Vcc=12 volts, RL=8 ohms, fin=1 kHz and BW=20 Hz to 20 kHz.

Figure 57:
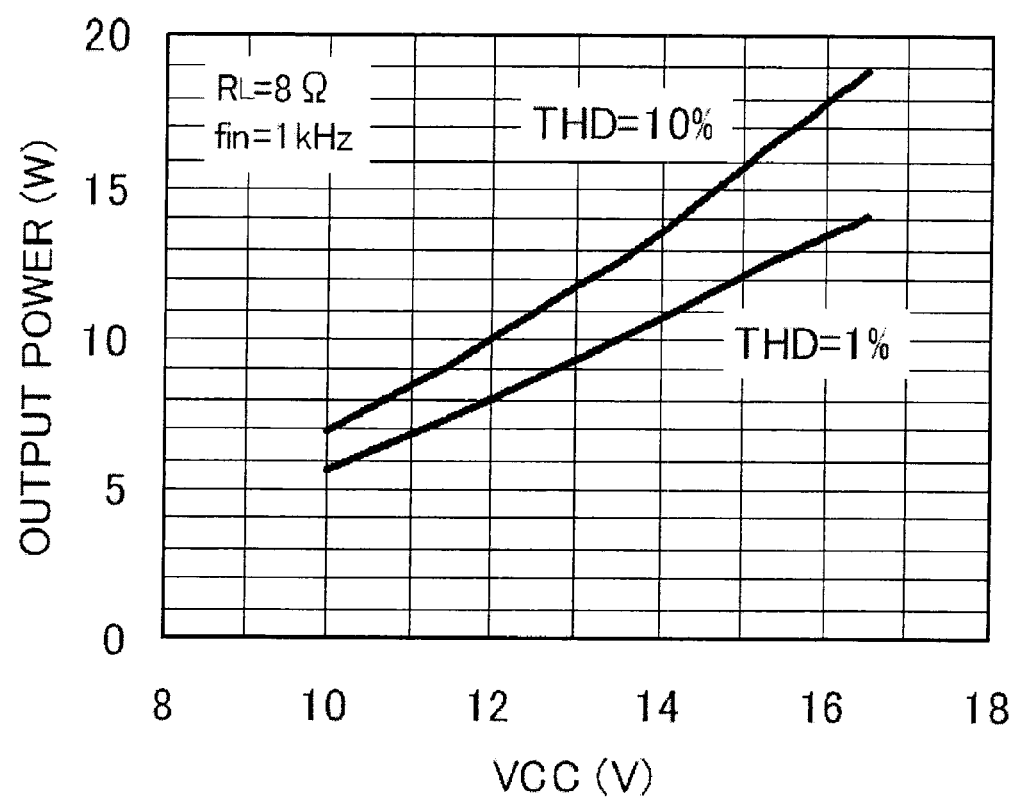
FIG. 57 is a correlation diagram showing a relationship between the output power and the power supply voltage.

FIG. 57 is a correlation diagram showing a relationship between the output power and the power supply voltage, in which the horizontal axis indicates the power supply voltage (volts) and the vertical axis indicates the output power (watts). Note that FIG. 57 shows the case where RL=8 ohms and fin=1 kHz, and that 1% and 10% are exemplified as THD.

Figure 58:
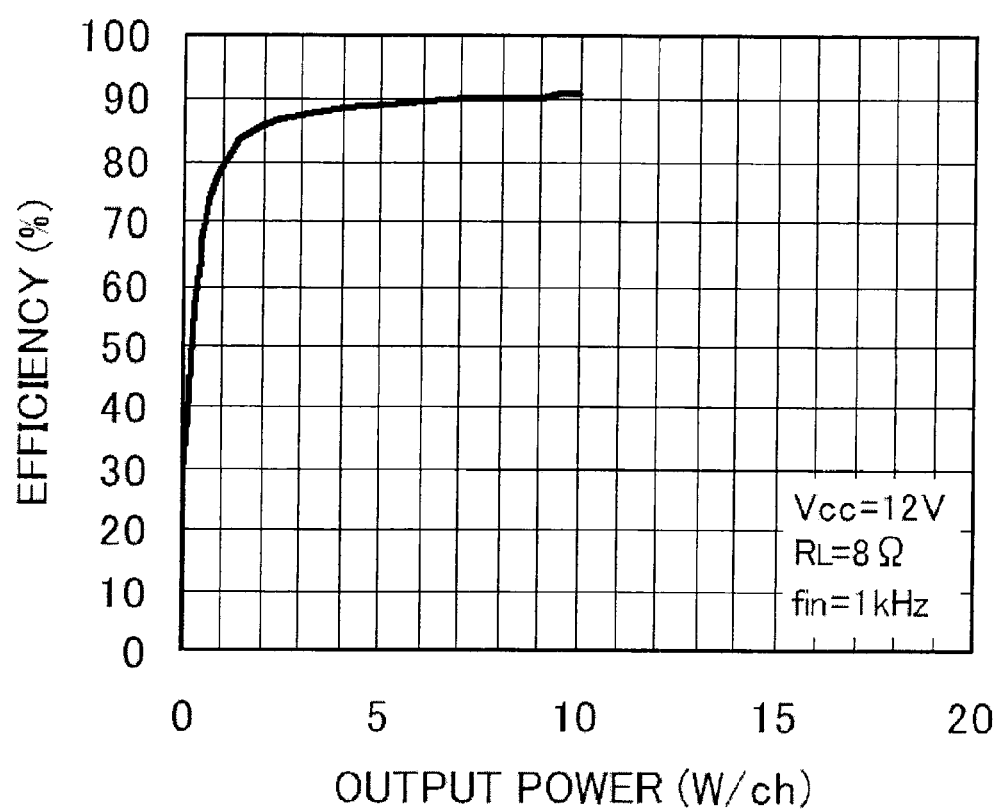
FIG. 58 is a correlation diagram showing a relationship between the efficiency and the output power.

FIG. 58 is a correlation diagram showing a relationship between the efficiency and the output power, in which the horizontal axis indicates the output power (watts per channel) and the vertical axis indicates the efficiency (%). Note that FIG. 58 shows the case where Vcc=12 volts, RL=8 ohms and fin=1 kHz.

Figure 59:
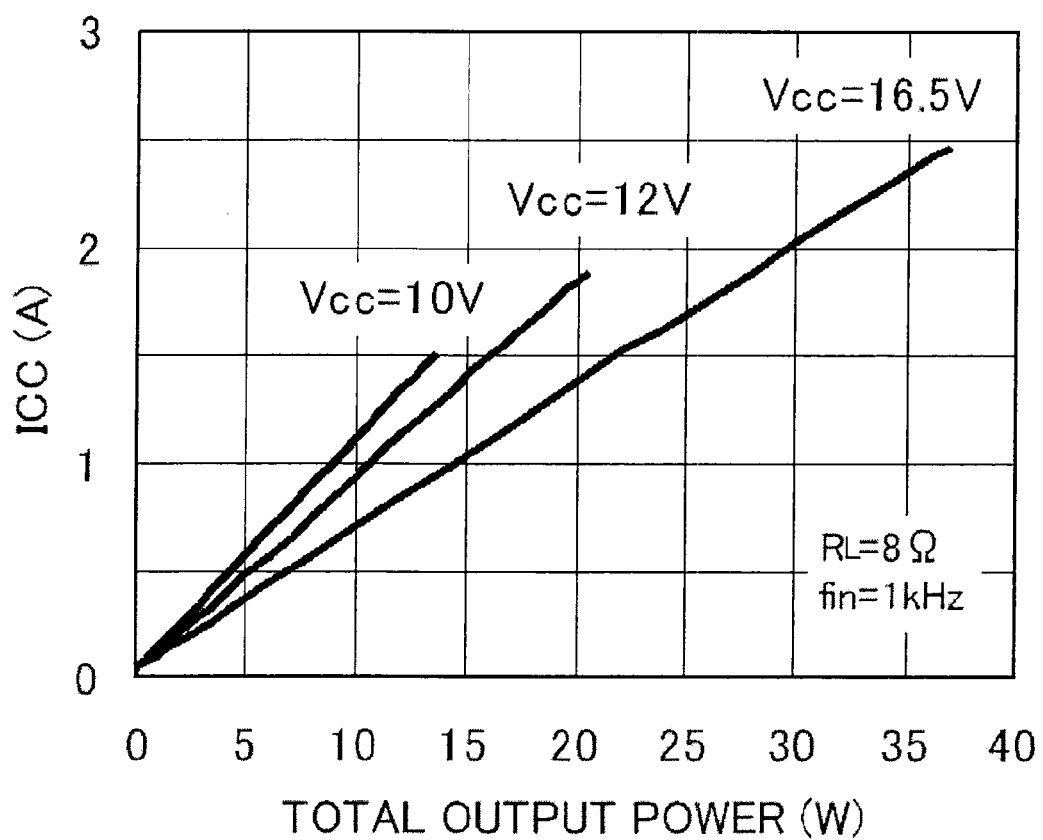
FIG. 59 is a correlation diagram showing a relationship between a current consumption and the output power.

FIG. 59 is a correlation diagram showing a relationship between a current consumption and the output power, in which the horizontal axis indicates a total output power (watts) and the vertical axis indicates the current consumption (amperes). Note that FIG. 59 shows the case where RL=8 ohms and fin=1 kHz, and that 10 volts, 12 volts and 16.5 volts are exemplified as the power supply voltage Vcc.

Figure 60:
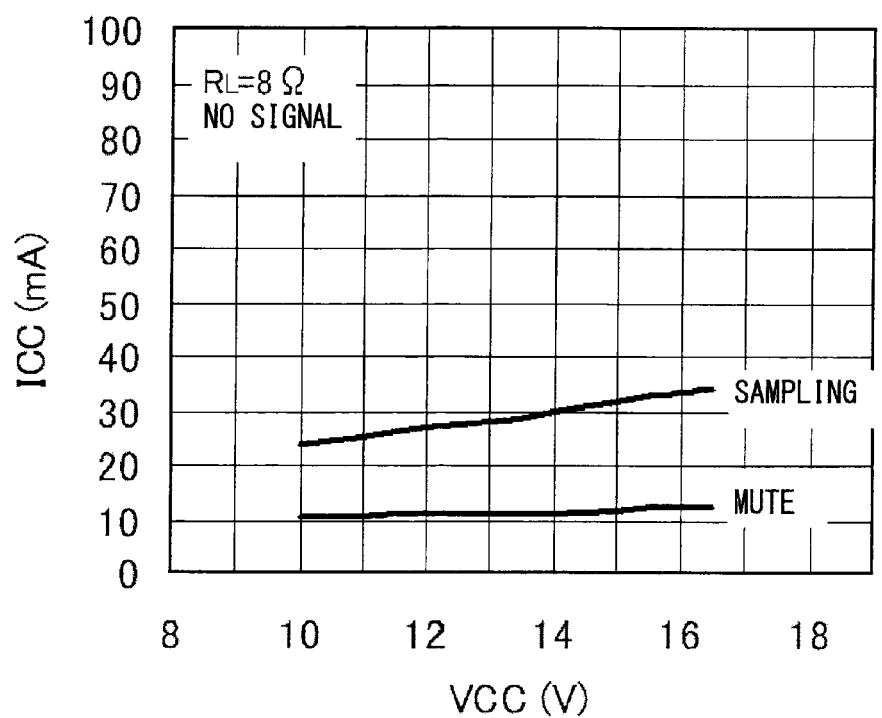
FIG. 60 is a correlation diagram showing a relationship between the current consumption and the power supply voltage.

FIG. 60 is a correlation diagram showing a relationship between the current consumption and the power supply voltage, in which the horizontal axis indicates the power supply voltage (volts) and the vertical axis indicates the current consumption (amperes). Note that FIG. 60 shows the case where RL=8 ohms, with no signal, in the sampling operation and in the mute operation, respectively.

Figure 61:
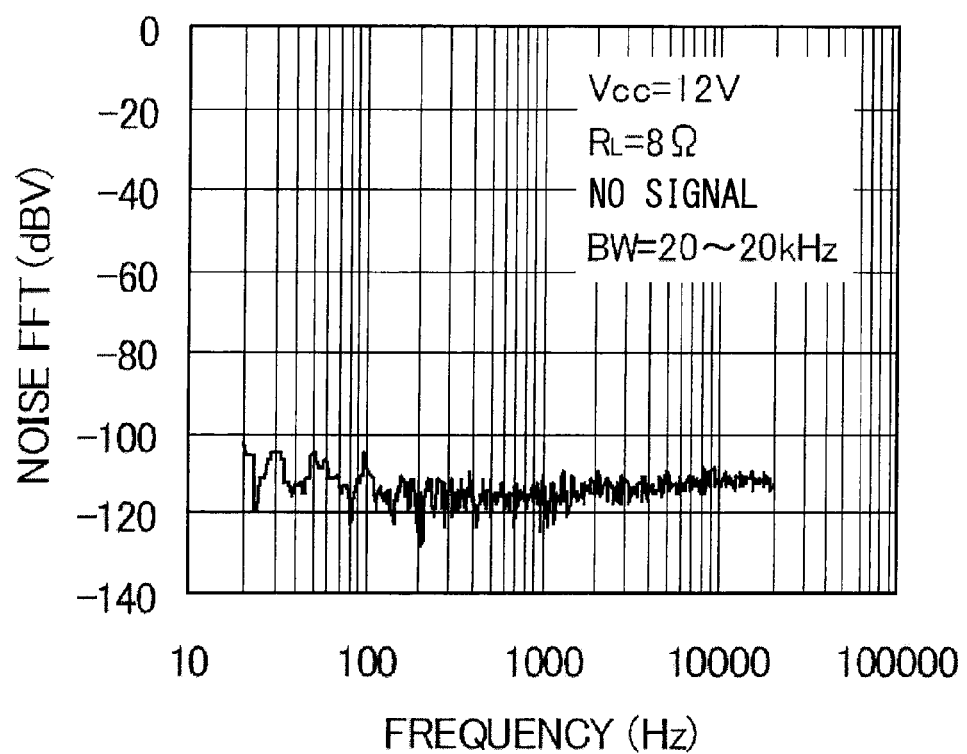
FIG. 61 is a correlation diagram showing a relationship between an output noise voltage FFT and the frequency.

FIG. 61 is a correlation diagram showing a relationship between an output noise voltage FFT and the frequency, in which the horizontal axis indicates the frequency (Hz) and the vertical axis indicates the output noise voltage (dBV). Note that FIG. 61 shows the case where Vcc=12 volts, RL=8 ohms, with no signal and BW=20 Hz to 20 kHz.

Figure 62:
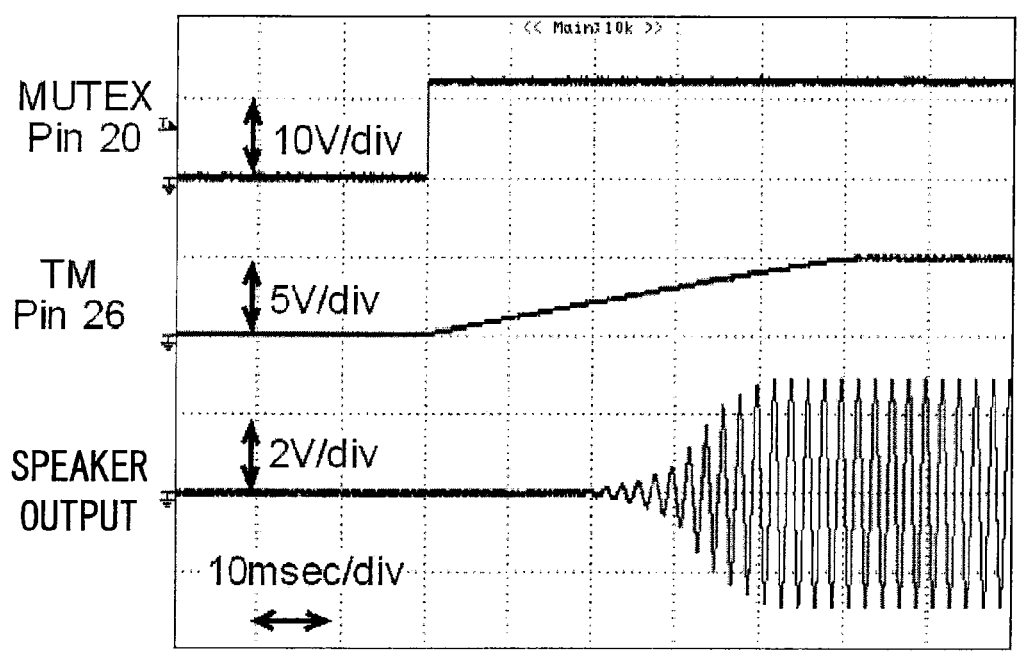
FIG. 62 is a timing chart showing waveforms when the soft mute is canceled.

FIG. 62 is a timing chart showing waveforms when the soft mute is canceled, in which a MUTEX terminal voltage, a TM terminal voltage and the speaker output are shown in this order from the upper side. Note that FIG. 62 shows the case where Vcc=12 volts, RL=8 ohms, Po=500 mW and fin=500 Hz.

Figure 63:
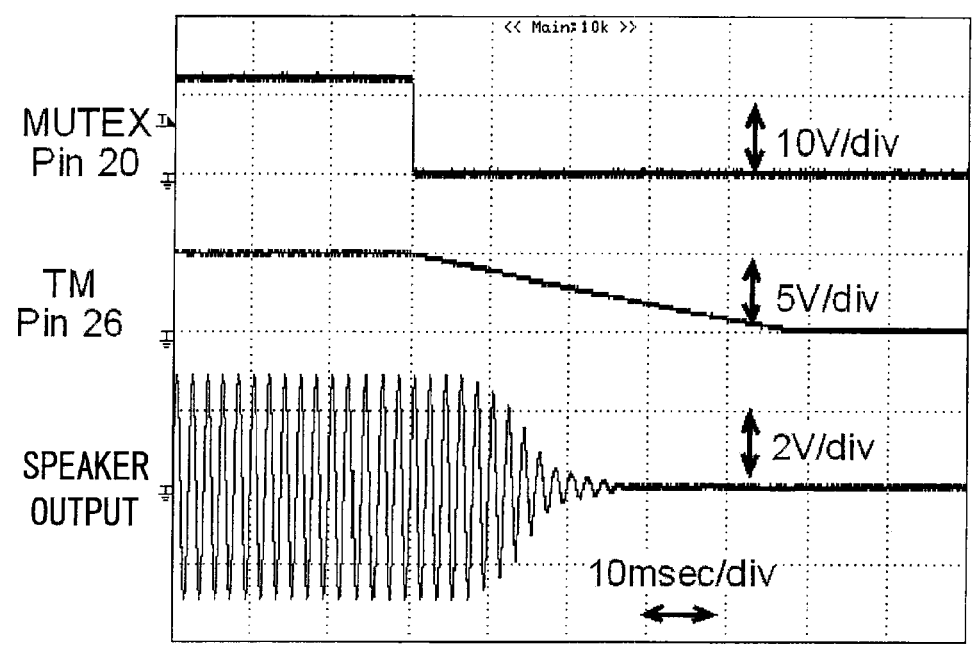
FIG. 63 is a timing chart showing waveforms when the soft mute is activated.

FIG. 63 is a timing chart showing waveforms when the soft mute is activated, in which the MUTEX terminal voltage, the TM terminal voltage and the speaker output are shown in this order from the upper side. Note that FIG. 63 shows the case where Vcc=12 volts, RL=8 ohms, Po=500 mW and fin=500 Hz.

Figure 64:
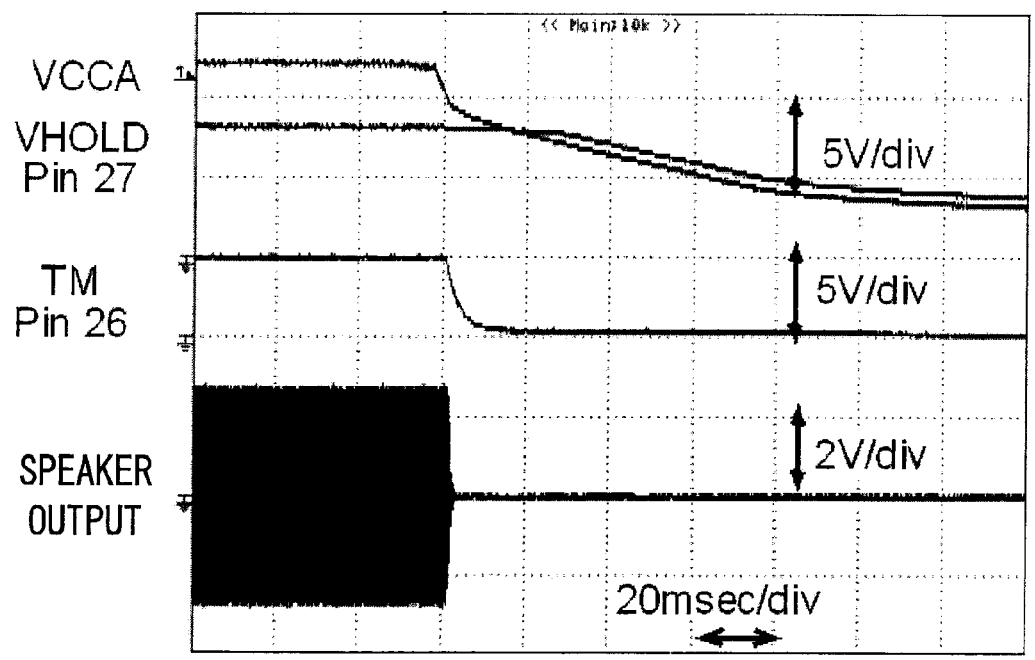
FIG. 64 is a timing chart showing waveforms when the power supply is cut off.

FIG. 64 is a timing chart showing waveforms when the power supply is cut off (20 milliseconds per division), in which a VCCA terminal voltage, the VHOLD terminal voltage, the TM terminal voltage and the speaker output are shown in this order from the upper side. Note that FIG. 64 shows the case where Vcc=12 volts, RL=8 ohms, Po=500 mW and fin=3 kHz.

Figure 65:
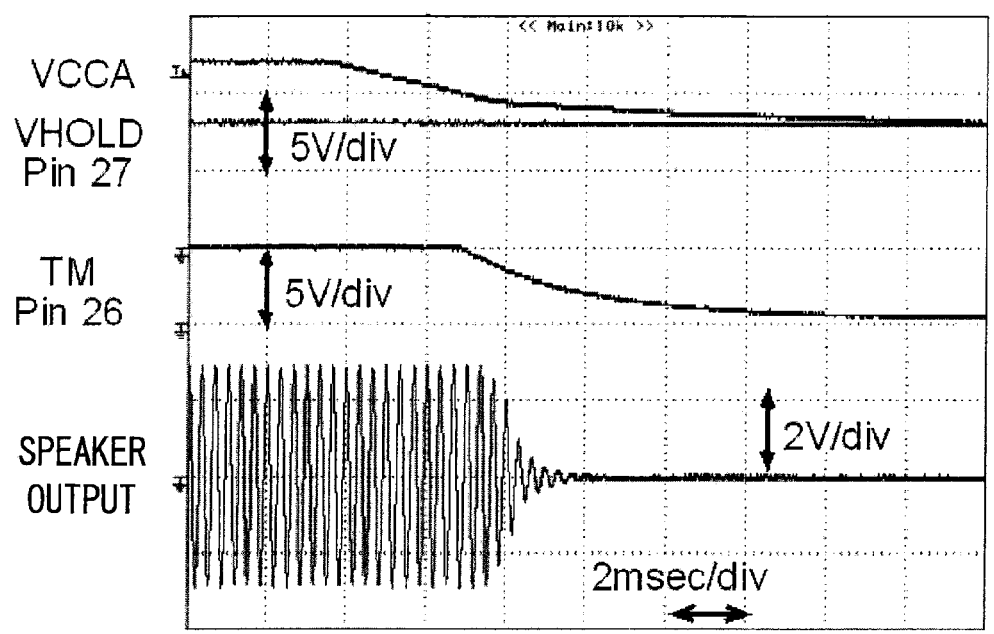
FIG. 65 is a timing chart showing waveforms when the power supply is cut off.

FIG. 65 is a timing chart showing waveforms when the power supply is cut off (2 milliseconds per division), in which the VCCA terminal voltage, the VHOLD terminal voltage, the TM terminal voltage and the speaker output are shown in this order from the upper side. Note that FIG. 65 shows the case where Vcc=12 volts, RL=8 ohms, Po=500 mW and fin=3 kHz.

Next, the cooperation action of the power supply interruption detection function and the soft mute function will be described in detail.

Figure 66:
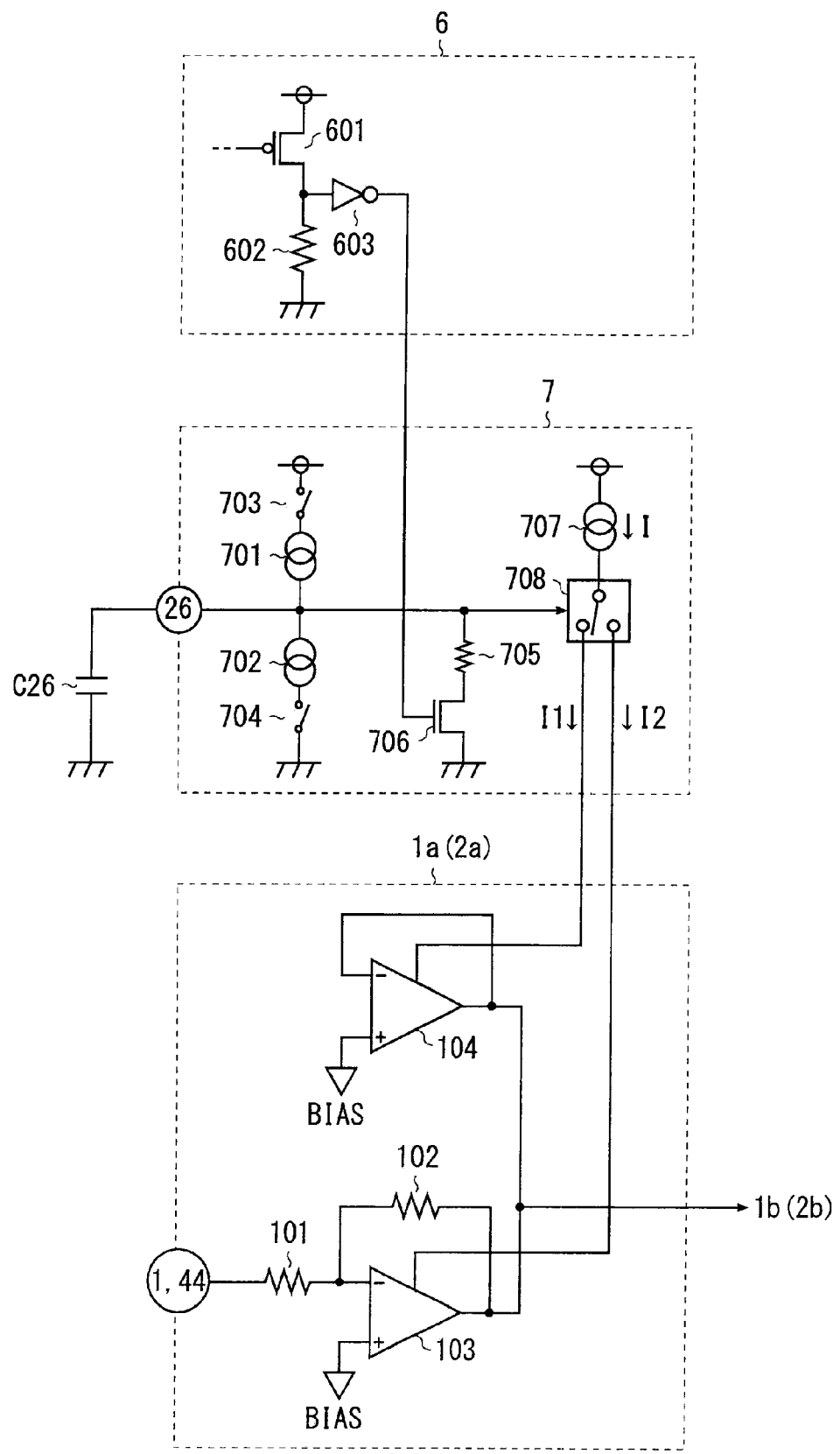
FIG. 66 is a circuit diagram showing a structural example of a power off detection portion 6, the soft mute portion 7 and an input amplifying circuit 1a (or 2a).

FIG. 66 is a circuit diagram showing a structural example of the power off detection portion 6, the soft mute portion 7 and the input amplifying circuit 1*a* (or 2*a*).

The output stage of the power off detection portion 6 includes a P-channel type MOS field effect transistor 601, a resistor 602 and an inverter 603.

The source of the transistor 601 is connected to the power supply terminal. The drain of the transistor 601 is connected to the ground terminal via the resistor 602 and is connected to the input terminal of the inverter 603. Note that the previous stage of the power off detection portion 6 is as shown in FIG. 33, and its overlapping description will be omitted.

In the power off detection portion 6 having the structure described above, an output logical level of the inverter 603 becomes the low level in the normal operation and the high level when the power supply interruption is detected.

The soft mute portion 7 includes constant current sources 701 and 702, switches 703 and 704, a resistor 705, an N-channel MOS field effect transistor 706, a constant current source 707 and a selector 708.

A terminal of the constant current source 701 is connected to the power supply terminal via the switch 703. The other terminal of the constant current source 701 is connected to the TM terminal (pin 26). A terminal of the constant current source 702 is connected to the TM terminal. The other terminal of the constant current source 702 is connected to the ground terminal via the switch 704. The drain of the transistor 706 is connected to the TM terminal via the resistor 705. The source of the transistor 706 is connected to the ground terminal. The gate of the transistor 706 is connected to the output terminal of the inverter 603. A terminal of the constant current source 707 is connected to the power supply terminal. The other terminal of the constant current source 707 (the output terminal of constant current I) is connected to the common terminal of the selector 708. The control terminal of the selector 708 is connected to the TM terminal.

In the soft mute portion 7 having the structure described above, the constant current source 707 and the selector 708 work as a drive current supplying portion for increasing or decreasing the drive currents I1 and I2 complementarily in accordance with the terminal voltage of the TM terminal (pin 26).

The input amplifying circuit 1*a* (or 2*a*) includes resistors 101 and 102, and operational amplifiers 103 and 104.

The inverting input terminal (−) of the operational amplifier 103 is connected to the IN1 terminal (or the IN2 terminal) via the resistor 101 and is connected to the output terminal of the input amplifying circuit 1*a* (or 2*a*) via the resistor 102. The non-inverting input terminal (+) of the operational amplifier 103 is connected to the application terminal of the bias voltage BIAS. The inverting input terminal (−) of the operational amplifier 104 is connected to the output terminal of the input amplifying circuit 1*a* (or 2*a*). The non-inverting input terminal (+) of the operational amplifier 104 is connected to the application terminal of the bias voltage BIAS. The output terminal of the operational amplifier 103 and the output terminal of the operational amplifier 104 are connected to each other, and their connection node is connected to the output terminal of the input amplifying circuit 1*a* (or 2*a*). The first selection terminal of the selector 708 (the output terminal of the first drive current I1) is connected to the drive current input terminal of the operational amplifier 104. The second selection terminal of the selector 708 (the output terminal of the second drive current I2) is connected to the drive current input terminal of the operational amplifier 103.

In the input amplifying circuit 1*a* (or 2*a*) having the structure described above, the resistors 101 and 102 and the operational amplifier 103 work as an inverting amplifier stage for inverting and amplifying the input signal so as to output the result, and the operational amplifier 104 works as a buffer stage for delivering the bias voltage BIAS.

Figure 67:
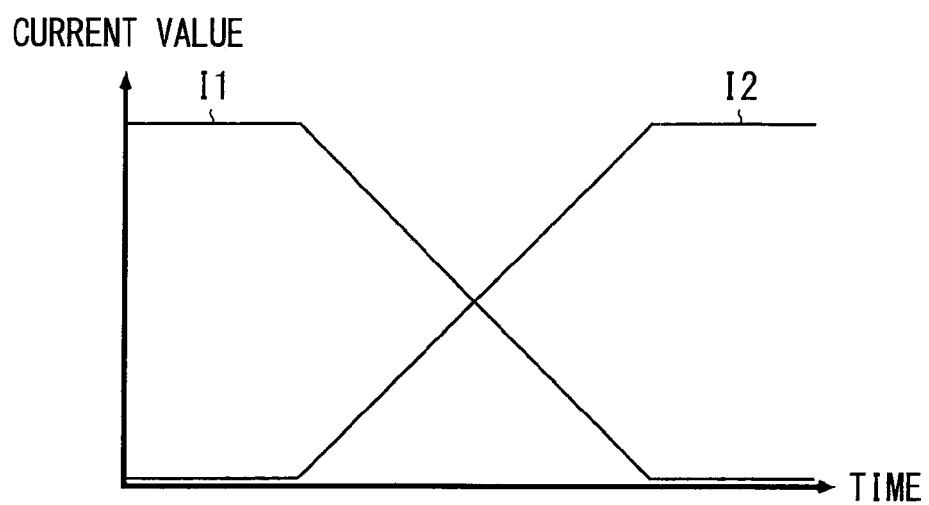
FIG. 67 is a diagram showing a correlation relationship between drive currents I1 and I2.

FIG. 67 is a diagram showing a correlation relationship between the drive currents I1 and I2.

A more specific description will be provided with reference to FIG. 67. When the terminal voltage of the TM terminal is the low level, the selector 708 distributes the constant current I generated by the constant current source 707 so that the first drive current I1 becomes the constant current I while the second drive current I2 becomes zero. In this case, the input amplifying circuit 1*a* (or 2*a*) becomes the state where only the buffer stage is driven, i.e., the state where the audio-mute is performed.

When the above-mentioned audio mute is canceled after the power supply is activated, the switch 703 is turned on while the switch 704 is turned off. Thus, charging of the capacitor C26 is started so that the terminal voltage of the TM terminal increases gradually. The selector 708 increases or decreases the first drive current I1 and the second drive current I2 in accordance with the rising terminal voltage while the relationship of "I1+I2=I" is maintained. In other words, as to the input amplifying circuit 1*a* (or 2*a*), the driving of the buffer stage is lessened gradually while the driving of the inverting amplifier stage is enhanced gradually. As a result, the audio mute is gradually canceled.

After that, when the terminal voltage of the TM terminal becomes the high level, the selector 708 distributes the constant current I generated by the constant current source 707 so that the first drive current I1 becomes zero while the second drive current I2 becomes the constant current I. Therefore, the input amplifying circuit 1a (or 2a) becomes the state where only the inverting amplifier stage is driven, i.e., the state where the audio mute is canceled.

On the other hand, when the audio mute is turned on before the power supply is turned off, the switch 703 is turned on while the switch 704 is turned on. Thus, the discharge of the capacitor C26 is started so that the terminal voltage of the TM terminal starts to drop gradually. The selector 708 increases or decreases the first drive current I1 and the second drive current I2 in accordance with the falling terminal voltage while the relationship of "I1+I2=I" is maintained. In other words, as to the input amplifying circuit 1a (or 2a), the driving of the buffer stage is enhanced gradually while the driving of the inverting amplifier stage is lessened gradually. As a result, the audio mute is gradually turned on.

In addition, if a power supply interruption is detected in the state where the power is supplied (I1=0, I2=I), the output signal of the power off detection portion 6 becomes the high level so that the transistor 706 is turned on. As a result, regardless of the on/off states of the switches 703 and 704, the capacitor C26 is discharged by the path via the resistor 705 so that the terminal voltage of the TM terminal is dropped gradually. The selector 708 increases or decreases the first drive current I1 and the second drive current I2 in accordance with the rising terminal voltage while the relationship of "I1+I2=I" is maintained. In other words, as to the input amplifying circuit 1a (or 2a), the driving of the inverting amplifier stage is lessened gradually while the driving of the buffer stage is enhanced gradually.

Note that time necessary for performing the discharge process when the power supply interruption is detected (the soft mute switching time Tsw) is set to a value of approximately one tenth of time necessary for normal discharge process using the constant current source 702.

Since the audio signal can be soft-muted before the power supply voltage drops completely by the cooperation action of the power supply interruption detection function and the soft mute function as described above, pop noise can be reduced substantially.

Next, the short circuit detection function of the push-pull output circuit will be described in detail.

Figure 68:
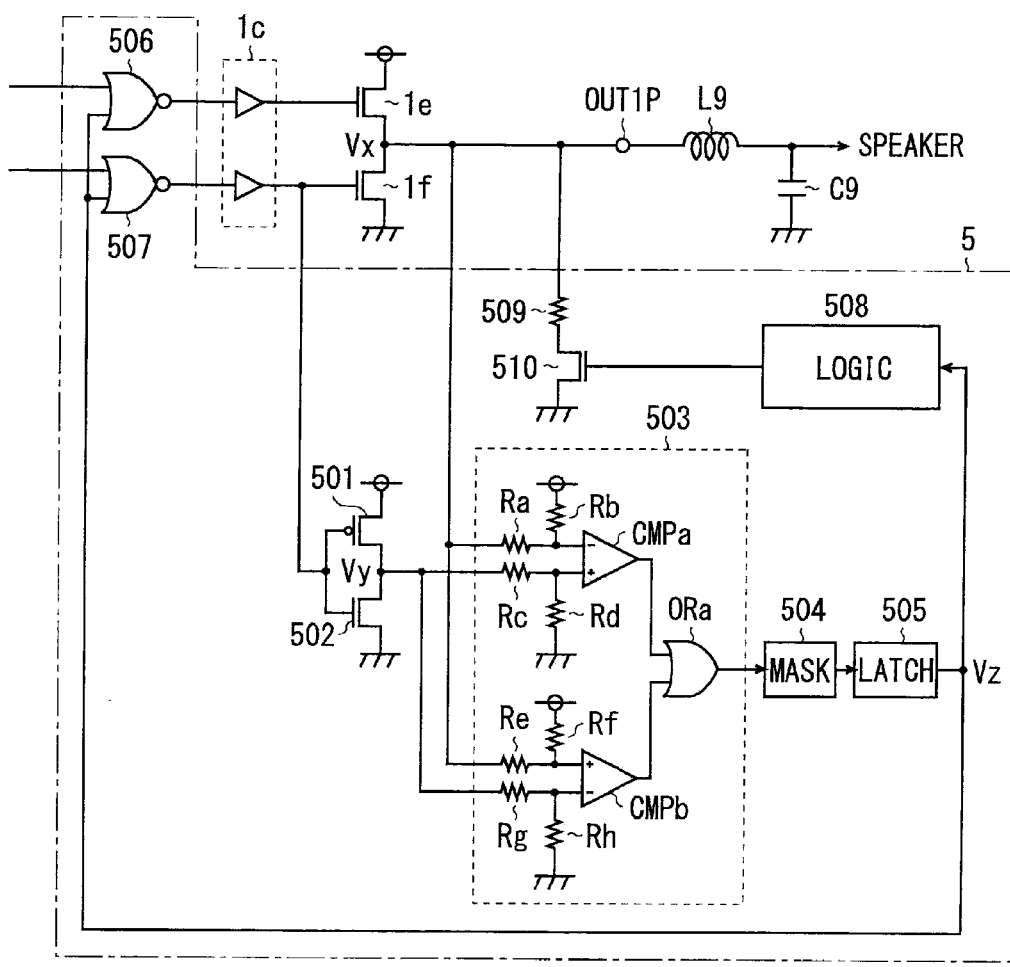
FIG. 68 is a circuit diagram showing a structural example of a protection logic portion 5.

FIG. 68 is a circuit diagram showing a structural example of a protection logic portion 5 (a short circuit detection circuit portion).

The protection logic portion 5 is a unit for monitoring an output short circuit (a short-to-power fault and a ground fault) of the normal phase push-pull output circuit (transistors 1e and 1f) of the class D power amplifier 1, and it includes a P-channel type MOS field effect transistor 501, an N-channel MOS field effect transistor 502, a phase comparing circuit 503, a mask circuit 504, a latch circuit 505, a NOR circuits 506 and 507, a logic circuit 508, a resistor 509 and an N-channel MOS field effect transistor 510.

The source of the transistor 501 is connected to the power supply terminal. The drain of the transistor 501 is connected to the drain of the transistor 502. The source of the transistor 502 is connected to the ground terminal. The gates of the transistors 501 and 502 are both connected to the gate of the transistor 1f. In other words, the transistors 501 and 502 form a dummy push-pull output circuit that is controlled in synchronization with the push-pull output circuit to be monitored.

The phase comparing circuit 503 is a unit for performing phase comparison (voltage comparison) between an output voltage Vx of the OUT1P terminal (pin 9 or 10) and an output voltage Vy of the dummy push-pull output circuit, and it includes resistors Ra to Rh, comparators CMPa and CMPb and an OR circuit ORa.

The inverting input terminal (−) of the comparator CMPa is connected to the OUT1P terminal (application terminal of the output voltage Vx) via a resistor Ra and is connected to the power supply terminal via a resistor Rb. The non-inverting input terminal (+) of the comparator CMPa is connected to the output terminal of the dummy push-pull output circuit (application terminal of the output voltage Vy) via a resistor Rc and is connected to the ground terminal via a resistor Rd.

The non-inverting input terminal (+) of the comparator CMPb is connected to the OUT1P terminal (application terminal of the output voltage Vx) via the resistor Re and is connected to the power supply terminal via the resistor Rf. The inverting input terminal (−) of the comparator CMPb is connected to the output terminal of the dummy push-pull output circuit (application terminal of the output voltage Vy) via a resistor Rg and is connected to the ground terminal via the resistor Rh.

The resistance values of the resistors Ra to Rd are adjusted so that the inverting input terminal (−) of the comparator CMPa becomes higher potential than the non-inverting input terminal (+) of the same when the ground fault of the OUT1P terminal is not generated. In addition, the resistance values of the resistors Re to Rh are adjusted so that the inverting input terminal (−) of the comparator CMPb becomes higher potential than the non-inverting input terminal (+) of the same when the short-to-power fault of the OUT1P terminal is not generated.

The first input terminal of the OR circuit ORa is connected to the output terminal of the comparator CMPa. The second input terminal of the OR circuit ORa is connected to the output terminal of the comparator CMPb. Therefore, the output logical level of the OR circuit ORa becomes the high level if the comparators CMPa or the CMPb becomes the high level while it becomes the low level only in the case where both of them are the low level.

The mask circuit 504 is a unit for setting the its output logical level to the high level only in the case where the output logical level of the OR circuit ORa maintains the high level during a predetermined mask period, and it can a time constant circuit including a resistor and a capacitor, for instance. When such the mask circuit 504 is inserted, the output voltages Vx and Vy will not be misdetected to be the output short circuit even if the phases thereof are varied a little, so that a stable output operation can be realized.

The latch circuit 505 is a unit for latching the output signal of the mask circuit 504 so as to output the same as a latch signal Vz. Furthermore, if the power supply of the semiconductor device 10 is turned on again after the output short circuit of the OUT1P terminal is detected and the latch signal Vz is latched to be the high level, or if reset of the semiconductor device 10 is done by using the MUTEX terminal, the latch signal Vz becomes the low level again.

The OR circuits 506 and 507 are units for performing NOR operation of the PWM signal supplied from the PWM modulating circuit 1b (not shown) and the latch signal Vz supplied from the latch circuit 505 and for supplying a result of the operation to the driver circuit 1c. Therefore, if the latch signal Vz is the low level, the PWM signal is inverted and delivered to the driver circuit 1c, so that the transistors 1e and 1f are switched in accordance with the PWM signal. On the contrary, if the latch signal Vz is the high level, the input signal of the driver circuit 1c is maintained to be the low level regardless of the PWM signal, so that both the transistors 1e and 1f are turned off.

The logic circuit 508 is a unit for controlling on and off of the transistor 510 in accordance with the latch signal Vz. More specifically, the transistor 510 is turned on when the latch signal Vz is the high level while the transistor 510 if turned off when the latch signal Vz is the low level.

The drain of the transistor 510 is connected to the OUT1P terminal via the resistor 509. On the other hand, the source of the transistor 510 is connected to the ground terminal. Therefore, if the latch signal Vz becomes the high level, the OUT1P terminal is connected to the ground via the resistor 509 and the transistor 510.

Although FIG. 68 exemplifies only the case of the short circuit detection circuit that monitors the normal phase push-pull output circuit of the first channel (the transistors 1e and 1f), the protection logic portion 5 also performs the short circuit detection of other push-pull output circuits by using the short circuit detection circuit having the structure similar to the above-mentioned structure.

Next, the short circuit detection operation of the protection logic portion 5 having the structure described above will be described in detail with reference to FIGS. 69A and 69B.

Figure 69A:
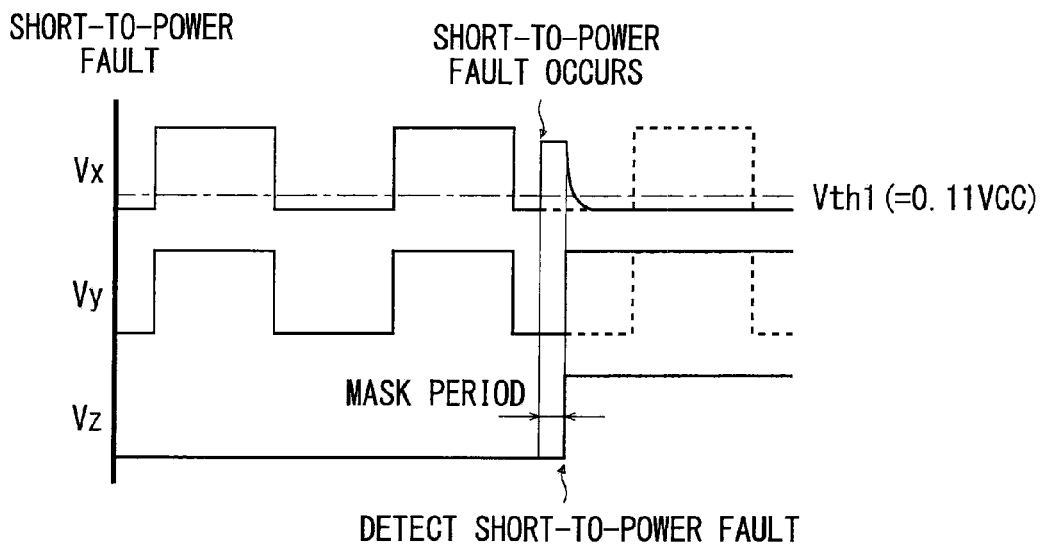
FIGS. 69A and 69B are timing charts for explaining a short circuit detection operation.
Figure 69B:
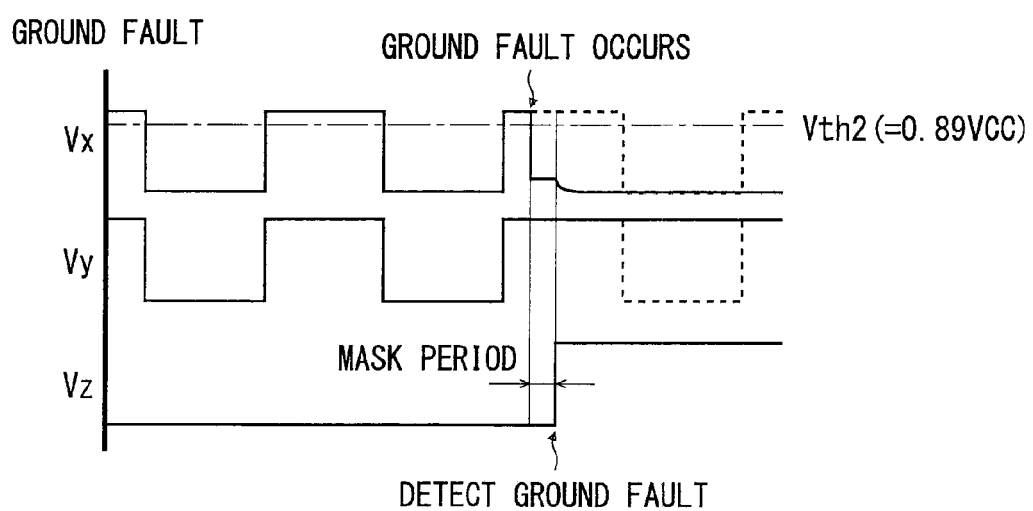

FIGS. 69A and 69B are timing charts for explaining a short circuit detection operation, in which the voltages Vx, Vy and Vz are shown from the upper side of each chart. Furthermore, FIG. 69A shows a behavior upon the short-to-power fault while FIG. 69B shows a behavior upon the ground fault.

First, the short-to-power fault detection operation will be described with reference to FIG. 69A.

If the short-to-power fault of the OUT1P terminal is not generated, there is no phase difference (voltage difference) between the output voltages Vx and Vy. Therefore, each of the comparators CMPa and CMPb outputs the low level. Therefore, the output logical level of the OR circuit ORa becomes the low level, so that the latch signal Vz is maintained to be the low level.

On the contrary, if the short-to-power fault of the OUT1P terminal occurs, the low level of the output voltage Vx increases together with the power supply voltage Vcc, but the low level of the output voltage Vy becomes approximately 0 volt. On this occasion, if the low level of the output voltage Vx is a threshold voltage value Vth1 (i.e., 0.11Vcc volts) or higher, the output logical level of the comparator CMPb becomes the high level so that the output logical level of the OR circuit ORa becomes the high level. If such the situation continues during a predetermined mask period, the latch signal Vz becomes the high level so that the speaker output is unlatched.

Next, the ground fault detection operation will be described with reference to FIG. 69B.

If the ground fault of the OUT1P terminal is not generated, there is no phase difference (voltage difference) between the output voltages Vx and Vy. Therefore, each of the comparators CMPa and CMPb outputs the low level. Thus, the output logical level of the OR circuit ORa becomes the low level, and the latch signal Vz is maintained to be the low level.

On the contrary, if the ground fault of the OUT1P terminal occurs, the high level of the output voltage Vx is pulled down by the ground terminal to drop, but the high level of the output voltage Vy becomes approximately the power supply voltage Vcc. On this occasion, if the high level of the output voltage Vx is a threshold voltage value Vth2 (i.e., 0.89Vcc volts) or lower, the output logical level of the comparator CMPa becomes the high level so that the output logical level of the OR circuit ORa becomes the high level. If such the situation continues during a predetermined mask period, the latch signal Vz becomes the high level so that the speaker output is unlatched.

As described above, the short circuit detection circuit according to the present invention generates a dummy pulse signal (output voltage Vy) that is synchronized with the pulse signal (output voltage Vx) and performs the short circuit detection of the OUT1P terminal for delivering the pulse signal (output voltage Vx) in accordance with whether or not a predetermined phase difference is generated between the signals.

Such the structure is different from the structure of comparing the output voltage Vx with a predetermined threshold voltage value and enables to realize easily both the short-to-power fault detection and the ground fault detection of the OUT1P terminal without switching control of the threshold voltage value in synchronization with the switching control of the output voltage Vx (switching control between a threshold voltage value for the short-to-power fault detection and a threshold voltage value for the ground fault detection).

Although the embodiment described above exemplifies the structure where the present invention is applied to a stereo class D power amplifier IC, the present invention can also be applied to other power supply devices (switching regulator ICs) or driving devices (motor driver ICs) widely without limiting to the above-mentioned application.

In addition, the structure of the present invention can be modified variously from the embodiment described above within the scope of the present invention without deviating from the spirit thereof.

For instance, the logical levels of the individual signals in the above description are merely examples, so opposite logical levels can be used as long as the same operations can be realized.

The above description (the first embodiment) can be summarized as follows. The short circuit detection circuit according to the present invention is a circuit for detecting a short circuit of an external terminal for outputting a pulse signal, and it generates a dummy pulse signal that is synchronized with the pulse signal and detects a short circuit of the external terminal in accordance with whether or not a predetermined phase difference is generated between the signals (Structure 1-1).

The short circuit detection circuit having the Structure 1-1 described above preferably determines that the external terminal has a short circuit if the phase difference is generated during a predetermined mask period (Structure 1-2).

In addition, the short circuit detection circuit having the Structure 1-1 or the Structure 1-2 preferably stops the output operation of the pulse signal if it is determined that the external terminal has a short circuit (Structure 1-3).

According to this structure, the short circuit detection circuit of the present invention can detect the output short circuit of the push-pull circuit without an increase of cost or a power loss.

As to industrial availability of the present invention, the present invention is a technique that is suitable for a stereo class D power amplifier IC for space-saving and low heat generation application, for instance.

Second Embodiment

Hereinafter, a structure in which the output limiting circuit according to the present invention is applied to the output power limitation unit of the audio equipment having a class D power amplifier will be exemplified and described in detail.

Figure 70:
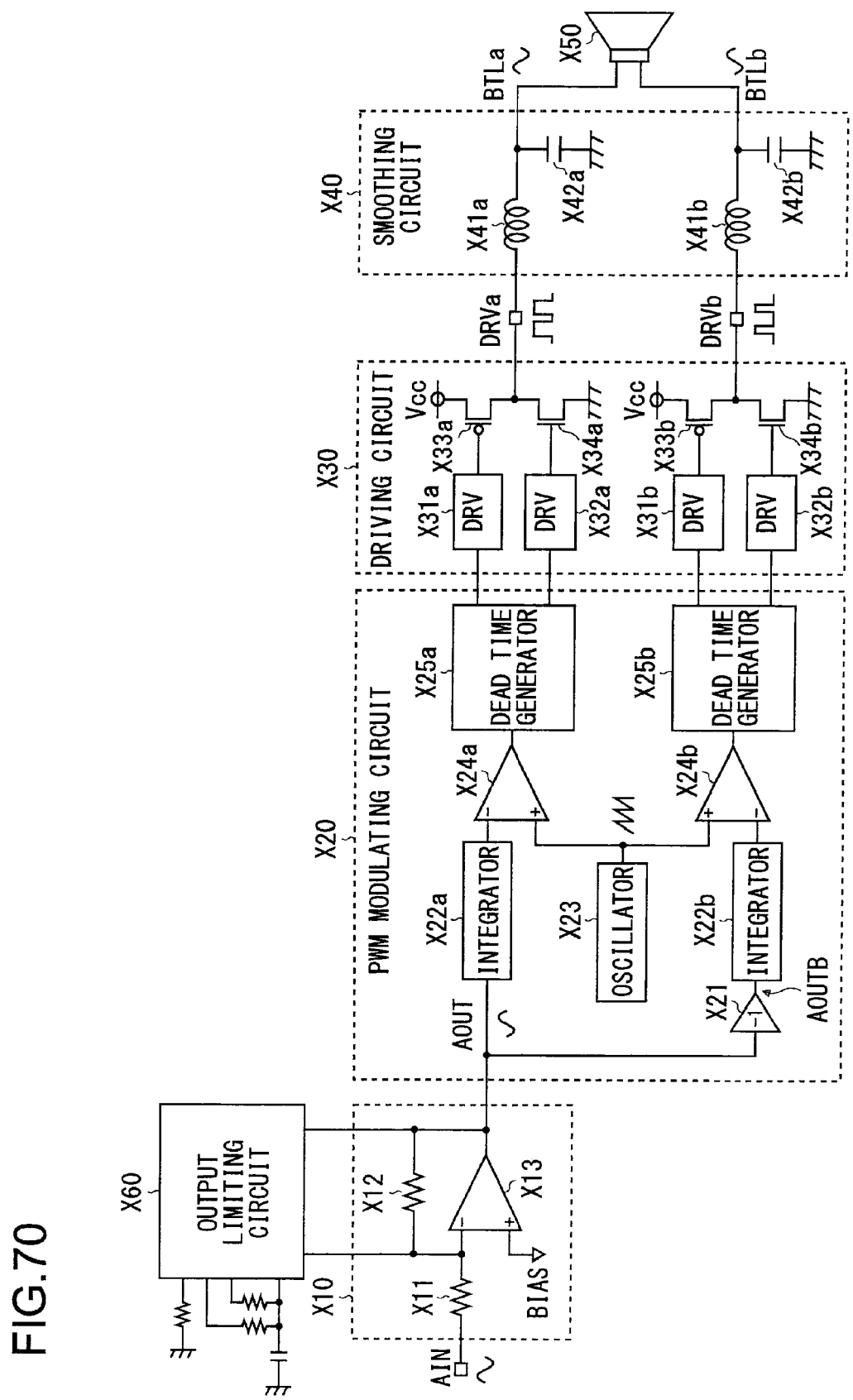
FIG. 70 is a block diagram showing an embodiment of audio equipment according to the present invention.

FIG. 70 is a block diagram showing an embodiment of audio equipment according to the present invention.

As shown in FIG. 70, the audio equipment of this embodiment includes a preamplifier circuit X10, a PWM modulating circuit X20, a driving circuit X30, a smoothing circuit X40, a speaker X50 and an output limiting circuit X60. Note that the class D power amplifier is made up of the circuits except the speaker X50.

The preamplifier circuit X10 is an inverting amplifying circuit for inverting and amplifying an input signal AIN (analog audio signal) so as to generate an output signal AOUT, and it includes a resistors X11 and X12 and an operational amplifier X13. The non-inverting input terminal (+) of the operational amplifier X13 is connected to the application terminal of the bias voltage BIAS. The inverting input terminal (−) of the operational amplifier X13 is connected to the application terminal of the input signal AIN via the resistor X11 and is also connected to the output terminal of itself via the resistor X12.

The PWM modulating circuit X20 is a unit for modulating the output signal AOUT into a PWM signal, and it includes a phase inverter X21, integrators X22a and X22b, an oscillator X23, comparators X24a and X24b and dead time generators X25a and X25b.

The phase inverter X21 is a unit for inverting a phase of the output signal AOUT so as to generate an inverted output signal AOUTB.

The integrator X22a is a unit for integrating a difference between the output signal AOUT and a drive signal DRVa supplied via a first feedback path (not shown in FIG. 70) so as to generate a first integral result signal. In addition, the integrator X22b is a unit for integrating a difference between the inverted output signal AOUTB and a drive signal DRVb supplied via a second feedback path (not shown in FIG. 70) so as to generate a second integral result signal.

The oscillator X23 is a unit for generating a triangular wave signal or a ramp wave signal having a predetermined frequency.

The comparator X24a is a unit for comparing the first integral result signal with the triangular wave signal so as to generate a first comparison signal. The comparator X24b is a unit for comparing the second integral result signal with the triangular wave signal so as to generate a second comparison signal.

The dead time generator X25a is a unit for generating control signals (PWM signals) of an upper side switch X33a and a lower side switch X34a of the driving circuit X30 so as to have dead time during which they are turned off simultaneously when they are driven in a push-pull manner in accordance with the first comparison signal. The dead time generator X25b is a unit for generating control signals (PWM signals) of an upper side switch X33b and a lower side switch X34b of the driving circuit X30 so as to have dead time during which they are turned off simultaneously when they are driven in a push-pull manner in accordance with the second comparison signal. As described above, it is possible to prevent shoot-through current in the driving circuit X30 by using the dead time generators X25a and X25b for providing the dead time.

The driving circuit X30 is a unit for amplifying power of the control signal (PWM signal) so as to generate drive signals DRVa and DRV, and it includes upper side X drivers 31aX31b, lower side X drivers X32a and X32b, upper side switches (P-channel type field effect transistors) X33a and X33b, and lower side switches (N-channel field effect transistors) X34a and X34b. The output power of the class D power amplifier is determined in accordance with a duty ratio (modulation degree) of the drive signals DRVa and DRVb and the power supply voltage Vcc.

The smoothing circuit X40 is a low pass filter for smoothing the drive signals DRVa and DRVb so as to generate smoothed signals BTLa and BTLb, respectively, and it includes coils X41a and X41b, and capacitors X42a and X42b.

The speaker X50 is a unit that is driven by the smoothed signals BTLa and BTLb so as to produce sound.

The output limiting circuit X60 is a unit for limiting an output amplitude of the operational amplifier X13 constituting the preamplifier circuit X10. An inside structure and an operation of the output limiting circuit X60 will be described later in detail.

As understood from the above description, the class D power amplifier is the balanced transformer less (BTL) form in the audio equipment of this embodiment. Thus, it is possible to enhance the power supply efficiency of the audio equipment by the structure using the class D power amplifier of the BTL configuration as a drive unit of the speaker X50.

Next, the inside structure of the output limiting circuit X60 will be described in detail.

Figure 71:
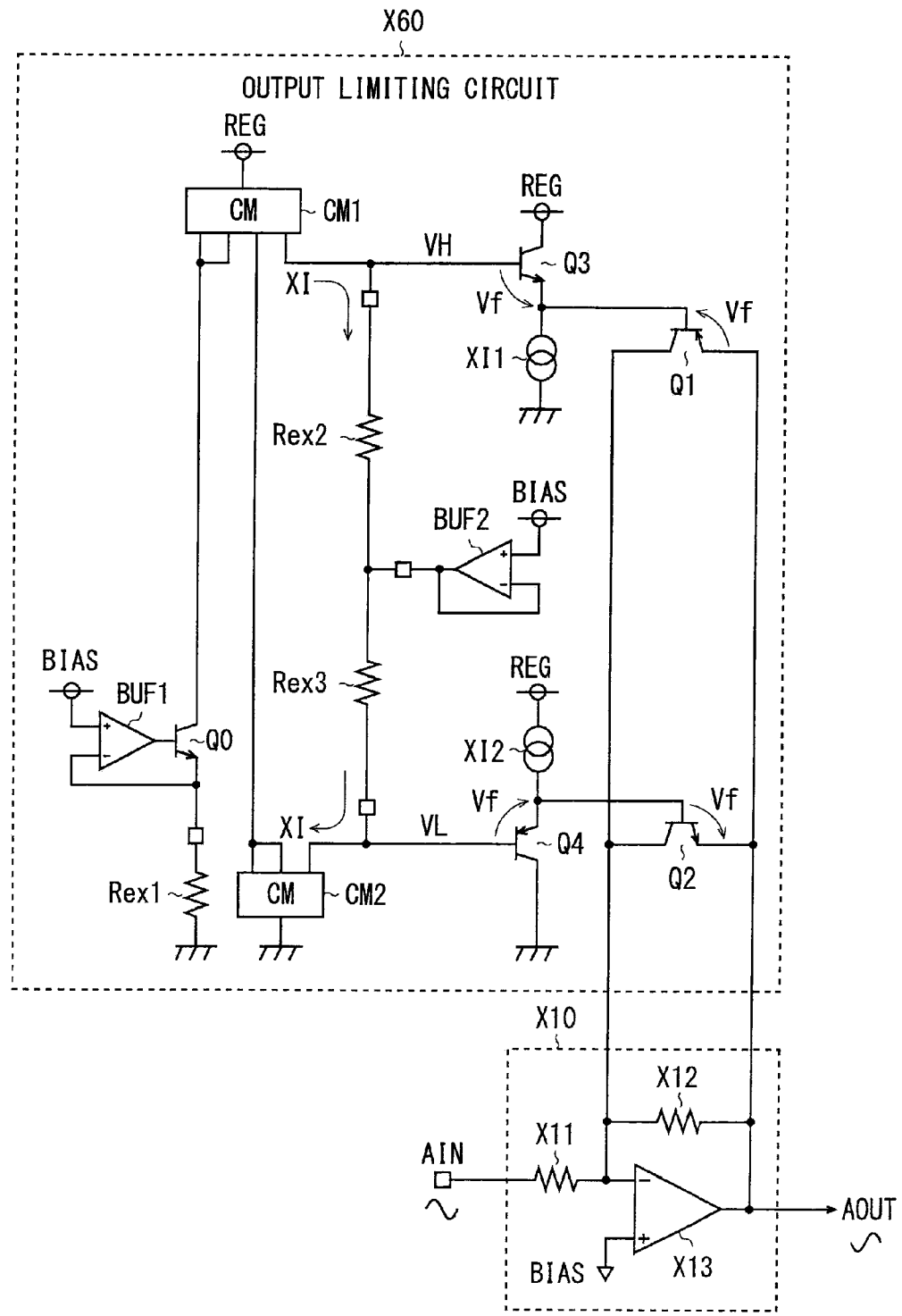
FIG. 71 is a circuit diagram showing a structural example of an output limiting circuit X60.

FIG. 71 is a circuit diagram showing a structural example of the output limiting circuit X60.

As shown in FIG. 71, the output limiting circuit X60 includes buffers BUF1 and BUF2, current mirrors CM1 and CM2, an NPN bipolar transistor Q0, a PNP bipolar transistor Q1, an NPN bipolar transistor Q2, an NPN bipolar transistor Q3, a PNP bipolar transistor Q4, constant current sources XI1 and XI2, and resistors Rex1, Rex2 and Rex3. Note that a resistance value of the resistor Rex1 is set to r1 while a resistance value of each of the resistor Rex2 and the resistor Rex3 is set to r2.

The emitter of the transistor Q0 is connected to the ground terminal via the external terminal and the resistor Rex1. The base of the transistor Q0 is connected to the output terminal of the buffer BUF1. The non-inverting input terminal (+) of the buffer BUF1 is connected to the application terminal of the constant voltage (the bias voltage BIAS in FIG. 71). The inverting input terminal (−) of the buffer BUF1 is connected to the emitter of the transistor Q0. Note that an internal voltage REG may be used as the low voltage to be applied to the non-inverting input terminal (+) of the buffer BUF1.

The input terminal of the current mirror CM1 is connected to the collector of the transistor Q0. The input terminal of the current mirror CM2 is connected to a first output terminal of the current mirror CM1.

The non-inverting input terminal (+) of the buffer BUF2 is connected to the application terminal of the bias voltage BIAS. The inverting input terminal (−) of the buffer BUF2 is connected to the output terminal of itself. The output terminal of the buffer BUF2 is connected to each terminal of the resistor Rex2 and the resistor Rex3 via the external terminal. The other terminal of the resistor Rex2 is connected to the second output terminal of the current mirror CM1 (lead out terminal of the drive current XI) via the external terminal. The other terminal of the resistor Rex3 is connected to the output terminal of the current mirror CM2 (lead in terminal of the drive current XI) via the external terminal.

The collector of the transistor Q3 is connected to the application terminal of the internal voltage REG. The base of the transistor Q3 is connected to the other terminal of the resistor Rex2 (lead out terminal of the upper side clip voltage VH) via the external terminal. The emitter of the transistor Q3 is connected to the ground terminal via the constant current source XI1.

The collector of the transistor Q1 is connected to the inverting input terminal (−) of the operational amplifier X13 constituting the preamplifier circuit X10. The emitter of the transistor Q1 is connected to the output terminal of the operational amplifier X13. The base of the transistor Q1 is connected to a connection node between the emitter of the transistor Q3 and the constant current source XI1.

The collector of the transistor Q4 is connected to the ground terminal. The base of the transistor Q4 is connected to the other terminal of the resistor Rex3 (lead out terminal of a lower side clip voltage VL) via the external terminal. The emitter of the transistor Q4 is connected to the application terminal of the internal voltage REG via a constant current source XI2.

The collector of the transistor Q2 is connected to the inverting input terminal (−) of the operational amplifier X13 constituting the preamplifier circuit X10. The emitter of the transistor Q2 is connected to the output terminal of the operational amplifier X13. The base of the transistor Q2 is connected to a connection node between the emitter of the transistor Q4 and the constant current source XI2.

Next, an operation of the output limiting circuit X60 having the structure described above will be described in detail.

In the output limiting circuit X60, a predetermined constant voltage (the bias voltage BIAS in the example shown in FIG. 71) is converted into current by using the resistor Rex1, and further this current is mirrored by the current mirrors CM1 and CM2 so that reference current XI (=BIAS/r1) is generated.

In addition, the output limiting circuit X60 converts the reference current XI into the upper side clip voltage VH (=BIAS+XI×r2) with respect to the bias voltage BIAS by using the resistor Rex2 and converts the reference current XI into the lower side clip voltage VL (=BIAS−XI×r2) with respect to the bias voltage BIAS by using the resistor Rex3.

The upper side clip voltage VH is applied to the base of the transistor Q3, and a voltage (VH−Vf) that is lower than the upper side clip voltage VH by a forward voltage Vf of the transistor Q3 is applied to the base of the transistor Q1. Therefore, the upper side limit level of the output voltage AOUT is set to a value higher than the base voltage (VH−Vf) of the transistor Q1 by the forward voltage Vf of the transistor Q1, i.e., the same value as the upper side clip voltage VH.

On the other hand, the lower side clip voltage VL is applied to the base of the transistor Q4, and a voltage (VL+Vf) that is higher than the lower side clip voltage VL by the forward voltage Vf of the transistor Q4 is applied to the base of the transistor Q2. Therefore, the lower side limit level of the output voltage AOUT is set to a value that is lower than the base voltage (VL+Vf) of the transistor Q2 by the forward voltage Vf of the transistor Q2, i.e., the same value as the lower side clip voltage VH.

Figure 72:
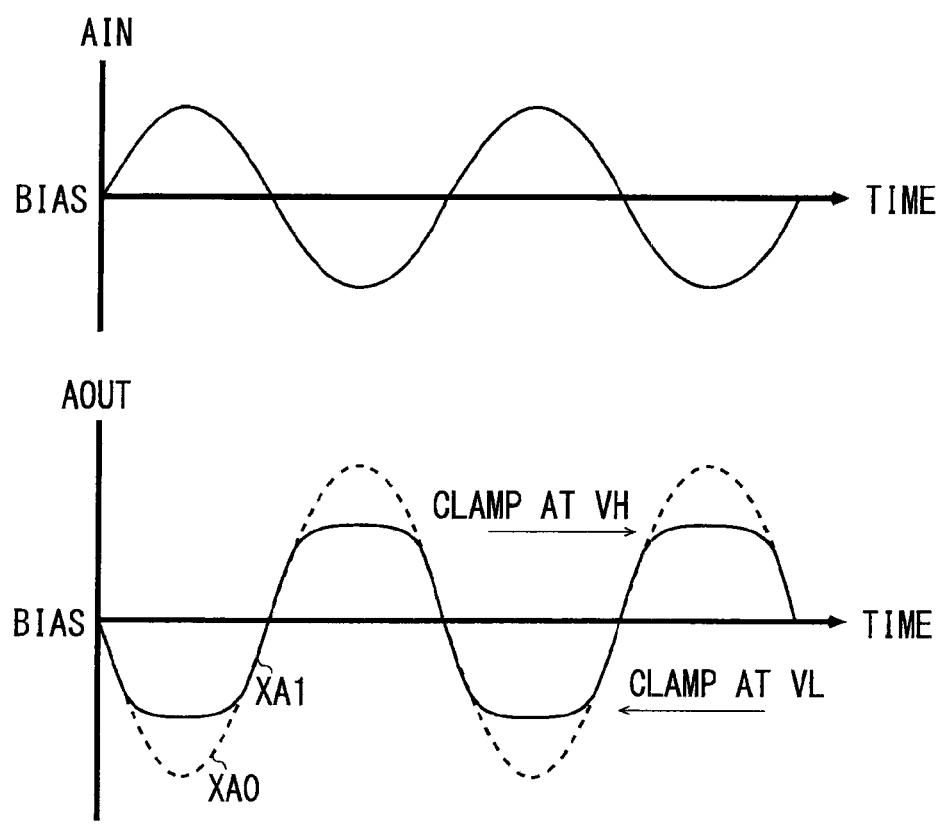
FIG. 72 is a waveform diagram showing an output signal AOUT, which is clipped symmetrically with respect to a bias voltage BIAS.

FIG. 72 is a waveform diagram showing an output signal AOUT, which is clipped symmetrically with respect to a bias voltage BIAS. Note that the solid line XA1 in FIG. 72 indicates the output signal AOUT in the case where the output limiting according to the present invention is performed while the broken line XA0 indicates the output signal AOUT in the case where the output limiting is not performed as a reference.

As the voltage level of the output signal AOUT becomes higher than the bias voltage BIAS so as to be close to the upper side limit level (the same value as the upper side clip voltage VH in this embodiment as described above) that is set in a variable manner by the upper side clip voltage VH, the on resistance of the transistor Q1 decreases gradually. Finally, when the voltage level of the output signal AOUT reaches the upper side limit level, the transistor Q1 is fully turned on.

More specifically, as the output signal AOUT becomes close to the upper side limit level, a feedback resistance value of the operational amplifier X13 (a combined resistance value of a resistance value of the resistor X12 and an on resistance value of the transistor Q1) decreases gradually, and a gain of the preamplifier circuit X10 decreases gradually. As a result, the output signal AOUT is clamped by the upper side limit level, so that upper side soft clip of the output signal AOUT is realized.

On the contrary, as the voltage level of the output signal AOUT becomes lower than the bias voltage BIAS so as to be close to the lower side limit level (the same value as the lower side clip voltage VL in this embodiment as described above) that is set in a variable manner by the lower side clip voltage VL, the on resistance of the transistor Q2 decreases gradually. Finally, when the voltage level of the output signal AOUT reaches the lower side limit level, the transistor Q2 is fully turned on.

More specifically, as the output signal AOUT becomes close to the lower side limit level, a feedback resistance value of the operational amplifier X13 (a combined resistance value of a resistance value of the resistor X12 and an on resistance value of the transistor Q2) decreases gradually, and a gain of the preamplifier circuit X10 decreases gradually. As a result, the output signal AOUT is clamped by the lower side limit level, so that lower side soft clip of the output signal AOUT is realized.

As described above, the output limiting circuit X60 of the audio equipment according to this embodiment includes the reference current generating portion (Rex1, BUF1, Q0, CM1 and CM2) for converting a predetermined constant voltage (the bias voltage BIAS in the example shown in FIG. 71) into the reference current XI by using the resistor Rex1; the upper side clip voltage generating portion (Rex2 and BUF2) for converting the reference current XI into the upper side clip voltage VH (=BIAS+XI×r2) with respect to the bias voltage of the operational amplifier X13 by using the resistor Rex2; the lower side clip voltage generating portion (Rex3 and BUF2) for converting the reference current XI into the lower side clip voltage VL (=BIAS−XI×r2) with respect to the bias voltage of the operational amplifier X13 by using the resistor Rex3; and the gain adjusting portion (Q1 and Q2) for adjusting a gain of the operational amplifier X13 so that the voltage level of the output signal AOUT does not exceed the upper side limit level (VH+Vf) corresponding to the upper side clip voltage VH and the voltage level of the output signal AOUT does not exceed the lower side limit level (VL−Vf) corresponding to the lower side clip voltage VL.

More specifically, the gain adjusting portion of the output limiting circuit X60 includes the PNP bipolar transistor Q1 having the emitter connected to the output terminal of the operational amplifier X13, the collector connected to the input terminal of the operational amplifier X13, and the base connected indirectly to the application terminal of the upper side clip voltage VH, as well as the NPN bipolar transistor Q2 having the emitter connected to the output terminal of the operational amplifier X13, the collector connected to the input terminal of the operational amplifier X13, and the base connected indirectly to the application terminal of the application terminal of the lower side clip voltage VL. The output limiting circuit X60 adopts a diode clipping method (i.e., a clipping method utilizing diode characteristics between the base and the emitter of the transistors Q1 and Q2 so as to limit a duty ratio (the modulation degree) of the PWM signal by limiting an output dynamic range of the operational amplifier X13 constituting the preamplifier circuit X10. Thus, the output power of the class D power amplifier can be limited.

Since such the output power limitation function is provided, amplitude level of the output signal AOUT of the operational amplifier X13 can be suppressed so that the output power of the class D power amplifier is limited, even if an excessive input signal AIN is applied. Thus, an increase of distortion due to an output saturation or breakdown of the speaker X50 can be prevented.

In addition, the output limiting circuit X60 of this embodiment enables to reduce unusual sound produced by the speaker X50 since the output signal AOUT has soft clipped waveform, compared with the conventional structure in which hard clip is performed.

In addition, the output limiting circuit X60 of this embodiment includes the transistor Q3 whose base is connected to the application terminal of the upper side clip voltage VH, the constant current source XI1 that is connected in series to the transistor Q3, the transistor Q4 whose base is connected to the application terminal of the lower side clip voltage VL, and the constant current source XI2 that is connected in series to the transistor Q4. The base of the transistor Q is connected to a connection node between the transistor Q3 and the constant current source XI1 while the base of the transistor Q2 is connected to a connection node between the transistor Q4 and the constant current source XI2.

According to this structure, temperature characteristics of the forward voltage Vf of the transistors Q1 and Q2 can be canceled by the temperature characteristics of the transistors Q3 and Q4. In addition, the values of the upper side clip voltage VH and the lower side clip voltage VL led out from the other terminals of the resistors Rex2 and Rex3 become the upper side limit level and the lower side limit level of the output voltage AOUT of the preamplifier circuit X10 as they are, so very good usability can be obtained.

However, the structure of the present invention is not limited to this, but it is possible to adopt another structure in which the bases of the transistors Q1 and Q2 are directly connected to the application terminals of the upper side clip voltage VH and the lower side clip voltage VL.

In addition, the output limiting circuit X60 of this embodiment enables to realize the symmetric clip with respect to the bias voltage BIAS of the operational amplifier X13 easily only by selecting the resistance values of the resistor Rex2 and the resistor Rex3 to be the same without performing burdensome adjustment of circuit constants.

In addition, the output limiting circuit X60 of this embodiment enables to perform variable control of the upper side clip voltage VH and the lower side clip voltage VL in a very wide range. For instance, if the bias voltage is set to 3.5 volts and the internal voltage REG is set to 7 volts, the upper side clip voltage VH and the lower side clip voltage VL can have a dynamic range of the bias voltage BIAS±3.4 volts considering saturation voltage (0.1 volts) of the transistor constituting the current mirrors CM1 and CM2. Therefore, since the limit level of the output power does not respond too sensitively to the variable control of the upper side clip voltage VH and the lower side clip voltage VL, the desired output power can be set easily with high accuracy.

Note that it is desirable to use external elements as the resistor Rex1, the resistor Rex2 and the resistor Rex3 in the output limiting circuit X60. According to this structure, the limit level of the output power can be adjusted continuously with high accuracy by changing a resistance value of the external element arbitrarily.

For instance, if the upper side clip voltage VH and the lower side clip voltage VL are set appropriately in accordance with wattage of the speaker X50, breakdown of the speaker due to an unexpected excessive input can be avoided. Otherwise, it becomes needless to design the power supply in accordance with the speaker output.

Note that it is desirable to use high precision elements (±1% is recommended) as the resistors Rex1, Rex2 and Rex3 so that the limit level of the output power can be set with high accuracy.

In addition, it is desirable to set a resistance value r1 of the resistor Rex1 to a relatively large value (20 kilohms or larger) so that the reference current XI does not become too large.

In addition, if the output power limitation function is not used, the resistance value r1 of the resistor Rex1 should be set to the same value as a resistance value r2 of the resistors Rex2 and Rex3.

Figure 73:
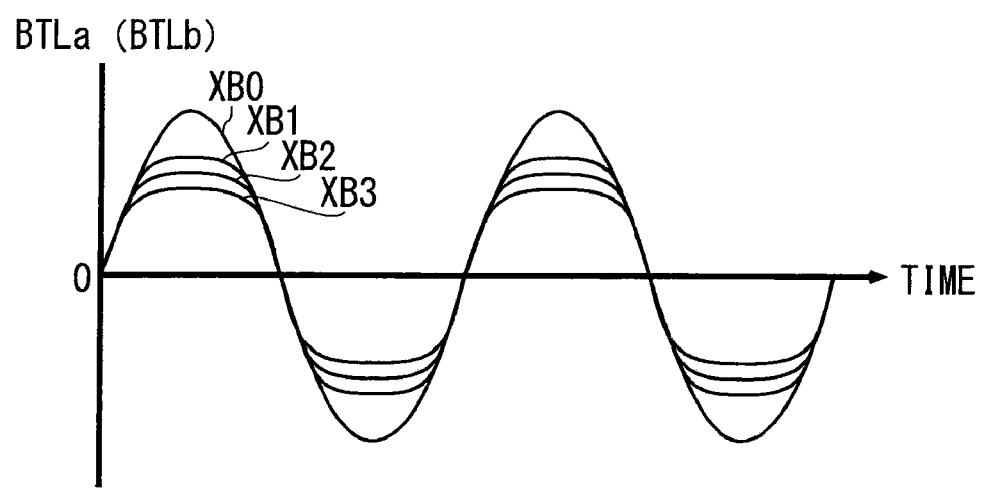
FIG. 73 is a waveform diagram showing a smoothed signal BTLa (or BTLb), which is soft-clipped.

FIG. 73 is a waveform diagram showing a smoothed signal BTLa (or BTLb), which is soft-clipped. Note that the solid line XB0 in FIG. 73 indicates the smoothed signal BTLa (or BTLb) in the case where the output limiting process of the present invention is not performed while the solid lines XB1 to XB3 indicate the smoothed signal BTLa (or BTLb) in the case where the output limiting process of the present invention is performed gradually heavily.

As shown in FIG. 73, it is understood that the amplitude of the smoothed signal BTLa (or BTLb) can be suppressed to be smaller as the resistance value r2 of the resistors Rex2 and Rex3 are set to a smaller value so that the output limiting process of the present invention is performed more heavily.

Figure 74:
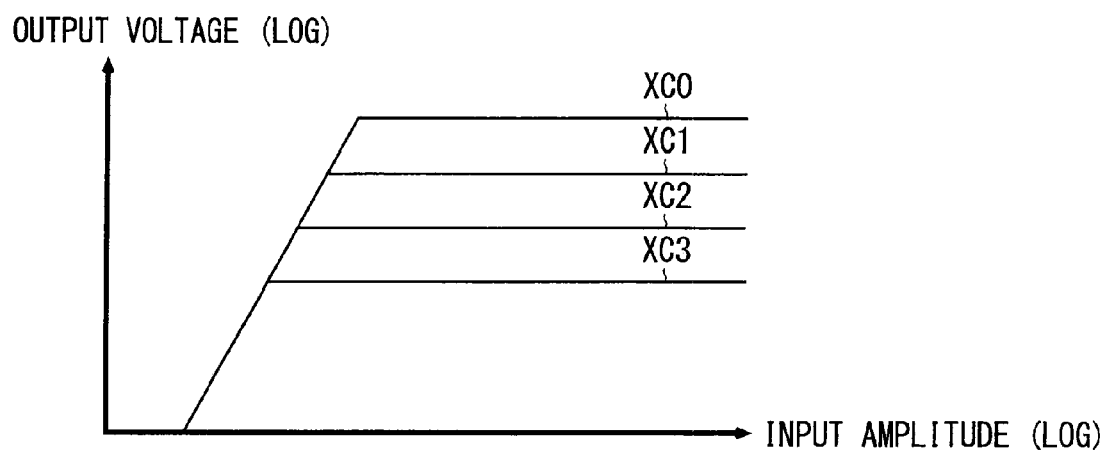
FIG. 74 is a diagram showing a correlation relationship between an input amplitude (log) and an output voltage (log).

FIG. 74 is a diagram showing a correlation relationship between an input amplitude (log) and an output voltage (log). The solid line XC0 in FIG. 74 indicates the correlation relationship in the case where the output limiting process of the present invention is not performed while the solid lines XC1 to XC3 indicate the correlation relationship in the case where the output limiting process of the present invention is performed gradually heavily.

As shown in FIG. 74, it is understood that the output power can be suppressed to be smaller as the resistance value r2 of the resistors Rex2 and Rex3 are set to a smaller value so that the output limiting process of the present invention is performed more heavily even if the input amplitude increases.

Although the embodiment described above exemplifies the structure in which the output limiting circuit according to the present invention is applied to the output power limitation unit of the audio equipment including the class D power amplifier, the present invention can be applied to a general output limiting circuit for limiting the amplitude of output of the operational amplifier for amplifying the input signal to as to generate the output signal widely without limiting to the embodiment described above.

In addition, the structure of the present invention can be modified variously from the embodiment described above within the scope of the present invention without deviating from the spirit thereof.

The above description (the second embodiment) can be summarized as follows. The output limiting circuit according to the present invention is a circuit for limiting amplitude of output of an operational amplifier for amplifying an input signal so as to generate an output signal, and it includes a reference current generating portion for converting a predetermined constant voltage into a reference current by using a first resistor; an upper side clip voltage generating portion for converting the reference current into an upper side clip voltage with respect to a bias voltage of the operational amplifier by using a second resistor; a lower side clip voltage generating portion for converting the reference current into a lower side clip voltage with respect to a bias voltage of the operational amplifier by using a third resistor; a gain adjusting portion for adjusting a gain of the operational amplifier so that a voltage level of the output signal does not exceed an upper side limit level corresponding to the upper side clip voltage and that a voltage level of the output signal does not exceed a lower side limit level of the lower side clip voltage (Structure 2-1).

As to the output limiting circuit having the Structure 2-1 described above, it is preferable that the gain adjusting portion should include a first transistor that is connected between the input and the output of the operational amplifier and has a control terminal connected directly or indirectly to an application terminal of the upper side clip voltage, and a second transistor that is similarly connected between the input and the output of the operational amplifier and has a control terminal connected directly or indirectly to an application terminal of the lower side clip voltage (Structure 2-2).

In addition, it is preferable that the output limiting circuit having the Structure 2-2 described above should include a third transistor having a control terminal connected to the application terminal of the upper side clip voltage, a first constant current source that is connected in series to the third transistor, a fourth transistor having a control terminal connected the application terminal of the lower side clip voltage, and a second constant current source that is connected in series to the fourth transistor, in which the control terminal of the first transistor is connected to a connection node between the third transistor and the first constant current source, and the control terminal of the second transistor is connected to a connection node between the fourth transistor and the second constant current source (Structure 2-3).

In addition, as to the output limiting circuit having any one of the Structures 2-1 to 2-3, it is preferable that each of the first resistor, the second resistor and the third resistor should be an external element (Structure 2-4).

In addition, the class D power amplifier according to the present invention includes a preamplifier circuit for amplifying an input signal so as to generate an output signal, a PWM modulating circuit for modulating the output signal into a PWM signal, a driving circuit for amplify power of the PWM signal so as to generate a drive signal, a smoothing circuit for smoothing the drive signal so as to generate the smoothed signal, and an output limiting circuit having any one of the first to the fourth structures for limiting amplitude of output of an operational amplifier constituting the preamplifier circuit (Structure 2-5).

In addition, the audio equipment according to the present invention includes a class D power amplifier having the Structure 2-5 described above, and a speaker that is driven by the smoothed signal generated by the class D power amplifier (Structure 2-6).

According to the present invention, it is possible to realize symmetric soft clip with respect to the bias voltage of the operational amplifier easily with high accuracy by a resistance ratio.

As to industrial availability of the present invention, the present invention is a technique that is suitable for limiting output power of a power amplifier that is used for TV equipment, a desktop personal computer, an audio visual receiver, car audio equipment or the like.

Third Embodiment

An embodiment of the present invention will be described with reference to the attached drawings. A structural example of a power amplifying circuit according to the present invention is shown in FIG. 75.

Figure 75:
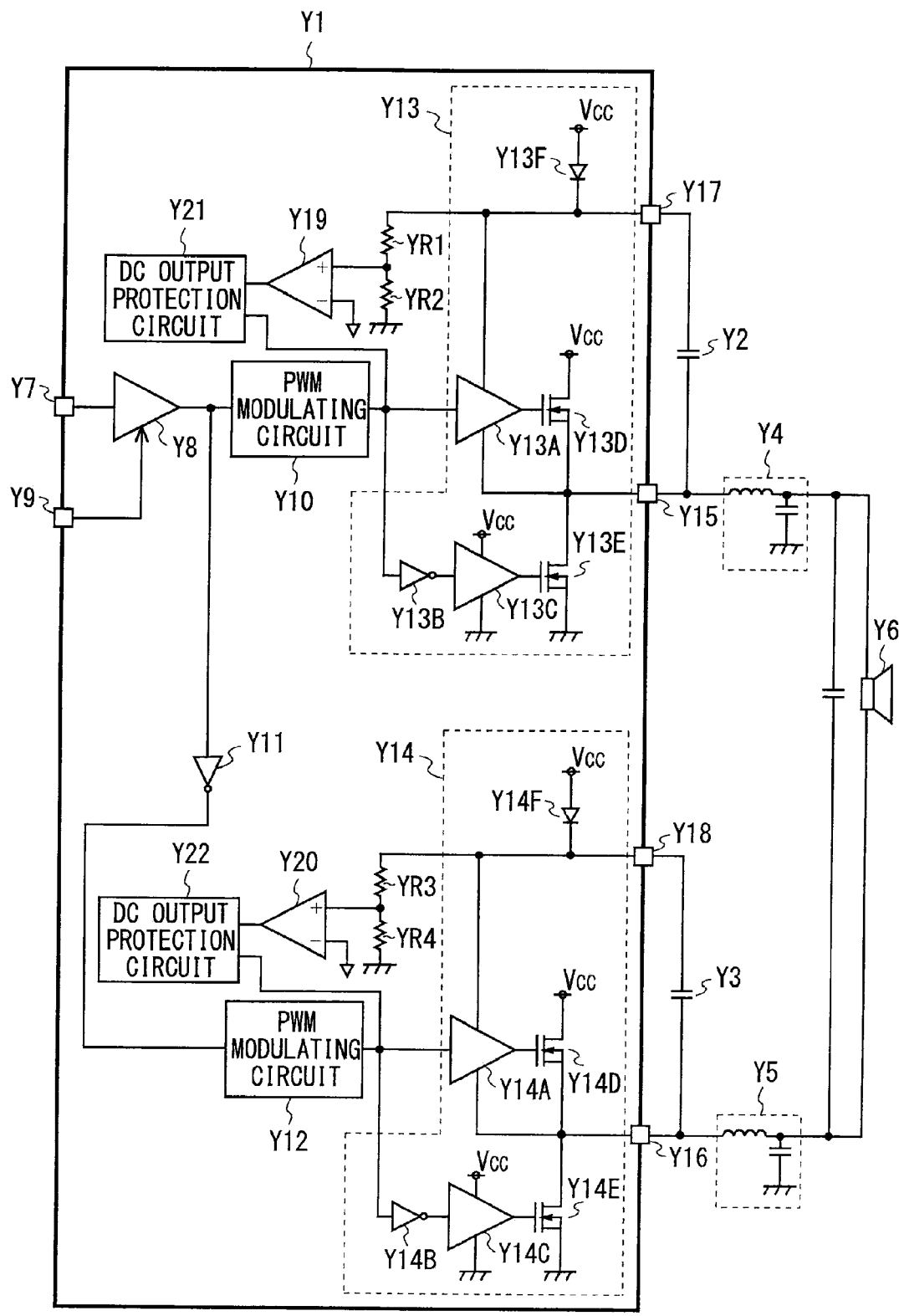
FIG. 75 is a diagram showing a structural example of a power amplifying circuit according to the present invention.

The power amplifying circuit according to the present invention shown in FIG. 75 is a class D amplifier of a BTL output type and includes a digital amplifier IC Y1 and external capacitors Y2 and Y3 connected to the digital amplifier IC Y1.

A PWM output voltage that is output from a positive side output terminal Y15 of the power amplifying circuit according to the present invention shown in FIG. 75 is converted into an analog signal by an LPF circuit Y4 and is supplied to a positive side of the speaker Y6. In addition, a PWM output voltage that is output from a negative side output terminal Y16 of the power amplifying circuit according to the present invention shown in FIG. 75 is converted into an analog signal by an LPF circuit Y5 and is supplied to a negative side of the speaker Y6.

The digital amplifier IC Y1 includes an input terminal Y7 for receiving an analog audio signal, an amplifier Y8 for amplifying an analog audio signal supplied from the input terminal Y7, a bias terminal Y9 for receiving a bias voltage so as to supply the same to the amplifier Y8, a PWM circuit Y10 for performing pulse width modulation on the output signal of the amplifier Y8, an inverting circuit Y11 for inverting the output signal of the amplifier Y8, a PWM circuit Y12 for performing pulse width modulation on the output signal of the inverting circuit Y11, a positive side driver portion Y13 for driving in accordance with the output signal of the PWM circuit Y10, a negative side driver portion Y14 for driving in accordance with the output signal of the PWM circuit Y12, a positive side PWM output terminal Y15, a negative side PWM output terminal Y16, a positive side BSP terminal Y17, a negative side BSP terminal Y18, resistors YR1 to YR4, comparators Y19 and Y20, and DC output protection circuits Y21 and Y22.

The positive side driver portion Y13 includes a driver Y13A for performing pulse drive of a gate voltage of an N-channel MOSFET Y13D in accordance with the output signal of the PWM circuit Y10, an inverting circuit Y13B for inverting the output signal of the PWM circuit Y10, a driver Y13C for performing pulse drive of the gate voltage of the N-channel MOSFET Y13E in accordance with the output signal of the inverting circuit Y13B, an N-channel MOSFET Y13D having a drain to which a constant voltage Vcc is applied and a source connected to the positive side PWM output terminal Y15 and the negative power supply terminals of the driver Y13A, an N-channel MOSFET Y13E having a drain connected to the positive side PWM output terminal Y15 and the negative power supply terminal of the driver Y13A and a source to which the ground voltage is applied, and a diode Y13F having an anode to which Vcc is applied and a cathode connected to the BSP terminal Y17 and a positive power supply terminal of the driver Y13A. The positive side PWM output terminal Y15 is connected to the BSP terminal Y17 via the capacitor Y2, so that a bootstrap voltage higher than the constant voltage Vcc can be supplied the positive power supply terminal of the driver Y13A. Note that the constant voltage Vcc is applied to the positive power supply terminal of the driver Y13C, and the ground voltage is applied to the negative power supply terminal of the driver Y13C.

The negative side driver portion Y14 has the same structure as the positive side driver portion Y13, so detailed description will be omitted.

Next, operations of the positive side driver portion Y13 and the negative side driver portion Y14 in the normal operation will be described. Note that a term "complementary" of the N-channel MOSFETs Y13D and Y13E used in this specification not only means the case where on/off states of the N-channel MOSFET Y13D and Y13E are completely opposite but also includes the case where a predetermined delay time is provided to the on/off transition timing of the MOSFETs Y13D and Y13E so that they are not turned on simultaneously for avoiding the shoot-through current. In addition, the same is true for the N-channel MOSFETs Y14D and Y14E as the N-channel MOSFETs Y13D and Y13E.

First, when the gate voltage of the N-channel MOSFET Y13E is made to be the high level by the driver Y13C so that the N-channel MOSFET Y13E is turned on, the voltage of the positive side PWM output terminal Y15 becomes substantially the ground voltage $V_{GND}$. In addition, when the N-channel MOSFET Y13E is turned on, current flows in the diode Y13F and the capacitor Y2 via the N-channel MOSFET Y13E to the ground. As a result, the capacitor Y2 is charged, and a potential difference that is the constant voltage Vcc minus the forward voltage drop $V_F$ of the diode Y13F is generated across the terminals thereof. Therefore, the voltage of the BSP terminal Y17 (the bootstrap voltage) becomes Vcc−$V_F$. Furthermore, during the on period of the N-channel MOSFET Y13E, the driver Y13A makes the gate voltage of the N-channel MOSFET Y13D be the low level so that the N-channel MOSFET Y13D is in the off state complementarily to the N-channel MOSFET Y13E that is in the ON state.

After that, the driver Y13C changes the gate voltage of the N-channel MOSFET Y13E to be the low level so that the N-channel MOSFET Y13E is turned off, and then after a predetermined period for both to be turned off passes, the driver Y13A changes the gate voltage of the N-channel MOSFET Y13D to be the high level so that the N-channel MOSFET Y13D is turned on. Thus, a voltage of the positive side PWM output terminal Y15 becomes substantially the constant voltage Vcc. On this occasion, the potential difference generated by the previous charging is sustained across the terminals of the capacitor Y2, so the voltage of the BSP terminal Y17 (the bootstrap voltage) becomes a voltage value (2Vcc−$V_F$) that is an voltage increased from the voltage (Vcc) of the positive side PWM output terminal Y15 by the charging voltage of the capacitor Y2 (Vcc−$V_F$).

An operation of the negative side driver portion Y14 in the normal operation is the same as the operation of the positive side driver portion Y13 in the normal operation, so a detailed description thereof will be omitted.

Figure 76:
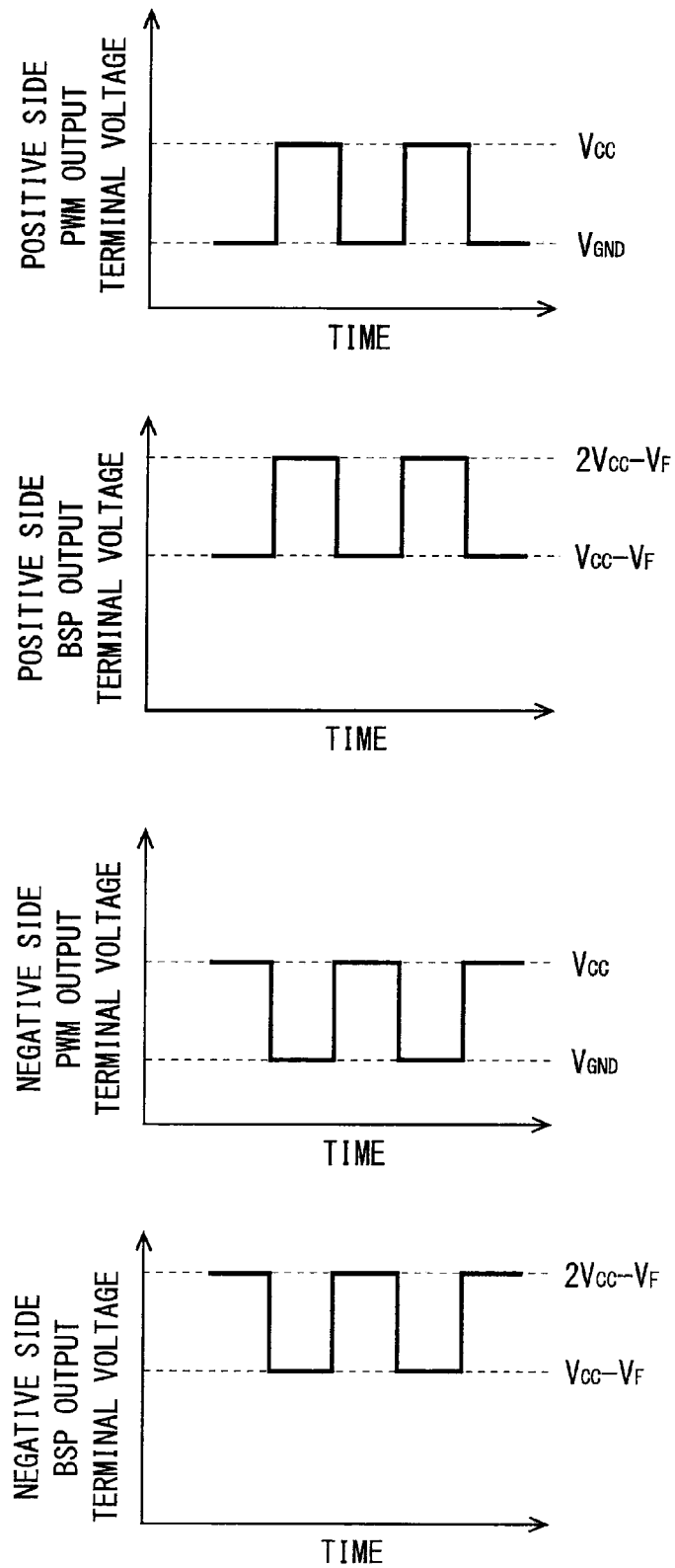
FIG. 76 is a diagram showing voltage waveforms of individual portions in a normal state.

Since the positive side driver portion Y13 and the negative side driver portion Y14 in the normal operation perform the operations described above, voltage waveforms of the positive side PWM output terminal Y15, the negative side PWM output terminal Y16, the positive side BSP terminal Y17 and the negative side BSP terminal Y18 are as shown in FIG. 76.

Next, operations of the positive side driver portion Y13 and the negative side driver portion Y14 when a short-to-power fault of the input terminal Y7 occurs will be described. When a short-to-power fault of the input terminal Y7 occurs, the PWM circuit Y10 outputs the PWM signal having the ON duty ratio of substantially 100% (including 100% itself), and the PWM circuit Y12 outputs the PWM signal having the ON duty ratio of substantially 0% (including 0% itself).

When the PWM circuit Y10 outputs the PWM signal having the ON duty ratio of substantially 100%, the N-channel MOSFET Y13D is always or almost always in the ON state, and the N-channel MOSFET Y13E is always or almost always in the off state. Therefore, the voltage of the positive side PWM output terminal Y15 is always or almost always the constant voltage Vcc substantially. Then, the voltage of the BSP terminal Y17 (the bootstrap voltage), which was the increased voltage value (2Vcc−$V_F$) from the voltage (Vcc) of the positive side PWM output terminal Y15 by the charging voltage of the capacitor Y2 (Vcc−$V_F$), drops by the resistors YR1 and YR2 as discharging resistors in accordance with the time constant τ=c×r (here, c denotes a capacitance of the capacitor Y2, and r denotes a combined resistance value of resistors YR1 and YR2).

A divided voltage of the voltage at the BSP terminal Y17 is applied to the non-inverting input terminal of the comparator Y19, and a predetermined voltage is applied to the inverting input terminal of the comparator Y19. The comparator Y19 outputs a signal of the low level if the voltage at the BSP terminal Y17 is the threshold value $V_{TH}$ or lower. The DC output protection circuit Y21 decides to be a DC output state if the output signal of the PWM circuit is the high level and the voltage of the BSP terminal Y17 is the threshold value $V_{TH}$ or lower, so that the protection function (e.g., stopping process of the amplifier Y8) is activated.

On the other hand, if the PWM circuit Y12 outputs the PWM signal having the ON duty ratio of substantially 0%, the N-channel MOSFET Y14D is always or almost always in the OFF state while the N-channel MOSFET Y14E is always or almost always in the ON state. Therefore, the voltage of the negative side PWM output terminal Y16 becomes always or almost always the ground voltage $V_{GND}$ substantially.

Figure 77:
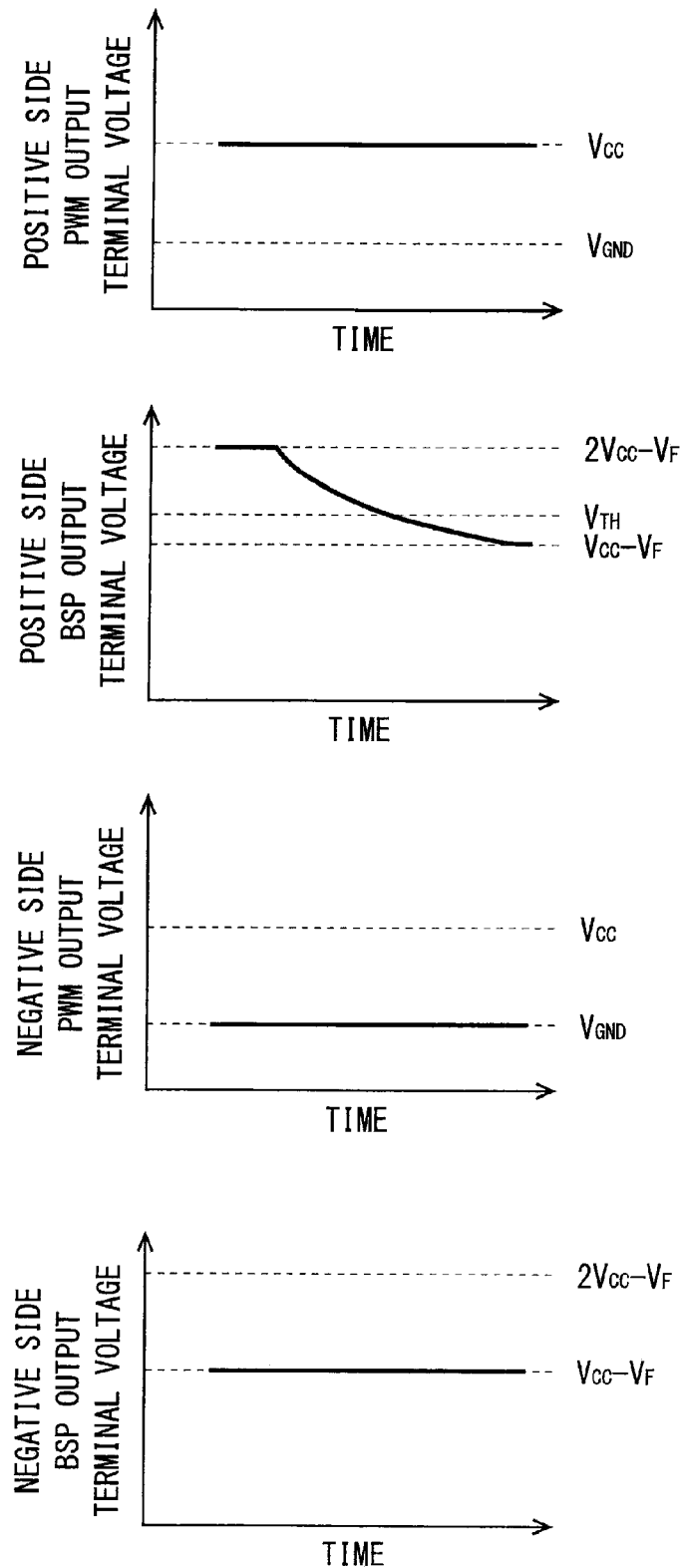
FIG. 77 is a diagram showing voltage waveforms of individual portions when a short-to-power fault of an input terminal occurs.
Figure 78:
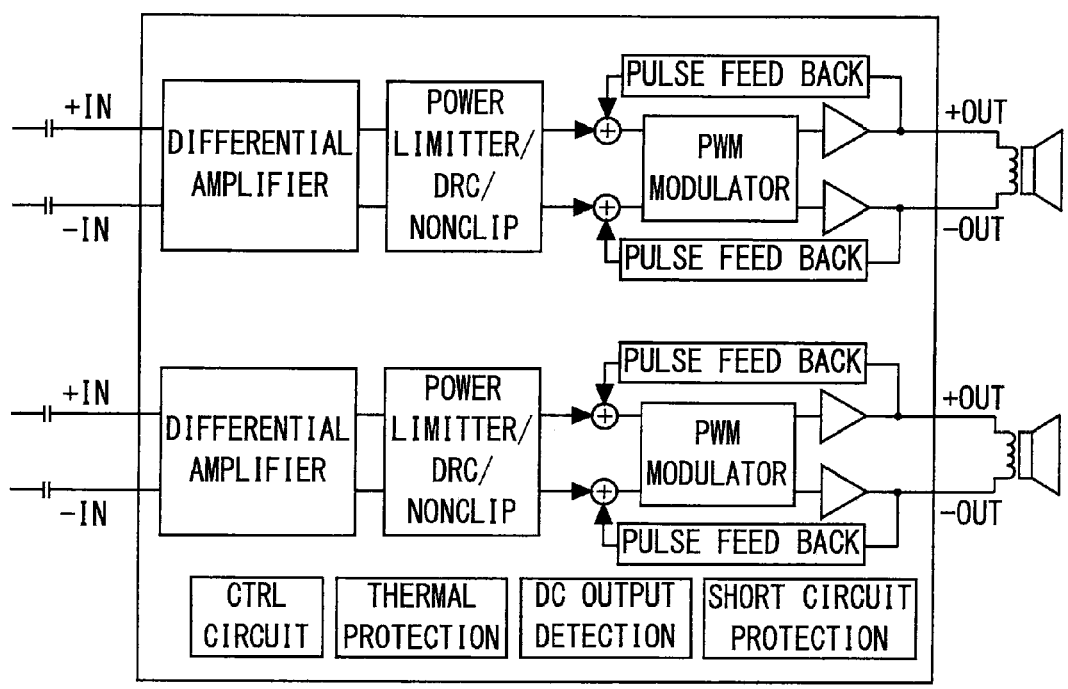
FIG. 78 is a block diagram of a class D amplifier disclosed in the Non-patent Document 1.

Since the positive side driver portion Y13 and the negative side driver portion Y14 performed the operation as described above when the short-to-power fault of the input terminal Y7 occurs, voltage waveforms of the positive side PWM output terminal Y15, the negative side PWM output terminal Y16, the positive side BSP terminal Y17 and the negative side BSP terminal Y18 become as shown in FIG. 77.

Furthermore, if the ground fault of the input terminal Y7 occurs, the PWM circuit Y10 outputs the PWM signal having the ON duty ratio of substantially 0% while the PWM circuit Y12 outputs the PWM signal having the ON duty ratio of substantially 100%. Therefore, the DC output protection circuit Y22 detects to be the DC output state so as to activate the protection function.

The power amplifying circuit according to the present invention shown in FIG. 75 has a DC output detection portion (the resistors YR1 to YR4, the comparators Y19 and Y20, and the DC output protection circuits Y21 and Y22) after the driver stage, so it can detect not only the DC output generated by the short-to-power fault or the ground fault of the input terminal Y7 but also the DC output generated by the short-to-power fault or the ground fault of the bias terminal Y9 or any abnormal state of the amplifier Y8, the PWM circuit Y10, the PWM circuit Y12, the positive side driver portion Y13 or the negative side driver portion Y14.

In addition, the power amplifying circuit according to the present invention shown in FIG. 75 can change the detection time of the DC output by changing capacitance values of the capacitors Y2 and Y3 that are external capacitors. Therefore, the detection time of the DC output can be changed easily.

In addition, although the class D amplifier of the BTL output type is described in the embodiment described above, the power amplifying circuit according to the present invention is not limited to the class D amplifier of the BTL output type. For instance, it is possible to eliminate the inverting circuit Y11, the PWM circuit Y12, the negative side driver portion Y14, the negative side PWM output terminal Y16, the BSP terminal Y18, the resistors YR3 and YR4, the comparator Y20 and the DC output protection circuit Y22 from the power amplifying circuit according to the present invention shown in FIG. 75 and to connect the negative side of the speaker Y6 to the ground without using the LPF circuit Y5.

In addition, although the class D amplifier made up of the digital amplifier IC Y1 and the external capacitors Y2 and Y3 connected to the digital amplifier IC Y1 is described in the embodiment described above, the power amplifying circuit according to the present invention is not limited to this structure. The power amplifying circuit may be made up of ICs totally without using any external component.

The above description (the third embodiment) can be summarized as follows. The power amplifying circuit according to the present invention includes a modulation circuit for converting a signal corresponding to an input signal into a pulse signal, a driver portion for performing switching power amplification in accordance with the output signal of the modulation circuit, a synchronous voltage generating portion for generating a voltage synchronizing with the output voltage of the driver portion, a voltage drop portion for dropping the voltage synchronizing with the output voltage of the driver portion in accordance with a predetermined time constant when the output voltage of the driver portion becomes a predetermined duty ratio or larger, and a DC output detection portion for deciding to be the DC output if the voltage dropped by the voltage drop portion is a predetermined value or lower when the output signal of the modulation circuit is the high level (Structure 3-1).

According to this structure, the synchronous voltage generating portion, the voltage drop portion and the DC output detection portion are provided to the stage after the driver portion, so the DC output due to an abnormal state that occurs in the driver stage can also be detected.

In addition, the power amplifying circuit having the Structure 3-1 described above may be made up of a semiconductor integrated circuit device and external circuit elements connected to the semiconductor integrated circuit device, and the external circuit elements connected to the semiconductor integrated circuit device include at least a circuit element that affects the predetermined time constant (Structure 3-2).

According to this structure, since the external circuit elements connected to the semiconductor integrated circuit device include the circuit element that affects the predetermined time constant for determining the drop characteristics of the voltage synchronizing with the output voltage of the driver portion, the detection time of the DC output can be changed easily.

In addition, as to the power amplifying circuit having the Structure 3-1 or 3-2 described above, the modulation circuit may be a pulse width modulation (PWM) circuit (Structure 3-3). Furthermore, the power amplifying circuit having the Structure 3-3 described above may include two circuit portions each of which is made up of the modulation circuit, the driver portion, the synchronous voltage generating portion, the voltage drop portion and the DC output detection portion, and a signal to be supplied to one of the modulation circuits is complementary with a signal to be supplied to the other modulation circuit (Structure 3-4). Thus, the power amplifying circuit of the BTL output type can be realized.

In addition, as to the power amplifying circuit having any one of the Structures 3-2 to 3-4 described above, in which the power amplifying circuit is made up of the semiconductor integrated circuit device the external circuit elements connected to the semiconductor integrated circuit device, and the external circuit elements connected to the semiconductor integrated circuit device include at least a circuit element that affects the predetermined time constant, the driver portion may include a first MOSFET and a second MOSFET connected in series and disposed between a first potential and a second potential that is lower than the first potential, the synchronous voltage generating portion generates a bootstrap voltage that is higher than the output voltage of the driver portion, and the circuit element that is the external circuit element that is connected to the semiconductor integrated circuit device and affects the predetermined time constant is a bootstrap capacitor (Structure 3-5).

According to this structure, the voltage drop portion can be constituted by utilizing the bootstrap capacitor that is necessary when the driver portion has the structure including the first MOSFET and the second MOSFET connected in series and disposed between the first potential and the second potential that is lower than the first potential. Therefore, an increase in the number of components can be suppressed.

As described above, according to the power amplifying circuit of the present invention, the synchronous voltage generating portion, the voltage drop portion and the DC output detection portion are provided to the stage after the driver portion. Therefore, it is possible to detect also the DC output due to an abnormal state generated in the driver stage.

Although the best embodiment of the present invention is described above, it is obvious for a skilled person in the art that the disclosed invention can be modified by various methods and that there can be various embodiments different from the concrete structure described above. Therefore, the following claims are intended to include any variations of the present invention in the technical scope thereof without deviating from the spirit or the technical view of the present invention.

What is claimed is:

1. An output limiting circuit for limiting amplitude of output of an operational amplifier for amplifying an input signal so as to generate an output signal, the output limiting circuit comprising:
    a reference current generating portion for converting a predetermined constant voltage into a reference current by using a first resistor;
    an upper side clip voltage generating portion for converting the reference current into an upper side clip voltage with respect to a bias voltage of the operational amplifier by using a second resistor;
    a lower side clip voltage generating portion for converting the reference current into a lower side clip voltage with respect to the bias voltage of the operational amplifier by using a third resistor; and
    a gain adjusting portion for adjusting a gain of the operational amplifier so that a voltage level of the output signal does not exceed an upper side limit level corresponding to the upper side clip voltage and that the voltage level of the output signal does not exceed a lower side limit level corresponding to the lower side clip voltage.

2. The output limiting circuit according to claim 1, wherein the gain adjusting portion includes
    a first transistor connected between input and output terminals of the operational amplifier, a control terminal thereof being connected directly or indirectly to an application terminal of the upper side clip voltage, and
    a second transistor connected between input and output terminals of the operational amplifier, a control terminal thereof being connected directly or indirectly to an application terminal of the lower side clip voltage.

3. The output limiting circuit according to claim 2, further comprising:
    a third transistor having a control terminal connected to the application terminal of the upper side clip voltage;
    a first constant current source connected in series to the third transistor;
    a fourth transistor having a control terminal connected to the application terminal of the lower side clip voltage; and
    a second constant current source connected in series to the fourth transistor, wherein
    the control terminal of the first transistor is connected to a connection node between the third transistor and the first constant current source, and the control terminal of the second transistor is connected to a connection node between the fourth transistor and the second constant current source.

4. The output limiting circuit according to claim 1, wherein each of the first resistor, the second resistor and the third resistor is an external element.

5. A class D power amplifier comprising:
a preamplifier circuit for amplifying an input signal so as to generate an output signal;
a PWM modulating circuit for modulating the output signal into a PWM signal;
a driving circuit for amplifying power of the PWM signal so as to generate a drive signal;
a smoothing circuit for smoothing the drive signal so as to generate a smoothed signal; and
an output limiting circuit for limiting amplitude of output of an operational amplifier constituting the preamplifier circuit, wherein the output limiting circuit includes
a reference current generating portion for converting a predetermined constant voltage into a reference current by using a first resistor,
an upper side clip voltage generating portion for converting the reference current into an upper side clip voltage with respect to a bias voltage of the operational amplifier by using a second resistor,
a lower side clip voltage generating portion for converting the reference current into a lower side clip voltage with respect to the bias voltage of the operational amplifier by using a third resistor, and
a gain adjusting portion for adjusting a gain of the operational amplifier so that a voltage level of the output signal does not exceed an upper side limit level corresponding to the upper side clip voltage and that the voltage level of the output signal does not exceed a lower side limit level corresponding to the lower side clip voltage.

6. The class D power amplifier according to claim 5, wherein the gain adjusting portion includes
a first transistor connected between input and output terminals of the operational amplifier, a control terminal thereof being connected directly or indirectly to an application terminal of the upper side clip voltage, and
a second transistor connected between input and output terminals of the operational amplifier, a control terminal thereof being connected directly or indirectly to an application terminal of the lower side clip voltage.

7. The class D power amplifier according to claim 6, wherein the output limiting circuit further includes
a third transistor having a control terminal connected to the application terminal of the upper side clip voltage,
a first constant current source connected in series to the third transistor,
a fourth transistor having a control terminal connected to the application terminal of the lower side clip voltage,
a second constant current source connected in series to the fourth transistor,
the control terminal of the first transistor being connected to a connection node between the third transistor and the first constant current source, and
the control terminal of the second transistor being connected to a connection node between the fourth transistor and the second constant current source.

8. The class D power amplifier according to claim 5, wherein each of the first resistor, the second resistor and the third resistor is an external element.

9. Audio equipment comprising:
a class D power amplifier; and
a speaker that is driven by a smoothed signal generated by the class D power amplifier, wherein the class D power amplifier includes
a preamplifier circuit for amplifying an input signal so as to generate an output signal,
a PWM modulating circuit for modulating the output signal into a PWM signal,
a driving circuit for amplifying power of the PWM signal so as to generate a drive signal,
a smoothing circuit for smoothing the drive signal so as to generate a smoothed signal, and
an output limiting circuit for limiting amplitude of output of an operational amplifier constituting the preamplifier circuit, the output limiting circuit including
a reference current generating portion for converting a predetermined constant voltage into a reference current by using a first resistor,
an upper side clip voltage generating portion for converting the reference current into an upper side clip voltage with respect to a bias voltage of the operational amplifier by using a second resistor,
a lower side clip voltage generating portion for converting the reference current into a lower side clip voltage with respect to the bias voltage of the operational amplifier by using a third resistor, and
a gain adjusting portion for adjusting a gain of the operational amplifier so that a voltage level of the output signal does not exceed an upper side limit level corresponding to the upper side clip voltage and that the voltage level of the output signal does not exceed a lower side limit level corresponding to the lower side clip voltage.

10. The audio equipment according to claim 9, wherein the gain adjusting portion includes
a first transistor connected between input and output terminals of the operational amplifier, a control terminal thereof being connected directly or indirectly to an application terminal of the upper side clip voltage, and
a second transistor connected between input and output terminals of the operational amplifier, a control terminal thereof being connected directly or indirectly to an application terminal of the lower side clip voltage.

11. The audio equipment according to claim 10, wherein the output limiting circuit further includes
a third transistor having a control terminal connected to the application terminal of the upper side clip voltage,
a first constant current source connected in series to the third transistor,
a fourth transistor having a control terminal connected to the application terminal of the lower side clip voltage,
a second constant current source connected in series to the fourth transistor,
the control terminal of the first transistor being connected to a connection node between the third transistor and the first constant current source, and
the control terminal of the second transistor being connected to a connection node between the fourth transistor and the second constant current source.

12. The audio equipment according to claim 9, wherein each of the first resistor, the second resistor and the third resistor is an external element.

* * * * *